(12) United States Patent
Takahashi et al.

(10) Patent No.: US 10,620,535 B2
(45) Date of Patent: Apr. 14, 2020

(54) COLORING PHOTOSENSITIVE COMPOSITION, CURED FILM, PATTERN FORMING METHOD, INFRARED CUT FILTER WITH LIGHT-SHIELDING FILM, SOLID-STATE IMAGING DEVICE, IMAGE DISPLAY DEVICE, AND INFRARED SENSOR

(71) Applicant: FUJIFILM Corporation, Tokyo (JP)

(72) Inventors: Kazutaka Takahashi, Shizuoka (JP); Daisuke Hamada, Shizuoka (JP); Shunsuke Kitajima, Shizuoka (JP); Hirokazu Kyota, Shizuoka (JP); Kaoru Aoyagi, Shizuoka (JP); Mitsuji Yoshibayashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 38 days.

(21) Appl. No.: 15/697,687

(22) Filed: Sep. 7, 2017

(65) Prior Publication Data

US 2017/0363959 A1    Dec. 21, 2017

Related U.S. Application Data

(63) Continuation of application No. PCT/JP2016/055661, filed on Feb. 25, 2016.

(30) Foreign Application Priority Data

Mar. 30, 2015  (JP) ................. 2015-068669
Aug. 26, 2015  (JP) ................. 2015-166763

(51) Int. Cl.
| | | |
|---|---|---|
| G02B 5/20 | (2006.01) | |
| G03F 7/031 | (2006.01) | |
| H01L 31/0232 | (2014.01) | |
| G03F 7/029 | (2006.01) | |
| G03F 7/105 | (2006.01) | |
| G02F 1/1335 | (2006.01) | |
| G02B 5/22 | (2006.01) | |
| H01L 27/146 | (2006.01) | |
| G03F 7/038 | (2006.01) | |

(52) U.S. Cl.
CPC .......... *G03F 7/031* (2013.01); *G02B 5/20* (2013.01); *G02B 5/201* (2013.01); *G02B 5/208* (2013.01); *G02B 5/223* (2013.01); *G02F 1/1335* (2013.01); *G02F 1/133516* (2013.01); *G03F 7/029* (2013.01); *G03F 7/038* (2013.01); *G03F 7/105* (2013.01); *H01L 27/146* (2013.01); *H01L 31/0232* (2013.01); *H01L 27/14621* (2013.01); *H01L 27/14623* (2013.01)

(58) Field of Classification Search
CPC ........ G03F 7/0007; G03F 7/031; G03F 7/027; G03F 7/038; G03F 7/032; G03F 7/033; G03F 7/105; G02B 5/223; G02B 5/201; G02B 5/208; G02F 1/133512; G02F 1/133514; G02F 1/133516; H01L 31/0232
USPC .......... 430/7, 281.1; 349/106, 110; 257/440
See application file for complete search history.

(56) References Cited

U.S. PATENT DOCUMENTS

| | | |
|---|---|---|
| 2013/0188270 A1 | 7/2013 | Nishimae et al. |
| 2014/0175347 A1 | 6/2014 | Liao et al. |
| 2014/0334027 A1 | 11/2014 | Nishimae et al. |
| 2015/0064624 A1 | 3/2015 | Nishimae et al. |
| 2015/0293282 A1 | 10/2015 | Takashita |
| 2017/0235224 A1* | 8/2017 | Liao ................. G03F 7/027 430/285.1 |

FOREIGN PATENT DOCUMENTS

| | | |
|---|---|---|
| JP | 2002323845 A | 11/2002 |
| JP | 2010-262028 A | 11/2010 |
| JP | 2011-022384 A | 2/2011 |
| JP | 2011-075981 A | 4/2011 |
| JP | 2012-150468 A | 8/2012 |
| JP | 2013-068688 A | 4/2013 |
| JP | 2013-164471 A | 8/2013 |
| JP | 2014-500852 A | 1/2014 |
| JP | 2014-130173 A | 7/2014 |
| JP | 2015-048577 A | 3/2015 |
| JP | 2015-509074 A | 3/2015 |
| WO | 2012045736 A1 | 4/2012 |
| WO | 2013167515 A1 | 11/2013 |

OTHER PUBLICATIONS

Communication dated Mar. 26, 2018 from the European Patent Office in counterpart European application No. 16771998.8.
International Search Report for PCT/JP2016/055661 dated May 24, 2016.
Written Opinion dated May 24, 2016 in international application No. PCT/2016/055661.
International Preliminary Report on Patentability dated Oct. 3, 2017 in counterpart international application No. PCT/JP2016/055661.
Communication dated Dec. 11, 2018 from the Japanese Patent Office in counterpart Application No. 2017-509391.
Communication dated Jun. 5, 2018 from the Japanese Patent Office in counterpart Application No. 2017-509391.
Notification of Reason for Refusal, dated Oct. 2, 2018, in corresponding Korean Application No. 10-2017-7026652, 17 pages in English and Korean.
Notice of Reasons for Refusal dated Jun. 18, 2019 from the Japanese Patent Office in application No. 2018-136430.

(Continued)

*Primary Examiner* — John A McPherson
(74) *Attorney, Agent, or Firm* — Sughrue Mion, PLLC

(57) ABSTRACT

A coloring photosensitive composition includes an oxime ester-based photopolymerization initiator containing a fluorine atom, a polymerizable compound having an ethylenically unsaturated double bond, an alkali-soluble resin, and a colorant, in which in a case where a film having a film thickness after drying of 2.0 µm is formed using the coloring photosensitive composition, the optical density of the film at a wavelength of 365 nm is 1.5 or more.

5 Claims, 1 Drawing Sheet

(56) References Cited

OTHER PUBLICATIONS

Communication dated Sep. 19, 2019, from the Korean intellectual Property Office in application No. KR10-2019-7020400.
Office Action dated Feb. 4, 2020 from the Japanese Patent Office in corresponding Japanese application No. 2018-136430.

* cited by examiner

COLORING PHOTOSENSITIVE COMPOSITION, CURED FILM, PATTERN FORMING METHOD, INFRARED CUT FILTER WITH LIGHT-SHIELDING FILM, SOLID-STATE IMAGING DEVICE, IMAGE DISPLAY DEVICE, AND INFRARED SENSOR

CROSS-REFERENCE TO RELATED APPLICATIONS

This application is a Continuation of PCT International Application No. PCT/JP2016/055661 filed on Feb. 25, 2016, which claims priority under 35 U.S.C § 119(a) to Japanese Patent Application No. 2015-068669 filed on Mar. 30, 2015, and to Japanese Patent Application No. 2015-166763 filed on Aug. 26, 2015. Each of the above application(s) is hereby expressly incorporated by reference, in its entirety, into the present application.

BACKGROUND OF THE INVENTION

1. Field of the Invention

The present invention relates to a coloring photosensitive composition, a cured film, a pattern forming method, an infrared cut filter with a light-shielding film, a solid-state imaging device, an image display device, and an infrared sensor.

2. Description of the Related Art

A color filter is a component part which is essential for a solid-state imaging device or an image display device.

The solid-state imaging device or the image display device may generate noise by reflection of visible light in some cases. Accordingly, it has been facilitated to inhibit the generation of noise by providing a light-shielding film for the solid-state imaging device or the image display device.

As a method for manufacturing such a color filter or a light-shielding film, a method including forming a coloring composition layer using a coloring photosensitive composition including a colorant, a polymerizable compound, a photopolymerization initiator, and an alkali-soluble resin, and exposing and developing the coloring composition layer to form a pattern is known.

As the photopolymerization initiator, an oxime ester-based photopolymerization initiator containing a fluorine atom is known (see JP2014-500852A, JP2010-262028A, and JP2013-164471 A).

SUMMARY OF THE INVENTION

According to the studies of the present inventors, it could be seen that exposure and development are carried out using a coloring photosensitive composition for forming a cured film having a low transmittance to light at a wavelength of 365 nm to form a pattern, and thus, the obtained pattern has insufficient adhesiveness to a support or the like.

In addition, JP2014-500852A, JP2010-262028A, and JP2013-164471A disclose an oxime ester-based photopolymerization initiator containing a fluorine atom, but in JP2014-500852A, JP2010-262028A, and JP2013-164471A, there is neither disclosure nor suggestion of formation of a film having a low transmittance to light at a wavelength of 365 nm with good adhesiveness, using a coloring photosensitive composition including the oxime ester-based photopolymerization initiator containing a fluorine atom.

Therefore, it is an object of the present invention to provide a coloring photosensitive composition capable of forming a film with a low transmittance to light at a wavelength of 365 nm with good adhesiveness. It is another object to provide a cured film using the coloring photosensitive composition, a pattern forming method, an infrared cut filter with a light-shielding film, a solid-state imaging device, an image display device, and an infrared sensor.

The present inventors have conducted extensive studies, and thus, have found that the objects can be achieved by incorporating an oxime ester-based photopolymerization initiator containing a fluorine atom into a coloring photosensitive composition in which in a case where a film having a film thickness after drying of 2.0 μm is formed, the optical density of the film at a wavelength of 365 nm is 1.5 or more, thereby completing the present invention. That is, the present invention is as follows.

<1> A coloring photosensitive composition comprising:

an oxime ester-based photopolymerization initiator containing a fluorine atom;

a polymerizable compound having an ethylenically unsaturated double bond;

an alkali-soluble resin; and a colorant, in which in a case where a film having a film thickness after drying of 2.0 μm is formed using the coloring photosensitive composition, the optical density of the film at a wavelength of 365 nm is 1.5 or more.

<2> The coloring photosensitive composition as described in <1>, in which the oxime ester-based photopolymerization initiator containing a fluorine atom has at least one selected from an alkyl group having a fluorine atom and a group containing an alkyl group having a fluorine atom.

<3> The coloring photosensitive composition as described in <1> or <2>, in which the oxime ester-based photopolymerization initiator containing a fluorine atom includes a compound represented by Formula (1a),

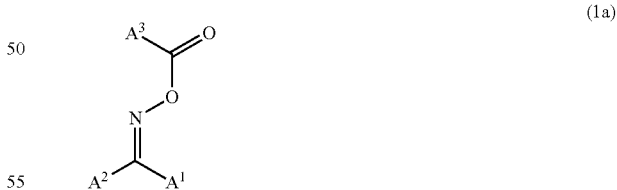

(1a)

in General Formula (1a), $A^1$ and $A^2$ each independently represent an alkyl group, an acyl group, an aryl group, or heterocyclic group, and $A^1$ represents an alkyl group, an aryl group, or a heterocyclic group, provided that at least one of $A^1$, $A^2$ or $A^3$ contains a fluorine atom.

<4> The coloring photosensitive composition as described in <1> or <2>, in which the oxime ester-based photopolymerization initiator containing a fluorine atom includes a compound represented by Formula (1),

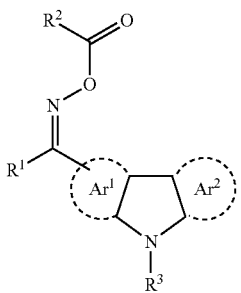

(1)

in Formula (1), $Ar^1$ and $Ar^2$ each independently represent an aromatic hydrocarbon ring which may have a substituent, $R^1$ represents an aryl group having a group containing a fluorine atom, and $R^2$ and $R^3$ each independently represent an alkyl group or an aryl group.

<5> The coloring photosensitive composition as described in any one of <1> to <4>, further comprising:

an organic pigment, in which the ratio A/B of the minimum value A of the absorbance at a wavelength in a range from 400 nm to less than 580 nm to the minimum value B of the absorbance at a wavelength in a range from 580 nm to 750 nm of the coloring photosensitive composition is 0.3 to 3, and the ratio C/D of the minimum value C of the absorbance at a wavelength in a range from 400 nm to 750 nm to the maximum value D of the absorbance at a wavelength in a range from 1,000 nm to 1,300 nm of the coloring photosensitive composition is 5 or more.

<6> The coloring photosensitive composition as described in any one of <1> to <4>, further comprising:

a curable compound having a fluorine atom and a curable functional group.

<7> The coloring photosensitive composition as described in <6>, further comprising a black pigment.

<8> The coloring photosensitive composition as described in any one of <1> to <7>, further comprising:

an α-aminoketone-based photopolymerization initiator, in which the mass ratio of the oxime ester-based photopolymerization initiator containing a fluorine atom to the α-aminoketone-based photopolymerization initiator is 1:1.5 to 1:10.

<9> The coloring photosensitive composition as described in any one of <1> to <8>, further comprising:

an oxime-based photopolymerization initiator other than the oxime ester-based photopolymerization initiator containing a fluorine atom.

<10> The coloring photosensitive composition as described in any one of <1> to <9>, in which the total mass of monochlorobenzene and methyl tert-butyl ether is 2 ppm or less with respect to the total mass of the coloring photosensitive composition.

<11> The coloring photosensitive composition as described in any one of <1> to <10>, which is used for i-ray exposure.

<12> The coloring photosensitive composition according to claim 4, wherein a total number of fluorine atoms in the compound represented by Formula (1) is 3 or more.

<13> A cured film using the coloring photosensitive composition as described in any one of <1> to <12>.

<14> The cured film as described in <13>, which is a color filter or a light-shielding film.

<15> A pattern forming method comprising:

forming a coloring composition layer on a support, using the coloring photosensitive composition as described in any one of <1> to <12>;

exposing the coloring composition layer patternwise; and removing the unexposed area of the coloring composition layer by development to form a colored pattern.

<16> The pattern forming method as described in <15>, in which exposure is carried out using an i-ray.

<17> An infrared cut filter, comprising:

an infrared cut filter; and a light-shielding film formed by curing the coloring photosensitive composition as described in <7>, disposed on at least a part of the surface of the infrared cut filter.

<18> A solid-state imaging device comprising the cured film as described in <13>.

<19> An image display device comprising the cured film as described in <13>.

<20> An infrared sensor comprising the cured film as described in <13>.

It is possible to provide a coloring photosensitive composition capable of forming a film with a low transmittance to light at a wavelength of 365 nm with good adhesiveness. It is also possible to provide a cured film using the coloring photosensitive composition, a pattern forming method, an infrared cut filter with a light-shielding film, a solid-state imaging device, an image display device, and an infrared sensor.

DESCRIPTION OF THE PREFERRED EMBODIMENTS

Figure 1:
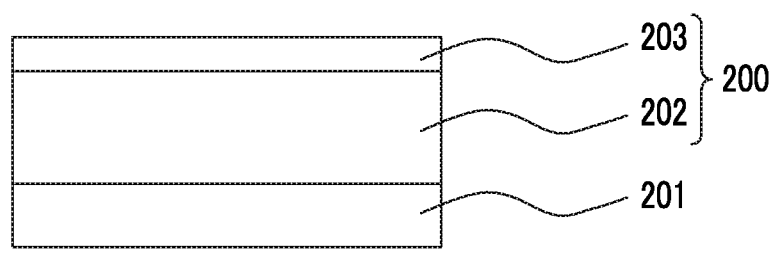
FIG. 1 is a conceptual view of a cured film obtained using a coloring photosensitive composition including a curable compound having a fluorine atom and a curable functional group.

Hereinafter, the contents of the present invention will be described in detail.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In the present specification, light means actinic ray or radiation. Further. "actinic ray" or "radiation" means, for example, a bright line spectrum of a mercury lamp or the like, far ultraviolet rays represented by an excimer laser, extreme ultraviolet rays (EUV rays), X-rays, electron beams, or the like.

In the present specification, "exposure" includes, unless otherwise specified, not only exposure by a bright line spectrum of a mercury lamp, far ultraviolet rays represented by an excimer laser, X-rays, EUV rays, or the like, but also writing by particle rays such as electron beams and ion beams.

In the present specification, a numeral range expressed using "to" means a range that includes the preceding and succeeding numeral values of "to" as the lower limit value and the upper limit value, respectively.

In the present specification, the total solid content refers to a total mass of the components remaining in a case where a solvent is excluded from the entire composition of a composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, a term "step" includes not only an independent step, but also steps which are not clearly distinguished from other steps in a case where an intended action of the steps is obtained.

In the present specification, the weight-average molecular weight and the number-average molecular weight are defined as a value in terms of polystyrene by gel permeation chromatography (GPC) measurement.

<Coloring Photosensitive Composition>

The coloring photosensitive composition of the present invention (hereinafter also referred to as a coloring composition) is a coloring composition including an oxime ester-based photopolymerization initiator containing a fluorine atom, a polymerizable compound having an ethylenically unsaturated double bond, an alkali-soluble resin, and a colorant, in which in a case where a film having a film thickness after drying of 2.0 μm is formed, using the coloring composition, the optical density of the film at a wavelength of 365 nm is 1.5 or more.

By using the coloring composition of the present invention, it is possible to form a film having a low transmittance to light at a wavelength of 365 nm with good adhesiveness to a support or the like. A mechanism by which the effect is obtained is unclear, but it is presumed to be incorporation of the oxime ester-based photopolymerization initiator containing a fluorine atom into the coloring composition.

In the coloring composition of the present invention, in a case where a film having a film thickness after drying of 2.0 μm is formed using the coloring composition, the optical density of the film at a wavelength of 365 nm is preferably 1.5 or more, more preferably 1.8 or more, and still more preferably 2.1 or more. The upper limit is not particularly limited, but can be set to 5.0 or less. As the optical density at a wavelength of 365 nm is higher, it has been more difficult to form a film having a good adhesiveness to a support in the related art. However, the coloring composition of the present invention is capable of forming a film having a high optical density at a wavelength of 365 nm with good adhesiveness to a support. As a result, as the optical density is higher, the effect of the present invention is more remarkable. Further, the coloring composition of the present invention is particularly suitable as a coloring composition which is used for i-ray exposure.

Furthermore, the optical density (OD) is a value for displaying an absorbance degree logarithmically, which is defined by the following expression.

$$OD(\lambda) = \log_{10}[T(\lambda)/T(\lambda)]$$

λ represents a wavelength, T(λ) represents the amount of transmitted light at the wavelength of λ, and I(λ) represents the amount of the incidence ray at the wavelength of λ.

It can be accomplished to set the optical density of the film at a wavelength of 365 nm to 1.5 or more in a case where a film having a film thickness after drying of 2.0 μm is formed, for example, by incorporating a colorant which absorbs light at a wavelength of 365 nm or by appropriately adjusting the content of the colorant in the total solid content.

In addition, in the present invention, the optical density of film is a value obtained by making light at a wavelength of 365 nm be incident on the film, and measuring its transmittance using a spectrometer UV4100 (trade name) manufactured by HITACHI High-Technologies Corporation.

The coloring composition of the present invention can be preferably used in the manufacture of a color filter or a light-shielding film. Further, in the present invention, the color filter means a filter which transmits light in a specific wavelength range and shields light in another specific wavelength range, or a filter which shields light at a specific wavelength in a visible light region and transmits light (infrared rays) in a specific wavelength range in an infrared region. The filter which shields light at a wavelength in a visible light region and transmits light (infrared rays) at a wavelength in the infrared region is also referred to as an infrared transmitting filter.

For example, in a case where the coloring composition of the present invention includes an organic pigment, and the ratio A/B of the minimum value A of the absorbance at a wavelength in a range from 400 nm to less than 580 nm to the minimum value B of the absorbance at a wavelength in a range from 580 nm to 750 nm of the coloring composition is 0.3 to 3, and the ratio C/D of the minimum value C of the absorbance at a wavelength in a range from 400 nm to 750 nm to the maximum value D of the absorbance at a wavelength in a range from 1,000 nm to 1,300 nm of the coloring composition is 5 or more, it is possible to form a cured film of a color filter (infrared transmitting filter) or the like which shields visible light (preferably light at 400 to 700 nm) and transmits infrared light (for example, light at 850 nm or more). This cured film has good adhesiveness to a support as well as excellent sensitivity and rectangularity.

Moreover, in a case where the coloring composition of the present invention includes a curable compound having a fluorine atom and a curable functional group, it is possible to form a cured film having high adhesiveness to a support and low reflectivity.

A mechanism with which a cured film having low reflectivity can be formed is presumed to be as follows. Since the curable compound having a fluorine atom and a curable functional group (hereinafter also referred to as a fluorine-containing curable compound) has low surface free energy, the support easily has the fluorine-containing curable compound concentrated in the vicinity of the coating film surface on the opposite side, in the coating film formed by coating the coloring composition on a support such as a substrate. As a result, as shown in FIG. 1, a cured film 200 on a substrate 201 obtained by curing the coating film has a bilayer structure with a colored layer (underlayer) 202 including a colorant and a coating layer (upper layer) 203 formed of the fluorine-containing curable compound. In a case where such a bilayer structure is formed, light reflected on the surface of the coating layer and light reflected on the interface between the coating layer and the colored layer are canceled by interference, and thus, low reflectivity can be realized.

Furthermore, due to the presence of a curable functional group derived from a fluorine-containing curable compound, in a case where a cured film in a pattern shape is manufactured, the undercut is suppressed, and thus, chipping of the cured film is suppressed and the linearity of the pattern is also excellent.

In addition, in an aspect including the fluorine-containing curable compound, in a case of further including a black pigment, a cured film having excellent light-shielding properties as well as low reflectivity can be formed, and accordingly, the obtained cured film is particularly suitable as a light-shielding film.

Moreover, in a case where the coloring composition of the present invention further includes an α-aminoketone-based photopolymerization initiator as the photopolymerization initiator and the mass ratio of the oxime ester-based photopolymerization initiator containing a fluorine atom to the α-aminoketone-based photopolymerization initiator is 1:1.5 to 1:10, a cured film such as a color filter, having excellent adhesiveness and rectangularity can be formed.

Furthermore, in a case where the coloring composition of the present invention further includes an oxime-based photopolymerization initiator (another oxime-based photopolymerization initiator) other than the oxime ester-based photopolymerization initiator containing a fluorine atom as the photopolymerization initiator, a cured film having good sensitivity and adhesiveness and suppressed decoloration is easily produced.

Hereinafter, the respective configurations of the present invention will be described in detail.

<<Oxime Ester-Based Photopolymerization Initiator Containing Fluorine Atom>>

The coloring composition of the present invention contains an oxime ester-based photopolymerization initiator containing a fluorine atom (hereinafter also referred to as a fluorine-containing oxime ester-based photopolymerization initiator).

In the present invention, the fluorine-containing oxime ester-based photopolymerization initiator is preferably a compound having a maximum absorption wavelength in a wavelength range of 350 to 500 nm, more preferably a compound having an absorption wavelength in a wavelength range of 360 to 480 nm, and particularly preferably a compound having a high absorbance at 365 nm.

The molar light absorption coefficient at 365 nm of the fluorine-containing oxime ester-based photopolymerization initiator is preferably 1,000 to 300,000, more preferably 2.000 to 300,000, and particularly preferably 5,000 to 200,000, from the viewpoint of sensitivity.

The molar light absorption coefficient of the compound can be measured using a known method, and it is preferable to measure the molar light absorption coefficient by means of, for example, an ultraviolet and visible light spectrophotometer (Cary-5 spectrophotometer manufactured by Varian) by using an ethyl acetate solvent at a concentration of 0.01 g/L.

In the present invention, the fluorine-containing oxime ester-based photopolymerization initiator preferably has a group containing a fluorine atom. The group containing a fluorine atom is preferably an alkyl group having a fluorine atom (hereinafter also referred to as a fluorine-containing alkyl group) and/or a group containing an alkyl group having a fluorine atom (hereinafter also referred to as a fluorine-containing group).

As the fluorine-containing group, at least one group selected from $-OR^{X11}$, $-SR^{X11}$, $-COR^{X11}$, $-COOR^{X11}$, $-OCOR^{X11}$, $-NR^{X11}R^{X12}$, $-NHCOR^{X11}$, $-CONR^{X11}R^{X12}$, $-NHCONR^{X11}R^{X12}$, $-NHCOOR^{X11}$, $-SO_2R^{X11}$, $-SO_2OR^{X11}$, and $-NHSO_2R^{X11}$ is preferable. $R^{X11}$ represents a fluorine-containing alkyl group, and $R^{X12}$ represents a hydrogen atom, an alkyl group, a fluorine-containing alkyl group, an aryl group, or a heterocyclic group. The fluorine-containing group is more preferably $-OR^{X11}$.

The group containing a fluorine atom is preferably a fluorine-containing alkyl group and/or $-OR^{X11}$.

The group containing a fluorine atom preferably has a terminal structure represented by Formula (1) or (2). * in the formula represents a linking arm.

$$*-CHF_2 \quad (1)$$

$$*-CF_3 \quad (2)$$

The fluorine-containing oxime ester-based photopolymerization initiator has a total number of fluorine atoms in the compound of preferably 3 or more, and more preferably 4 to 10.

The number of carbon atoms of the alkyl group and fluorine-containing alkyl group is preferably 1 to 20, more preferably 1 to 15, still more preferably 1 to 10, and particularly preferably 1 to 4. The alkyl group and the fluorine-containing alkyl group is in any one of linear, branched, and cyclic forms, and preferably linear or branched.

The fluorine-containing alkyl group has a substitution rate of fluorine atoms of preferably 40% to 100%, more preferably 50% to 100%, and still more preferably 60% to 100%. Further, the substitution rate of fluorine atoms refers to a ratio (%) of the numbers of the hydrogen atoms substituted with fluorine atoms out of the total number of hydrogen atoms contained in the alkyl group.

The number of carbon atoms of the aryl group is preferably 6 to 20, more preferably 6 to 15, and still more preferably 6 to 10. The aryl group may be a monocycle or a fused ring.

The heterocyclic group is preferably a 5- or 6-membered ring. The heterocyclic group may a monocycle or a fused ring. The number of fusions is preferably 2 to 8, more preferably 2 to 6, still more preferably 3 to 5, and particularly preferably 3 or 4. The number of carbon atoms constituting the heterocyclic group is preferably 3 to 40, more preferably 3 to 30, and still more preferably 3 to 20. The number of heteroatoms constituting the heterocyclic group is preferably 1 to 3. The heteroatom constituting the heterocyclic group is preferably a nitrogen atom, an oxygen atom, or a sulfur atom, and more preferably a nitrogen atom.

In the present invention, examples of the fluorine-containing oxime ester-based photopolymerization initiator include a compound represented by Formula (1a).

(1a)

In General Formula (1a), $A^1$ and $A^2$ each independently represent an alkyl group, an acyl group, an aryl group, or a heterocyclic group, and $A^3$ represents an alkyl group, an aryl group, or a heterocyclic group, provided that at least one of $A^1$, $A^2$ or $A^3$ contains a fluorine atom.

$A^1$ represents an alkyl group, an acyl group, an aryl group, or a heterocyclic group, and is preferably an aryl group or a heterocyclic group, and more preferably a heterocyclic group.

The number of carbon atoms of the alkyl group is preferably 1 to 20, more preferably 1 to 15, still more preferably 1 to 10, and particularly preferably 1 to 4. The alkyl group may be in any one of linear, branched, and cyclic forms, and is preferably linear or branched.

The number of carbon atoms of the acyl group is preferably 2 to 20, and more preferably 2 to 15. Examples of the acyl group include an acetyl group and a benzoyl group.

The number of carbon atoms of the aryl group is preferably 6 to 20, more preferably 6 to 15, and still more preferably 6 to 10. The aryl group may be a monocycle or a fused ring.

The heterocyclic group is preferably a 5- or 6-membered ring. The heterocyclic group may be a monocycle or a fused ring. The number of fused rings is preferably 2 to 8, more preferably 2 to 6, still more preferably 3 to 5, and particularly preferably 3 or 4. The number of carbon atoms constituting the heterocyclic group is preferably 3 to 40, more preferably 3 to 30, and still more preferably 3 to 20. The number of heteroatoms constituting the heterocyclic group is preferably 1 to 3. The heteroatom constituting the heterocyclic group is preferably a nitrogen atom, an oxygen atom, or a sulfur atom, and more preferably a nitrogen atom.

The above-mentioned group represented by $A^1$ may be unsubstituted or may have a substituent. Examples of the substituent include an alkyl group, an aryl group, a heterocyclic group, nitro group, a cyano group, halogen atom, —$OR^{X1}$, —$SR^{X1}$, —$COR^{X1}$, —$COOR^{X1}$, —$OCOR^{X1}$, —$NR^{X1}R^{X2}$, —$NHCOR^{X1}$, —$CONR^{X1}R^{X2}$, —$NHCONR^{X1}R^{X2}$, —$NHCOOR^{X1}$, —$SO_2R^{X1}$, —$SO_2OR^{X1}$, and —$NHSO_2R^{X1}$. $R^{X1}$ and $R^{X2}$ each independently represent a hydrogen atom, an alkyl group, an aryl group, or a heterocyclic group.

Examples of the halogen atom include a fluorine atom, a chlorine atom, a bromine atom, and an iodine atom, and the halogen atom is preferably a fluorine atom.

The number of carbon atoms of the alkyl group as the substituent, and the alkyl group represented by $R^{X1}$ and $R^{X2}$ is preferably 1 to 20. The alkyl group may be in any one of linear, branched, and cyclic forms, and is preferably linear or branched. A part or all of the hydrogen atoms of the alkyl group may be substituted with halogen atoms (preferably fluorine atoms). Further, a part or all of the hydrogen atoms of the alkyl group may be substituted with the substituents.

The number of carbon atoms of the aryl group as the substituent, and the aryl group represented by $R^{X1}$ and $R^{X2}$ is preferably 6 to 20, more preferably 6 to 15, and still more preferably 6 to 10. The aryl group may be a monocycle or a fused ring. A part or all of the hydrogen atoms of the aryl group may be substituted with the substituents.

The heterocyclic group as the substituent, and the heterocyclic group represented by $R^{X1}$ and $R^{X2}$ are preferably a 5- or 6-membered ring. The heterocyclic group may be a monocycle or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. The heteroatom constituting the heterocyclic group is preferably a nitrogen atom, an oxygen atom, or a sulfur atom. Further, a part or all of the hydrogen atoms of the heterocyclic group may be substituted with the substituents.

$A^2$ represents an alkyl group, an acyl group, an aryl group, or a heterocyclic group, and is preferably an alkyl group or an aryl group, and particularly preferably an aryl group. The alkyl group, the acyl group, the aryl group, and the heterocyclic group have the same definitions as the ranges described in $A^1$. These groups may be unsubstituted or may have substituents, and preferably have substituents.

Examples of the substituent include the substituents described in $A^1$, and the substituent is preferably an alkyl group, —$OR^{X1}$, or a halogen atom. $R^{X1}$ represents a hydrogen atom, an alkyl group, an aryl group, or a heterocyclic group, and is preferably an alkyl group. It is preferable that a part or all of the hydrogen atoms of the alkyl group as the substituent and the alkyl group represented by $R^{X1}$ are substituted with the fluorine atoms.

$A^3$ represents an alkyl group, an aryl group, or a heterocyclic group, and is preferably an alkyl group or an aryl group. These groups may be unsubstituted or may have substituents. Examples of the substituent include the substituents described in $A^1$.

In the present invention, the fluorine-containing oxime ester-based photopolymerization initiator is preferably a compound represented by Formula (1).

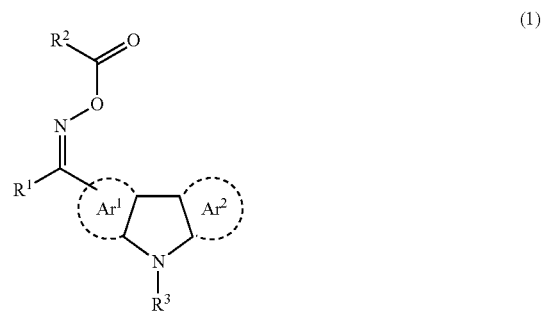

(1)

In Formula (1), $Ar^1$ and $Ar^2$ each independently represent an aromatic hydrocarbon ring which may have a substituent, $R^1$ represents an aryl group having a group containing a fluorine atom, and $R^2$ and $R^3$ each independently represent an alkyl group or an aryl group.

$Ar^1$ and $Ar^2$ each independently represent an aromatic hydrocarbon ring which may have a substituent.

The aromatic hydrocarbon ring may be a monocycle or a fused ring. The number of carbon atoms constituting the ring of the aromatic hydrocarbon ring is preferably 6 to 20, more preferably 6 to 15, and particularly preferably 6 to 10. The aromatic hydrocarbon ring is preferably a benzene ring and naphthalene ring. Among those, at least one of $Ar^1$ or $Ar^2$ is preferably a benzene ring, and $Ar^1$ is more preferably a benzene ring. $Ar^1$ is preferably a benzene ring or a naphthalene ring, and $Ar^1$ is more preferably a naphthalene ring.

Examples of the substituent which may be contained in the $Ar^1$ and $Ar^2$ include the substituents described in $A^1$.

It is preferable that $Ar^1$ is unsubstituted. $Ar^1$ may be unsubstituted or may have a substituent. The substituent is preferably —$COR^{X1}$. $R^{X1}$ is preferably an alkyl group, an aryl group, or a heterocyclic group, and more preferably an aryl group. The aryl group may have a substituent or may be unsubstituted. Examples of the substituent include having an alkyl group having 1 to 10 carbon atoms.

$R^1$ represents an aryl group having a group containing a fluorine atom.

The number of carbon atoms of the aryl group is preferably 6 to 20, more preferably 6 to 15, and still more preferably 6 to 10. The aryl group may be a monocycle or a fused ring.

The group containing a fluorine atom is preferably an alkyl group having a fluorine atom (fluorine-containing alkyl group) and/or a group containing an alkyl group having a fluorine atom (fluorine-containing group).

The fluorine-containing group is preferably at least one group selected from —OR$^{X11}$, —SR$^{X11}$, —COR$^{X11}$, —COOR$^{X11}$, —OCOR$^{X11}$, —NR$^{X11}$R$^{X12}$, —NHCOR$^{X11}$, —CONR$^{X11}$R$^{X12}$, —NHCONR$^{X11}$R$^{X12}$, —NHCOOR$^{X11}$, —SO$_2$R$^{X11}$, —SO$_2$OR$^{X11}$, and —NHSO$_2$R$^{X11}$, and more preferably —OR$^{X11}$. R$^{X11}$ represents a fluorine-containing alkyl group, and R$^{X12}$ represents a hydrogen atom, an alkyl group, a fluorine-containing alkyl group, an aryl group, or a heterocyclic group.

The group containing a fluorine atom is preferably a fluorine-containing alkyl group and/or —OR$^{X11}$.

The number of carbon atoms of the fluorine-containing alkyl group is preferably 1 to 20, more preferably 1 to 15, still more preferably 1 to 10, and particularly preferably 1 to 4. The fluorine-containing alkyl group may be in any one of linear, branched, and cyclic forms, and is preferably linear or branched.

The substitution rate of fluorine atoms of the fluorine-containing alkyl group is preferably 40% to 100%, more preferably 50% to 100%, and still more preferably 60% to 100%.

The alkyl group, the aryl group, and the heterocyclic group represented by R$^{X12}$ have the same definitions as the ranges described in the alkyl group, the aryl group, and the heterocyclic group represented by R$^{X1}$ and R$^{X2}$ of A$^1$.

R$^2$ represents an alkyl group or an aryl group, and is preferably an alkyl group. The alkyl group and the aryl group may be unsubstituted or may have substituents. Examples of the substituent include the above-mentioned substituents described in A$^1$.

The number of carbon atoms of the alkyl group is preferably 1 to 20, more preferably 1 to 15, still more preferably 1 to 10, and particularly preferably 1 to 4. The alkyl group may be in any one of linear, branched, and cyclic forms, and is preferably linear or branched.

The number of carbon atoms of the aryl group is preferably 6 to 20, more preferably 6 to 15, and still more preferably 6 to 10. The aryl group may be a monocycle or a fused ring.

R$^3$ represents an alkyl group or an aryl group, and is preferably an alkyl group. The alkyl group and the aryl group may be unsubstituted or may have substituents. Examples of the substituent include the above-mentioned substituents described in A$^1$.

The number of carbon atoms of the alkyl group is preferably 1 to 20, more preferably 1 to 15, and still more preferably 1 to 10. The alkyl group may be in any one of linear, branched, and cyclic forms, and is preferably linear or branched.

The number of carbon atoms of the aryl group is preferably 6 to 20, more preferably 6 to 15, and still more preferably 6 to 10. The aryl group may be a monocycle or a fused ring.

Specific examples of the compound represented by Formula (1) include the following compounds.

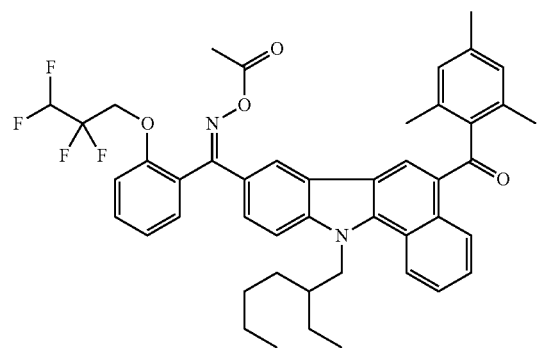

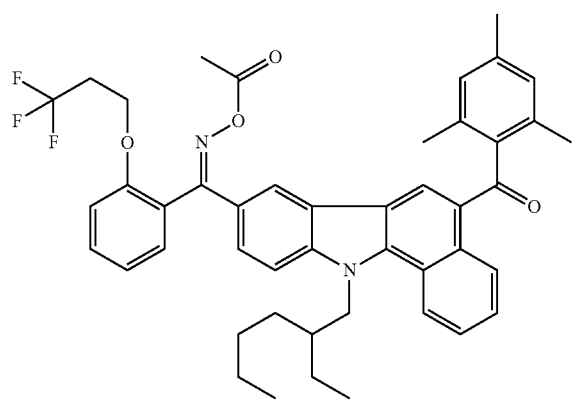

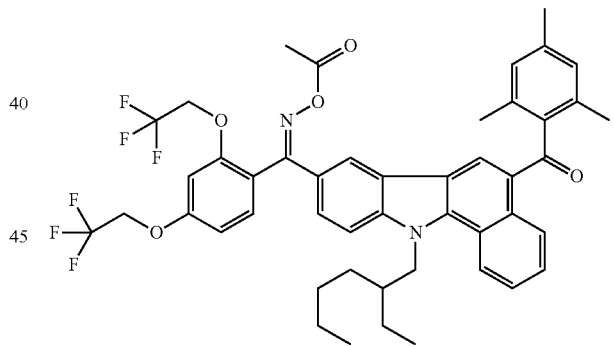

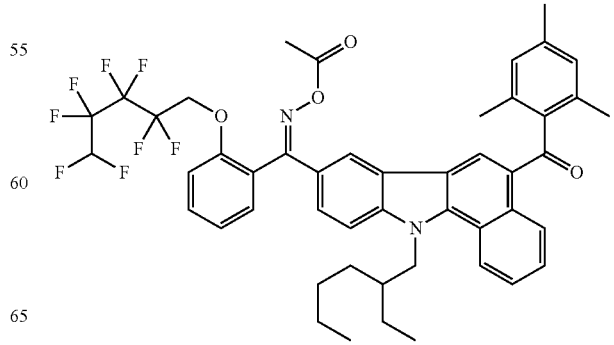

-continued

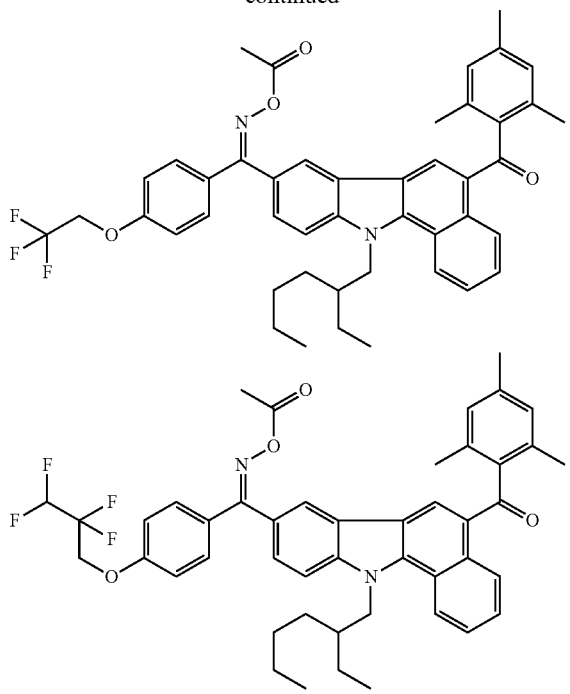

In the present invention, the fluorine-containing oxime ester-based photopolymerization initiator can use the following compounds. Incidentally, the compounds described in JP2010-262028A, the compound (C-3) described in JP2013-164471 A, or the like can be used. The contents of the publications are incorporated herein by reference.

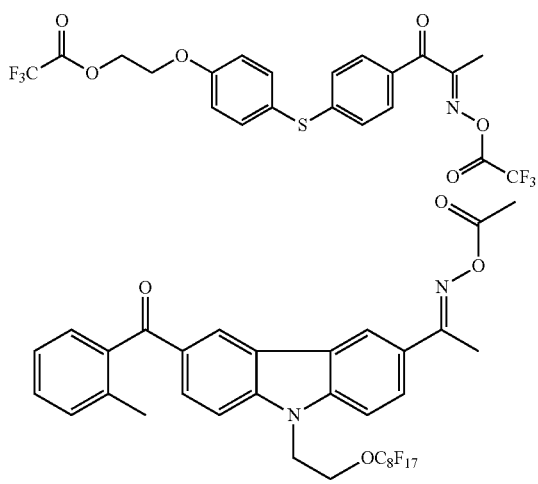

The content of the fluorine-containing oxime ester-based photopolymerization initiator is preferably 0.1% to 50% by mass, more preferably 0.5% to 30% by mass, and still more preferably 1% to 20% by mass, with respect to the total solid content of the coloring composition. By setting the content to this range, a pattern having good adhesiveness is obtained. The coloring composition of the present invention may include one kind or two or more kinds of the fluorine-containing oxime ester-based photopolymerization initiators. In a case where two or more kinds of the fluorine-containing oxime ester-based photopolymerization initiators are included, the total amount thereof is preferably in the range.

<<α-Aminoketone-Based Photopolymerization Initiator>>

The coloring composition of the present invention can further include an α-aminoketone-based photopolymerization initiator. By incorporation of the α-aminoketone-based photopolymerization initiator, a pattern having good rectangularity can be formed.

Examples of the α-aminoketone-based photopolymerization initiator compound represented by Formula (AK-1).

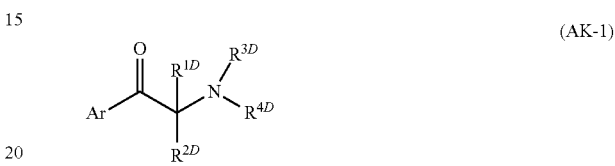

(AK-1)

In the formula. Ar represents a phenyl group substituted with —$SR^{13}$ or —$N(R^{7E})(R^{8E})$, and $R^{13}$ represents a hydrogen atom or an alkyl group.

$R^{1D}$ and $R^{2D}$ each independently represent an alkyl group having 1 to 8 carbon atoms. $R^{1D}$ and $R^{2D}$ may be bonded to each other to constitute an alkylene group having 2 to 9 carbon atoms.

The alkyl group represented by $R^{1D}$ and $R^{2D}$ may be in any one of linear, branched, and cyclic forms, and is preferably linear or branched.

The alkyl group represented by $R^{1D}$ and $R^{2D}$ may be unsubstituted or may have a substituent. Examples of the substituent include an aryl group, a heterocyclic group, a nitro group, a cyano group, a halogen atom, —$OR^{Y1}$, —$SR^{Y1}$, —$COR^{Y1}$, —$COOR^{Y1}$, —$OCOR^{Y1}$, —$NR^{Y1}R^{Y2}$, —$NHCOR^{Y1}$, —$CONR^{Y1}R^{Y2}$, —$NHCONR^{Y1}R^{Y2}$, —$NHCOOR^{Y1}$, —$SO_2R^{Y1}$, —$SO_2OR^{Y1}$, and —$NHSO_2R^{Y1}$. $R^{Y1}$ and $R^{Y2}$ each independently represent a hydrogen atom, an alkyl group, an aryl group, or a heterocyclic group. The substituent is preferably an aryl group. It is particularly preferable that any one of $R^{1D}$ and $R^{2D}$ is an unsubstituted alkyl group and the other is an alkyl group substituted with an aryl group.

Examples of the halogen atom include a fluorine atom, a chlorine atom, a bromine atom, and an iodine atom.

The number of carbon atoms of the alkyl group represented by $R^{Y1}$ and $R^{2Y}$ is preferably 1 to 20. The alkyl group may be in any one of linear, branched, and cyclic forms, and is preferably linear or branched.

The number of carbon atoms of the aryl group as the substituent and the aryl group represented by $R^{Y1}$ and $R^{Y2}$ is preferably 6 to 20, more preferably 6 to 15, and still more preferably 6 to 10. The aryl group may be a monocycle or a fused ring. Further, a part or all of the hydrogen atoms in the aryl group may be substituted with an alkyl group having 1 to 8 carbon atoms.

The heterocyclic group represented by $R^{Y1}$ and $R^{Y2}$ is preferably a 5- or 6-membered ring. The heterocyclic group may be a monocycle or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. The heteroatom constituting the heterocyclic group is preferably a nitrogen atom, an oxygen atom, or a sulfur atom.

$R^{3D}$ and $R^{4D}$ each independently represent a hydrogen atom, an alkyl group having 1 to 12 carbon atoms, an alkyl group having 2 to 4 carbon atoms, substituted with alkoxy having 1 to 4 carbon atoms, or an alkenyl group having 3 to 5 carbon atoms. $R^{3D}$ and $R^{4D}$ may be bonded to each other to form an alkylene group having 3 to 7 carbon atoms, and the alkylene group may contain —O— or —N($R^{12}$)— within the alkylene chain. $R^{12}$ represents an alkyl group having 1 to 4 carbon atoms.

$R^{7E}$ and $R^{8E}$ each independently represent a hydrogen atom, an alkyl group having 1 to 12 carbon atoms, an alkyl group having 2 to 4 carbon atoms, substituted with alkoxy having 1 to 4 carbon atoms, or an alkenyl group having 3 to 5 carbon atoms. $R^{7E}$ and $R^{8E}$ may be bonded to each other to form an alkylene group having 3 to 7 carbon atoms, and the alkylene group may contain —O— or —N($R^{12}$)— within the alkylene chain. Here, $R^{12}$ has the same definition as above.

Examples of the compound represented by Formula (AK-1) include 2-methyl-1-phenyl-2-morpholinopropan-1-one, 2-methyl-1-[4-(hexyl)phenyl]-2-morpholinopropan-1-one, and 2-ethyl-2-dimethylamino-1-(4-morpholinophenyl)-butanone-1,2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone.

Examples of the commercially available products of the α-aminoketone-based photopolymerization initiator include Irgacure907, Irgacure369, and Irgacure379 (trade names: all manufactured by BASF).

In a case where the coloring composition of the present invention includes an α-aminoketone-based photopolymerization initiator, the mass ratio of the fluorine-containing oxime ester-based photopolymerization initiator to the α-aminoketone-based photopolymerization initiator is preferably 1:1.5 to 1:10, more preferably 1:1.5 to 1:8, still more preferably 1:1.5 to 1:5, and particularly preferably 1:1.5 to 1:4. Further, the content of the α-aminoketone-based photopolymerization initiator is preferably 0.1% to 10% by mass in the total solid content of the coloring composition of the present invention. The lower limit is preferably 0.2% by mass or more, and more preferably 0.5% by mass or more. The upper limit is more preferably 8% by mass or less, and still more preferably 5% by mass or less. In a case where the content of the α-aminoketone-based photopolymerization initiator is within the range, a pattern having excellent rectangularity is easily formed.

Furthermore, the total amount of the fluorine-containing oxime ester-based photopolymerization initiator and the α-aminoketone-based photopolymerization initiator is preferably 50% by mass or more, more preferably 75% by mass or more, and particularly preferably 90% by mass or more, with respect to the total mass of the entire photopolymerization initiator.

<<Other Photopolymerization Initiator>>

The coloring composition of the present invention can also further include photopolymerization initiators (other photopolymerization initiators) other than the fluorine-containing oxime ester-based photopolymerization initiator and the α-aminoketone-based photopolymerization initiator.

Examples of the other photopolymerization initiators include halogenated hydrocarbon derivatives (for example, a derivative having a triazine skeleton and a derivative having an oxadiazole skeleton), acylphosphine compounds such as acylphosphine oxide, oxime compounds such as hexaaryl biimidazole and an oxime derivative, organic peroxide, thio compounds, ketone compounds, aromatic onium salts, ketoxime ethers, aminoacetophenone compounds, and hydroxyacetophenone. Examples of the halogenated hydrocarbon compound having a triazine skeleton include the compounds described in Wakabayashi et al., Bull. Chem. Soc. Japan, 42, 2924 (1969), the compounds described in UK1388492B, the compound described in JP1978-133428A (JP-S53-133428A), the compounds described in GE3337024B, the compounds described in F. C. Schaefer et al., J. Org. Chem.; 29, 1527 (1964), the compounds described in JP1987-58241A (JP-S62-58241A), the compounds described in JP1993-281728A (JP-H05-281728A), the compounds described in JP1993-34920A (JP-H05-34920A), and the compounds described in U.S. Pat. No. 4,212,976A. Compounds the fluorine-containing oxime ester-based photopolymerization initiator and α-aminoketone-based photopolymerization initiator can be used.

Furthermore, from the viewpoint of exposure sensitivity, a compound selected from the group consisting of a trihalomethyl triazine compound, a benzyl dimethyl ketal compound, an α-hydroxyketone compound, an acylphosphine compound, a phosphine oxide compound, a metallocene compound, an oxime compound, a triallyl imidazole dimer, an onium compound, a benzothiazole compound, a benzophenone compound, an acetophenone compound, and derivatives of these, a cyclopentadiene-benzene-iron complex and a salt thereof, a halomethyl oxadiazole compound, and a 3-aryl-substituted coumarin compound is preferable.

More preferably at least one kind of compound which is a trihalomethyltriazine compound, an acylphosphine compound, a phosphine oxide compound, an oxime compound, a triallyl imidazole dimer, an onium compound, a benzophenone compound, or an acetophenone compound, and is selected from the group consisting of a trihalomethyl triazine compound, an oxime compound, a triallyl imidazole dimer, and a benzophenone compound is particularly preferable.

With regard to specific examples of the photopolymerization initiator, reference can be made to the description in for example, paragraphs 0265 to 0268 of JP2013-29760A, the contents of which are incorporated herein by reference.

As the other photopolymerization initiators, a hydroxyacetophenone compound and an acylphosphine compound can also suitably be used. More specifically, for example, the acylphosphine-based initiators described in JP4225898B can also be used.

As the hydroxyacetophenone-based initiator, IRGACURE-184, DAROCUR-1173, IRGACURE-500, IRGACURE-2959, and IRGACURE-127 (trade names: all manufactured by BASF) can be used.

As the acylphosphine-based initiator, IRGACURE-819 or DAROCUR-TPO (trade name: either manufactured by BASF) which is commercially available product can be used.

Examples of the other photopolymerization initiators include an oxime compound.

As the specific examples of the oxime compound, the compound described in JP2001-233842A, the compound described in JP2000-80068A, and the compound described in JP2006-342166A can be used.

Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Furthermore, examples of the oxime compound also include the compounds described in J. C. S. Perkin 11

(1979), pp. 1653 to 1660, J. C. S. Perkin 11 (1979), pp. 156 to 162, Journal of Photopolymer Science and Technology (1995), pp. 202 to 232, and each publication of JP2000-66385A, JP2000-80068A, JP2004-534797A, and JP2006-342166A.

As the commercially available products thereof, IRGACURE-OXE01 (manufactured by BASF) and IRGACURE-OXE02 (manufactured by BASF) are also suitably used. In addition, TR-PBG-304 (manufactured by Changzhou Tronly New Electronic Materials Co., Ltd.), ADEKA ARKLS NCI-831, and ADEKA ARKLS NCI-930 (manufactured by ADEKA Corporation) can also be used.

Furthermore, as oxime compounds other than the above-described oxime compounds, the compound described in JP2009-519904A in which oxime is linked to an N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a coloring agent moiety, the ketoxime compound described in WO2009/131189A, the compound described in U.S. Pat. No. 7,556,910B, which contains a triazine skeleton and an oxime skeleton in the same molecule, the compound described in JP2009-221114A, which has maximum absorption at 405 nm and has excellent sensitivity to a light source of a g-ray, and the like, may be used.

With regard to preferred examples thereof, reference can be made to paragraphs 0274 to 0275 of JP2013-29760A, the contents of which are incorporated herein by reference.

Specifically, the oxime compound is preferably a compound represented by Formula (OX-1). Incidentally, the compound may be an oxime compound in which an N—O bond of oxime forms an (E) isomer, an oxime compound in which the N—O bond forms a (Z) isomer, or an oxime compound in which the N—O bond forms a mixture of an (E) isomer and a (Z) isomer.

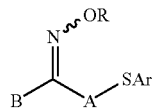

(OX-1)

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. Moreover, the above substituents may further be substituted with other substituents.

Examples of the substituents include a halogen atom, an aryloxy group, an alkoxycarbonyl group, an aryloxycarbonyl group, an acyloxy group, an acyl group, an alkyl group, and an aryl group.

As the monovalent substituent represented by B in General Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in General Formula (OX-1), an alkylene group having 1 to 12 carbon atoms, a cycloalkylene group, or an alkynylene group is preferable. These groups may have one or more substituents. Examples of the substituent include the above-mentioned substituents.

As the photopolymerization initiator, a compound represented by General Formula (1) or (2) can also be used.

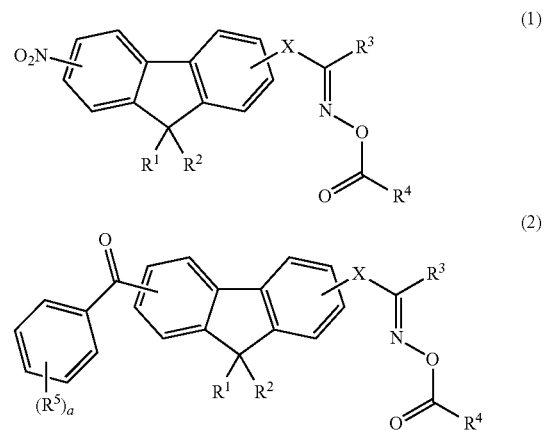

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms, and in the case where $R^1$ and $R^2$ are phenyl groups, the phenyl groups may be bonded to each other to form a fluorene group; and R and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and X represents a direct bond or a carbonyl group.

In Formula (2). $R^1$, $R^2$, $R^3$, and $R^4$ have the same definitions as $R^1$, $R^2$, $R^3$, and $R^4$ in Formula (1); $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group; $R^6$ represents an alkyl group having 1 to 20 carbon atoms, an aryl group having 6 to 30 carbon atoms, an arylalkyl group having 7 to 30 carbon atoms, or a heterocyclic group having 4 to 20 carbon atoms; X represents a direct bond or a carbonyl group; and a represents an integer of 0 to 4.

In Formulae (1) and (2), $R^1$ and $R^2$ are each independently preferably a methyl group, an ethyl group, an n-propyl group, i-propyl group, a cyclohexyl group, or a phenyl group. $R^6$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Specific examples of the compounds represented by Formulae (1) and (2) include the compounds described in paragraph Nos. 0076 to 0079 of JP2014-137466A, the contents of which are incorporated herein by reference.

The content of the other photopolymerization initiators can be set to 10% to 90/o by mass, 10% to 80%, by mass, or 10% to 70% by mass, with respect to the total mass of the photopolymerization initiator included in the coloring composition. Further, the content can also be set to less than 50% by mass, less than 25% by mass, or less than 10% by mass, with respect to the total mass of the photopolymerization initiator included in the coloring composition. In addition, a composition such that the other photopolymerization initiators are substantially not contained can be set. The expression, the other photopolymerization initiators being substantially not contained, means that the content of the other photopolymerization initiators is preferably 1% by mass or less, and more preferably 0.1% by mass or less, with respect to the total mass of the photopolymerization initiator, and still more preferably, the other photopolymerization initiators are not included.

Furthermore, the coloring composition of the present invention can be configured such that it does substantially not have an oxime-based photopolymerization initiator (hereinafter also referred to as other oxime-based photopolymerization initiators) other than the fluorine-containing oxime ester-based photopolymerization initiator. The expression, the other oxime-based photopolymerization initiators being substantially not contained, means that, for example, the content of the other oxime-based photopolymerization initiators is preferably 1% by mass or less, and more preferably 0.1% by mass or less, with respect to the total mass of the photopolymerization initiator, and still more preferably, the other oxime-based photopolymerization initiators are not contained. In addition, the other oxime-based photopolymerization initiator is an oxime compound not having a fluorine atom, and examples thereof include the above-mentioned oxime compounds described as the other photopolymerization initiators.

In addition, the coloring composition of the present invention can be configured such that the fluorine-containing oxime ester-based photopolymerization initiator and the other oxime-based photopolymerization initiator are used in combination. According to this aspect, a cured film having suppressed decoloration is easily produced. In a case of using the fluorine-containing oxime ester-based photopolymerization initiator and the other oxime-based photopolymerization initiator in combination, the other oxime-based photopolymerization initiator has a content of preferably 30 to 300 parts by mass, more preferably 50 to 250 parts by mass, and still more preferably 70 to 200 parts by mass, with respect to 100 parts by mass of the total amount of the fluorine-containing oxime ester-based photopolymerization initiator and the oxime-based photopolymerization initiator. Within this range, a cured film having good sensitivity and adhesiveness as well as suppressed decoloration is easily produced.

<<Colorant>>

The coloring composition of the present invention contains a colorant. The colorant may be a pigment or a dye.

The content of the colorant is preferably 1% to 80% by mass with respect to the total solid content of the coloring composition. The lower limit is preferably 5% by mass or more, more preferably 10% by mass or more, and still more preferably 20% by mass or more. The upper limit is preferably 75% by mass or less, and more preferably 70% by mass or less.

<<<Pigment>>>

Examples of the pigment include various inorganic pigments or organic pigments known in the related art.

Examples of the inorganic pigment include oxides of metals such as iron, cobalt, aluminum, cadmium, lead, copper, titanium, magnesium, chromium, zinc, and antimony, and composite oxides of the metals.

Examples of the organic pigments include the following pigments, but the present invention is not limited thereto.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like C. I. Pigment Orange 2, 5, 13, 16, 17:1, 31, 34, 36, 38, 43, 46, 48, 49, 51, 52, 55, 59, 60, 61, 62, 64, 71, 73, and the like C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279

C. I. Pigment Green 7, 10, 36, 37, 58, and 59

C. I. Pigment Violet 1, 19, 23, 27, 32, 37, and 42

C. I. Pigment Blue 1, 2, 15, 15:1, 15:2, 15:3, 15:4, 15:6, 16, 22, 60, 64, 66, 79, and 80

Moreover, the organic pigment is also preferably a halogenated zinc phthalocyanine pigment (also referred to as a halogenated zinc phthalocyanine pigment A) having an average number of halogen atoms of 14 to 16 and an average number of bromine atoms of 12 or less in one molecule of phthalocyanine. The halogenated zinc phthalocyanine pigment A is preferably a compound represented by General Formula (A1).

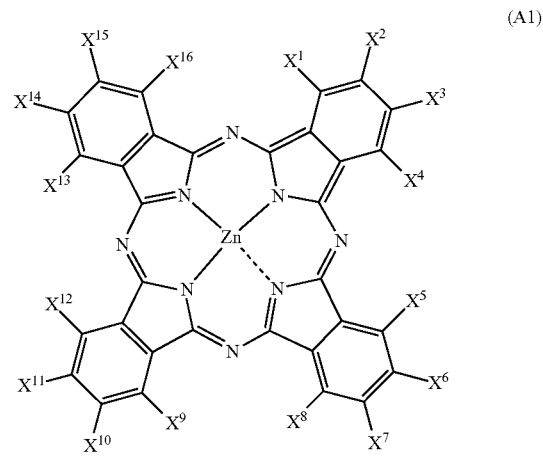

(A1)

In General Formula (A1), $X^1$ to $X^{16}$ each independently represent a halogen atom, a hydrogen atom, or a substituent.

Examples of the halogen atom include a chlorine atom, a bromine atom, a fluorine atom, and an iodine atom.

With regard to the substituent, reference can be made to the descriptions of paragraph Nos. 0025 to 0027 of JP2013-209623A, the contents of which will be incorporated herein by reference.

The halogenated zinc phthalocyanine pigment A has an average number of halogen atoms of 14 to 16, and preferably 15 or 16 in one molecule of phthalocyanine.

The halogenated zinc phthalocyanine pigment A has an average number of bromine atoms of 0 to 12, preferably 1 to 8, more preferably 1 to 7, and still more preferably 2 to 7 in one molecule of phthalocyanine.

In a case where the average number of halogen atoms and the average number of bromine atoms are within the ranges, generation of needle-shaped crystals can be suppressed.

In addition, it is possible to produce a cured film of a color filter and the like, having small brightness unevenness and excellent spectral characteristics.

In the halogenated zinc phthalocyanine pigment A, examples of halogen atoms other than a bromine atom include a chlorine atom, a fluorine atom, and an iodine atom, and from the viewpoints of suppression of needle-shaped foreign matters, brightness unevenness, and the like, a chlorine atom and a fluorine atom are preferable, and a chlorine atom is more preferable.

Furthermore, the average number of halogen atoms and the average number of bromine atoms in one molecule of phthalocyanine in the halogenated zinc phthalocyanine pigment A can be calculated by analysis of halogen contents by means of mass spectrometry and flask combustion ion chromatography.

These organic pigments can be used singly or in combination of various organic pigments in order to increase the color purity.

<<<<<Black Pigment>>>>>

In the present invention, a black pigment can also be used as the pigment. Hereinafter, the black pigment will be described in more detail.

Various known black pigments can be used as a black pigment. In particular, from the viewpoint of achieving a high optical density with a small amount of the pigment, carbon black, titanium black, titanium oxide, iron oxide, manganese oxide, graphite, and the like are preferable. Among these, at least one of the carbon black or the titanium black is preferable, and the titanium black is particularly preferable.

More specifically, organic pigments such as C. I. Pigment Black 1 and inorganic pigments such as C. I. Pigment Black 7, which are commercially available products, can also be used.

The black pigment preferably contains titanium black.

The titanium black is a black particle containing a titanium atom. Preferably, it is lower titanium oxide, titanium oxynitride, or the like. The titanium black particle can modify the surface, if desired, for the purpose of improving the dispersibility, suppressing aggregating properties, and the like. For example, it is possible to coat the titanium black particle with silicon oxide, titanium oxide, germanium oxynitride, aluminum oxide, magnesium oxide, or zirconium oxide, and it is also possible to perform a treatment with a water-repellent material as shown in JP2007-302836A.

The titanium black is typically a titanium black particle, and it is preferable that the primary particle diameter of each particle and the average primary particle diameter are both small.

Specifically, the average primary particle diameter is preferably in the range of 10 nm to 45 nm. Further, the particle diameter in the present invention, that is, the particle diameter refers to the diameter of a circle having an area equal to the projected area of the outer surface of the particle. The projected area of the particle is obtained by measuring the area of the particle taken in an electron micrograph and correcting the imaging magnification.

The specific surface area of the titanium black is not particularly limited, and the value measured by a Brunauer, Emmett, Teller (BET) method is preferably from 5 $m^2/g$ to 150 $m^2/g$, and more preferably from 20 $m^2/g$ to 120 $m^2/g$ so that the water repellency of the titanium black after the surface treatment using a water-repellent agent exhibits a predetermined performance.

Examples of a commercially available product of the titanium black include Titanium Black 10S, 12S, 13R, 13M, 13M-C, 13R, 13R-N, and 13M-T (trade names: manufactured by Mitsubishi Materials Corporation), and Tilack D (trade name: manufactured by Akokasei Co., Ltd.).

Furthermore, it is preferable that the titanium black is contained as a dispersoid including the titanium black and Si atoms.

In this form, the titanium black is contained as a dispersoid in a composition, and the content ratio (Si/Ti) in the Si atoms to the Ti atoms in the dispersoid is preferably 0.05 or more, more preferably 0.05 to 0.5, and still more preferably 0.07 to 0.4 in terms of mass.

Here, the dispersoid includes both the titanium black in a state of primary particles and the titanium black in a state of aggregates (secondary particles).

To change the Si/Ti of the dispersoid (for example, to 0.05 or more), it is possible to use the following means.

First, a dispersion is obtained by dispersing titanium oxide and silica particles with a dispersing machine, and then the dispersion is subjected to a reducing treatment at a high temperature (for example, 850° C. to 1,000° C.). Thus, the dispersoid having the titanium black particles as a main component and containing Si and Ti can be obtained. The reduction treatment can also be carried out in the reductive gas atmosphere such as ammonia.

Examples of the titanium oxide include TITO-51N (trade name: manufactured by Ishihara Sangvo Kaisha, Ltd.).

Examples of the commercially available products of the silica particles include AEROSIL (trademark) 90, 130, 150, 200, 255, 300, and 380 (trade name: manufactured by Evonik).

Dispersion of titanium oxide and silica particles may be carried out using a dispersant. Examples of the dispersant include those described in the section of the dispersant which will be described later.

The dispersion can also be carried out in a solvent. Examples of the solvent include water and organic solvents. Examples of the solvents include those described in the section of the organic solvent which will be described later.

The titanium black with the Si/Ti adjusted to, for example, 0.05 or more can be manufactured by the methods described in, for example, paragraph Nos. [0005], and [0016] to [0021] of JP2008-266045A.

By adjusting the content ratio (Si:Ti) of the Si atoms to the Ti atoms in the dispersoid containing the titanium black and the Si atoms to a suitable range (for example, 0.05 or more), the amount of the residue derived from the composition, remaining on the outside of a region where the light-shielding film is formed is reduced in a case where the light-shielding film is formed by using the composition including the dispersoid. Further, the residue includes a component derived from the titanium black particles or a composition such as a resin component.

The reason why the amount of the residue is reduced has not been clarified yet, but the above-mentioned dispersoid tends to have a small particle diameter (for example, a particle diameter of 30 nm or less), and the adsorptivity to the underlying substrate of the whole film decreases as the component containing the Si atoms increases in the dispersoid. This is assumed to contribute to improvement of the development removability of uncured composition (in particular, the titanium black) in the formation of the light-shielding film. Furthermore, from the viewpoint that the titanium black has excellent light-shielding properties to light in wavelength ranges widely ranging from ultraviolet rays to infrared light, the light-shielding film formed using the dispersoid (preferably with the Si/Ti of 0.05 or more in terms of mass) including the titanium black and Si atoms exerts excellent light-shielding properties.

Incidentally, the content ratio (Si/Ti) of the Si atoms to the Ti atoms in the dispersoid can be measured using, for example, the method (1-1) or the method (1-2) described in paragraph 0033 of JP2013-249417A.

In addition, for the dispersoid contained in the light-shielding film obtained by curing the composition, it is determined whether the content ratio (Si/Ti) of the Si atoms to the Ti atoms in the dispersoid is 0.05 or more, using the method (2) described in paragraph 0035 of JP2013-249417A.

In the dispersoid including the titanium black and the Si atom, the titanium black as described above can be used.

Furthermore, in this dispersoid, one kind or two or more kinds of composite oxides such as Cu, Fe, Mn, V, and Ni, cobalt oxide, iron oxide, a black pigment formed of carbon black, aniline black, or the like may be combined as the dispersoid with the titanium black, for the purpose of adjusting dispersibility, colorability, and the like.

In this case, it is preferable that the dispersoid formed of the titanium black occupies 50% by mass or more of the whole dispersoid.

Incidentally, in the dispersoid, another colorant (such as an organic pigment and a dye) may be used together with the titanium black as desired as long as the colorant does not impair the effects of the present invention, for the purpose of adjusting light-shielding properties or the like.

Hereinafter, the materials used in introducing the Si atoms into the dispersoid will be described. In a case where the Si atoms are introduced into the dispersoid, a Si-containing material such as silica may be used.

Examples of the silica used herein include precipitated silica, fumed silica, colloidal silica, and synthetic silica, and may be selected as appropriate.

Furthermore, since the light-shielding properties are more excellent in a case where the particle diameter of the silica particle is smaller than the thickness of the film in the formation of a light-shielding film, it is preferable to use fine particle-type silica as the silica particle. Further, examples of the fine particle-type silica include the silica described in paragraph 0039 of JP2013-249417A, the contents of which are incorporated herein by reference.

<<<Dye>>>

As the dye, the coloring agents disclosed in, for example, JP1989-90403A (JP-S64-90403A), JP1989-91102A (JP-S64-91102A), JP1989-94301A (JP-H01-94301A), JP1994-11614A (JP-H06-11614A), JP2592207B. U.S. Pat. Nos. 4,808,501A, 5,667,920A, US505950A, JP1993-333207A (JP-H05-333207A), JP1994-35183A (JP-H06-35183A), JP1994-51115A (JP-H06-51115A), and JP1994-194828A (JP-H06-194828A) can be used. In terms of classification based on the chemical structure, it is possible to use a pyrazoleazo compound, a pyrromethene compound, an anilinoazo compound, a triphenylmethane compound, an anthraquinone compound, a benzylidene compound, an oxonol compound, a pyrazolotriazoleazo compound, a pyridoneazo compound, a cyanine compound, a phenothioazine compound, a pyrrolopyrazoleazomethine compound, or the like can be used. In addition, as the dye, a coloring agent multimer may be used. Examples of the coloring agent multimer include the compounds described in JP2011-213925A and JP2013-041097A.

Furthermore, in the present invention, a colorant having a maximum absorption in a wavelength range of 800 to 900 nm can be used as the colorant.

Examples of the colorant having such spectral characteristics include a pyrrolopyrrole compound, a copper compound, a cyanine compound, a phthalocyanine compound, an iminium compound, a thiol complex-based compounds, a transition metal oxide-based compounds, a squarylium compounds, a naphthalocyanine compounds, a quaterylene compound, a dithiol metal complex-based compound, and a croconium compound.

As the phthalocyanine compound, the naphthalocyanine compound, the iminium compound, the cyanine compound, the squarylium compound, and the croconium compound, the compounds disclosed in paragraphs 0010 to 0081 of JP2010-111750A may be used, the contents of which are incorporated herein by reference. With regard to the cyanine compound, reference can be made to, for example, "Functional Coloring Agent, written by Okawara Shin. Matsuoka Ken, Kitao Teijirou, and Hirashima Kousuke, published by Kodansha Scientific Ltd.", the contents of which are incorporated to the present specification.

As the colorant having the spectral characteristics, the compounds disclosed in paragraphs 0004 to 0016 of JP1995-164729A (JP-H07-164729A), the compounds disclosed in paragraphs 0027 to 0062 of JP2002-146254A, and the near-infrared absorption particles disclosed in paragraphs 0034 to 0067 of JP2011-164583A, which are formed of crystallites of oxide including Cu and/or P. and that have a number-average aggregate particle diameter of 5 to 200 nm can also be used.

In the present invention, the colorant having maximum absorption in a wavelength range of 800 to 900 nm is preferably a pyrrolopyrrole compound. The pyrrolopyrrole compound may be a pigment or a dye, but the pigment is preferable for a reason that a coloring composition capable of forming a film having excellent heat resistance is easily obtained.

As the pyrrolopyrrole compound, a compound represented by General Formula (1) is preferable.

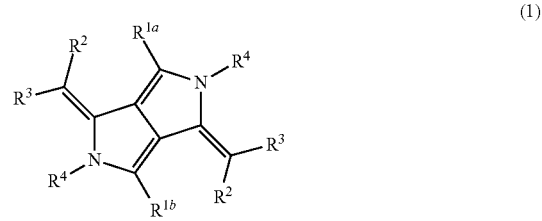

(1)

In General Formula (1), $R^{1a}$ and $R^{1b}$ each independently represent an alkyl group, an aryl group, or a heteroaryl group, $R^2$ and $R^3$ each independently represent a hydrogen atom or a substituent, at least one of $R^2$ or $R^3$ is an electron-withdrawing group, $R^2$ and $R^3$ may be bonded to each other to form a ring, $R^4$ represents a hydrogen atom, an alkyl group, an aryl group, a heteroaryl group, substituted boron, or a metal atom, and $R^4$ may be covalently bonded to or coordinate to one or more selected from $R^{1a}$, $R^{1b}$, and $R^3$.

In General Formula (1), the alkyl group represented by $R^{1a}$ or $R^{1b}$ is preferably an alkyl group having 1 to 30 carbon atoms, more preferably an alkyl group having 1 to 20 carbon atoms, and particularly preferably an alkyl group having 1 to 10 carbon atoms, and examples thereof include methyl, ethyl, iso-propyl, tert-butyl, n-octyl, n-decyl, n-hexadecyl, cyclopropyl, cyclopentyl, and cyclohexyl.

The aryl group represented by $R^{1a}$ or $R^{1b}$ is preferably an aryl group having 6 to 30 carbon atoms, more preferably an aryl group having 6 to 20 carbon atoms, and particularly preferably an aryl group having 6 to 12 carbon atoms, and examples thereof include phenyl, o-methylphenyl, p-methylphenyl, biphenyl, naphthyl, anthranil, and phenanthryl.

The heteroaryl group represented by $R^{1a}$ or $R^{1b}$ is preferably a heteroaryl group having 1 to 30 carbon atoms, and more preferably a heteroaryl group having 1 to 12 carbon atoms. Examples of the heteroatom include a nitrogen atom, an oxygen atom, and a sulfur atom. Specific examples of the heteroaryl group include imidazolyl, pyridyl, quinolyl, furyl, thienyl, benzoxazolyl, benzimidazolyl, benzothiazolyl, naphthothiaazolyl, m-carbazolyl, and azepinyl.

$R^{1a}$ and $R^{1b}$ in General Formula (1) may be the same as or different from each other.

$R^2$ and $R^3$ each independently represent a hydrogen atom or a substituent, and at least one thereof is an electron-withdrawing group. $R^2$ and $R^3$ may be bonded to each other to form a ring. Examples of the substituent include the substituents described in paragraph Nos. 0020 to 0022 of JP2009-263614A, the contents of which are incorporated herein by reference.

The electron-withdrawing group represented by $R^2$ or $R^3$ preferably represents an electron-withdrawing group having a σp value (a sigma para value) of Hammett of 0.2 or more, and examples thereof include a cyano group, an acyl group, an alkyloxycarbonyl group, an aryloxycarbonyl group, a sulfamoyl group, a sulfinyl group, and a heterocyclic group. These electron-withdrawing groups may be further substituted.

The substituent constant σ value of Hammett is described. The Hammett's rule is an empirical rule advocated by L. P. Hammett in 1935 so as to quantitatively discuss the effect of a substituent on the reaction or equilibrium of a benzene derivative and its propriety is widely admitted at present. The substituent constant determined by the Hammett's rule includes a σp value and a σm value, and these values can be found in a large number of general publications. The Hammett's rule is described in detail, for example, in "Lange's Handbook of Chemistry", 12$^{th}$ edition, edited by J. A. Dean, 1979 (Mc Graw-Hill); "Kagakuno Ryoiki" (Chemistry Region), special number, No. 122, pp. 96 to 103, 1979 (Nankodo), and Chem. Rev., 1991. Vol. 91. pp. 165 to 195; and the like.

In the present invention, a substituent having a σp value of Hammett of 0.2 or more can be exemplified as the electron-withdrawing group. The σp value is preferably 0.25 or more, more preferably 0.3 or more, and particularly preferably 0.35 or more. The upper limit is not particularly limited, but is preferably 0.80 or less.

Specific examples thereof include a cyano group (0.66), a carboxyl group (—COOH: 0.45), an alkoxycarbonyl group (—COOMe: 0.45), an aryloxycarbonyl group (—COOPh: 0.44), a carbamoyl group (—CONH$_2$: 0.36), an alkylcarbonyl group (—COMe: 0.50), an arylcarbonyl group (—COPh: 0.43), an alkylsulfonyl group (—SO$_2$Me: 0.72), and an arylsulfonyl group (—SO$_2$Ph: 0.68). In the present specification, Me represents a methyl group and Ph represents a phenyl group. Incidentally, values in parentheses are σp values of typical substituents cited from Chem Rev., 1991, Vol. 91., pp. 165 to 195.

In a case where $R^2$ and $R^3$ are bonded to form a ring, it is preferable to form a 5- to 7-membered ring (preferably a 5- or 6-membered ring). Usually, the ring thus formed is preferably used as an acidic nucleus in merocyanine coloring agent, and for specific examples thereof, reference can be made to paragraph No. 0026 of JP2009-263614A, the contents of which are incorporated herein.

Incidentally, the σp value of the $R^2$ and $R^3$ in a case of forming the ring cannot be defined, but in the present invention, the σp value in a case of forming the ring is defined, regarding that a partial structure of each ring is substituted at $R^2$ and $R^3$. For example, in a case of forming a 1,3-indandione ring, it is considered that a benzoyl group is each substituted at $R^2$ and $R^3$.

The ring formed by the mutual bonding of $R^2$ and $R^3$ is preferably a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus, or an indanone nucleus, and more preferably a 1,3-dicarbonyl nucleus, a 2,4,6-triketohexahydropyrimidine nucleus (including a thioketone form), a 3,5-pyrazolidinedione nucleus, a benzothiophen-3-one nucleus, or an indanone nucleus.

$R^3$ is particularly preferably a heterocycle.

In General Formula (1), two $R^2$'s may be the same as or different from each other, and two $R^3$'s may be the same as or different from each other.

The alkyl group, the aryl group, or the heteroaryl group represented by $R^4$ have the same definitions as the substituents described as $R^{1a}$ and $R^{1b}$, and preferred ranges thereof are also the same. The substituent of the substituted boron represented by $R^4$ has the same definition as the above-mentioned substituent for $R^2$ and $R^3$, and preferably an alkyl group, an aryl group, or a heteroaryl group. Further, the metal atom represented by $R^4$ is preferably transition metal, magnesium, aluminum, calcium, barium, zinc, or tin, more preferably aluminum, zinc, tin, vanadium, iron, cobalt, nickel, copper, palladium, iridium, or platinum, and particularly preferably aluminum, zinc, vanadium, iron, copper, palladium, iridium, or platinum.

$R^4$ may be covalently bonded to or coordinate to one or more selected from $R^{1a}$, $R^{1b}$, and $R^3$.

Two $R^4$'s in General Formula (1) may be the same as or different from each other.

With regard to the details of the compound represented by General Formula (1), reference can be made to the description in paragraph Nos. 0017 to 0047 of JP2009-263614A, the contents of which are incorporated herein by reference. Incidentally, specific examples of the compound represented by General Formula (1) include the compounds described in paragraph Nos. 0049 to 0058 of JP2009-263614A, the contents of which are incorporated herein by reference.

<<Polymerizable Compound>>

The coloring composition of the present invention includes a polymerizable compound having an ethylenically unsaturated bond. The polymerizable compound is preferably a compound containing a group having one or more ethylenically unsaturated bonds, more preferably a compound containing a group having two or more ethylenically unsaturated bonds, and still more preferably a compound containing a group having three or more ethylenically unsaturated bonds. The upper limit is, for example, preferably 15 or less, and more preferably 6 or less. Examples of the group having an ethylenically unsaturated bond include a vinyl group, a (meth)allyl group, and a (meth)acryloyl group.

The polymerizable compound may be any chemical form of, for example, a monomer, a prepolymer (that is, a dimer or a trimer), and an oligomer, or a mixture thereof and a multimer thereof, and the like. The polymerizable compound is preferably a monomer.

The molecular weight of the polymerizable compound is preferably 100 to 3,000, and more preferably 250 to 1,500.

The polymerizable compound is preferably a trifunctional to pentadecafunctional (meth)acrylate compound, and more preferably a trifunctional to hexafunctional (meth)acrylate compound.

Examples of the monomer and the prepolymer, unsaturated carboxylic acids (for example, acrylic acid, methacrylic acid, itaconic acid, crotonic acid, isocrotonic acid, and maleic acid) or esters thereof, amides thereof, and multimers thereof may be included and preferably esters of unsaturated carboxylic acids and aliphatic polyhydric alcohol compounds and amides of unsaturated carboxylic acids and an aliphatic polyvalent amine compounds and multimers thereof are included. Further, addition reaction products of unsaturated carboxylates or amides having nucleophilic substituents such as a hydroxyl group, an amino group, a mercapto group, or the like and monofunctional or polyfunctional isocyanates or epoxies, or dehydration condensation reaction products with monofunctional or polyfunctional carboxylic acids or the like are suitably used. In addition, reaction products of unsaturated carboxylates or amides having electrophilic substituents such as an isocyanate group or an epoxy group and monofunctional or polyfunctional alcohols, amines, or thiols, or reaction products of unsaturated carboxylates or amides having dissociating substituents such as a halogen group or a tosyloxy group and monofunctional or polyfunctional alcohols, amines, or thiols are also suitably used. In addition, as other examples, a compound group substituted with a vinyl benzene derivative such as unsaturated phosphonic acid and styrene, vinyl ether, allyl ether, or the like instead of the unsaturated carboxylic acids can also be used.

As the specific examples of these compounds, the compounds described in paragraph Nos. [0095] to [0108] of JP2009-288705A can also be suitably used in the present invention.

In the present invention, as the polymerizable compound, a compound having a boiling point of 100° C. or higher at normal pressure, which has one or more groups having an ethylenically unsaturated bond, are also preferable. With regard to examples thereof, reference can be made to the compounds described in paragraph 0227 of JP2013-29760A and the compounds described in paragraph Nos. 0254 to 0257 of JP2008-292970A, the contents of which are incorporated herein.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E manufactured by Shin-Nakamura Chemical Co., Ltd.), a structure (for example, SR454 and SR499, commercially available from Sartomer Company, Inc.) in which an ethylene glycol or propylene glycol residue is interposed between these (meth)acryloyl groups is preferable. Oligomer types of these can also be used. In addition, NK ESTER A-TMMT (pentaerythritol tetraacrylate, manufactured by Shin-Nakamura Chemical Co., Ltd.), KAYARAD RP-1040 (manufactured by Nippon Kayaku Co., Ltd.), or the like can also be used.

Preferred aspects of the polymerizable compound will be shown below.

The polymerizable compound may have an acid group such as a carboxyl group, a sulfonic acid group, and a phosphoric acid group. The polymerizable compound having an acid group is preferably an ester of an aliphatic polyhydroxy compound with an unsaturated carboxylic acid, and more preferably a polymerizable compound in which a non-aromatic carboxylic acid anhydride is reacted with an unreacted hydroxyl group of the aliphatic polyhydroxy compound to make an acid group bonded thereto. Particularly preferably in this ester, the aliphatic polyhydroxy compound is pentaerythritol and/or dipentaerythritol. Examples of the commercially available product thereof include ARONIX TO-2349, M-305, M-510, and M-520, manufactured by Toagosei Co., Ltd.

The acid value of the polymerizable compound having an acid group is preferably 0.1 to 40 mgKOH/g, and particularly preferably 5 to 30 mgKOH/g. In a case where the acid value of the polymerizable compound is 0.1 mgKOH/g or more, the development and dissolution characteristics are good, whereas in a case where the acid value is 40 mgKOH/g or less, it is advantageous in production or handling. In addition, the photopolymerization performance is good and the curability is excellent.

It is also a preferred aspect that the polymerizable compound is a compound having a structure derived from a cyclic ester. Examples of the cyclic ester include caprolactone and valerolactone, with caprolactone being particularly preferable.

The compound having a structure derived from caprolactone is not particularly limited as long as it has a structure derived from caprolactone in a molecule thereof, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among these, a compound having a structure derived from caprolactone represented by General Formula (Z-1) is preferable.

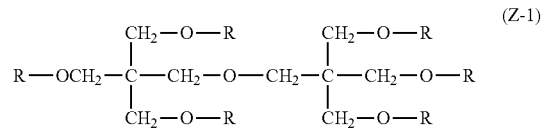

(Z-1)

In General Formula (Z-1), all of six R's are a group represented by General Formula (Z-2). Alternatively, one to five out of six R's are a group represented by General Formula (Z-2), and the remainder is a group represented by General Formula (Z-3).

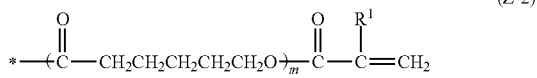

In General Formula (Z-2), $R^1$ represents a hydrogen atom or a methyl group, m represents a number 1 or 2, and "*" represents a binding arm.

In General Formula (Z-3), $R^1$ represents a hydrogen atom or a methyl group, and "*" represents a binding arm.

The polymerizable compound having a structure derived from caprolactone is commercially available from Nippon Kayaku Co., Ltd., as a KAYARAD DPCA series, and examples thereof include DPCA-20 (a compound in which m is 1, the number of R's which are the groups represented by Formula (Z-2) out of six R's is 2, and all of $R^1$'s are hydrogen atoms in Formulae (Z-1) to (Z-3)), DPCA-30 (a compound in which m is 1, the number of R's which are the groups represented by Formula (Z-2) out of six R's is 3, and all of $R^1$'s are hydrogen atoms in Formulae (Z-1) to (Z-3)), DPCA-60 (a compound in which m is 1, the number of R's which are the groups represented by Formula (Z-2) out of six R's is 6, and all of $R^1$'s are hydrogen atoms in Formulae (Z-1) to (Z-3)), and DPCA-120 (a compound in which m is 2, the number of R's which are the groups represented by Formula (Z-2) out of six R's is 6, and all of $R^1$'s are hydrogen atoms in Formulae (Z-1) to (Z-3)).

As the polymerizable compound, a compound represented by General Formula (Z-4) or (Z-5) can also be used.

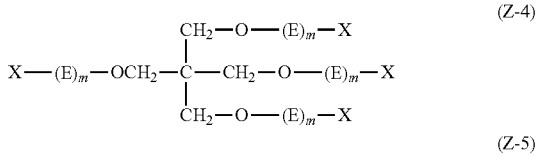

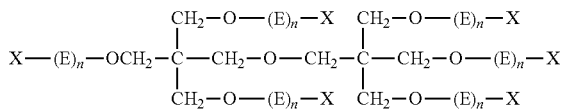

In General Formulae (Z-4) and (Z-5), E's each independently represent —$((CH_2)_y CH_2 O)$— or —$((CH_2)_y CH(CH_3)O)$—, y's each independently represent an integer of 0 to 10, and X's each independently represent a (meth)acryloyl group, a hydrogen atom, or a carboxyl group.

In General Formula (Z-4), the sum of the (meth)acryloyl groups is 3 or 4, m's each independently represent an integer of 0 to 10, and the sum of the respective m's is an integer of 0 to 40.

In General Formula (Z-5), the sum of the (meth)acryloyl groups is 5 or 6, n's each independently represent an integer of 0 to 10, and the sum of the respective n's is an integer of 0 to 60.

In General Formula (Z-4), m is preferably an integer of 0 to 6, and more preferably an integer of 0 to 4.

Furthermore, the sum of the respective m's is preferably an integer of 2 to 40, more preferably an integer of 2 to 16, and particularly preferably an integer of 4 to 8. In General Formula (Z-5), n is preferably an integer of 0 to 6, and more preferably an integer of 0 to 4.

Furthermore, the sum of the respective n's is preferably an integer of 3 to 60, more preferably an integer of 3 to 24, and particularly preferably an integer of 6 to 12. In addition, —$((CH_2)_y CH_2 O)$— or —$((CH_2)_y CH(CH_3)O)$— in General Formula (Z-4) or (Z-5) is preferably in the form in which the terminal at an oxygen atom side binds to X.

The compound represented by General Formula (Z-4) or (Z-5) may be used singly or in combination of two or more kinds thereof. In particular, a form in which all of six X's in General Formula (Z-5) are an acryloyl group, and an aspect of a mixture of a compound in which in General Formula (Z-5), all of six X's are an acryloyl group and a compound in which at least one of six X's is a hydrogen atom is preferable. By adopting such a configuration, developability can be more improved.

Moreover, the total content of the compound represented by General Formula (Z-4) or (Z-5) in the polymerizable compound is preferably 20% by mass or more, and more preferably 50% by mass or more.

The compound represented by General Formula (Z-4) or (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, a person skilled in the art can easily synthesize the compound represented by General Formula (Z-4) or (Z-5).

Among the compounds represented by General Formula (Z-4) or (Z-5), a pentaerythritol derivative and/or a dipentaerythritol derivative is/are more preferable.

Specific examples of the compounds include compounds represented by Formulae (a) to (f) (hereinafter also referred to as "exemplary compounds (a) to (f)"). Among these, the exemplary compounds (a), (b), (e), and (f) are preferable.

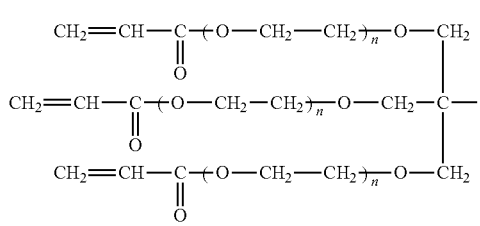
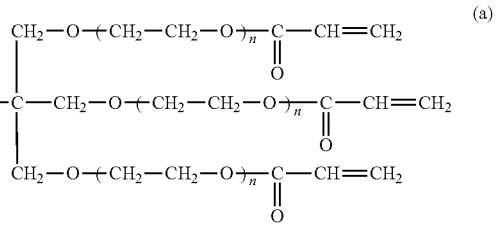

(a)

(the sum of the respective n's is 6)

-continued

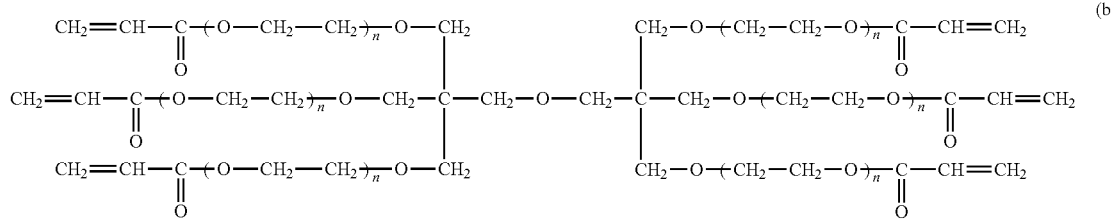

(the sum of the respective n's is 12) (b)

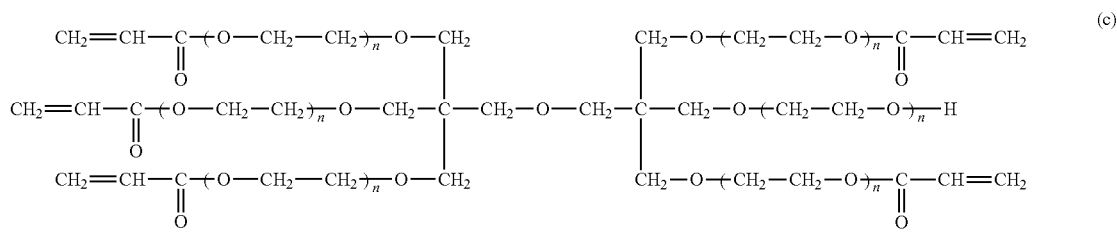

(the sum of the respective n's is 12) (c)

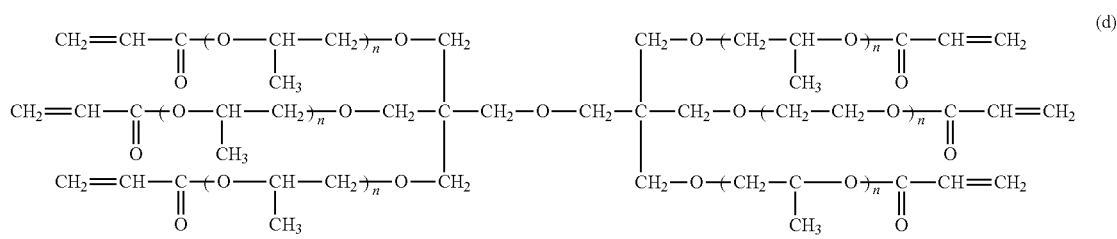

(the sum of the respective n's is 6) (d)

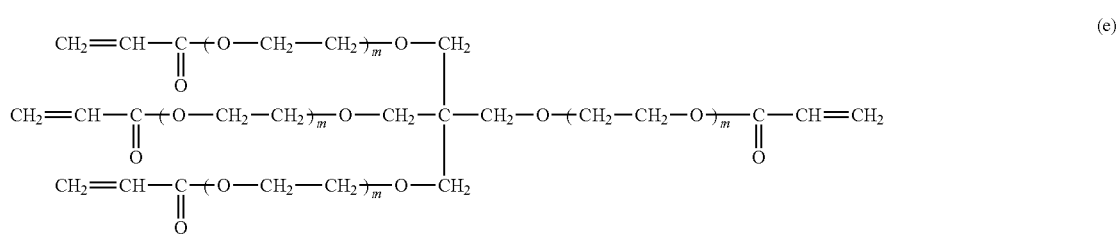

(the sum of the respective m's is 4) (e)

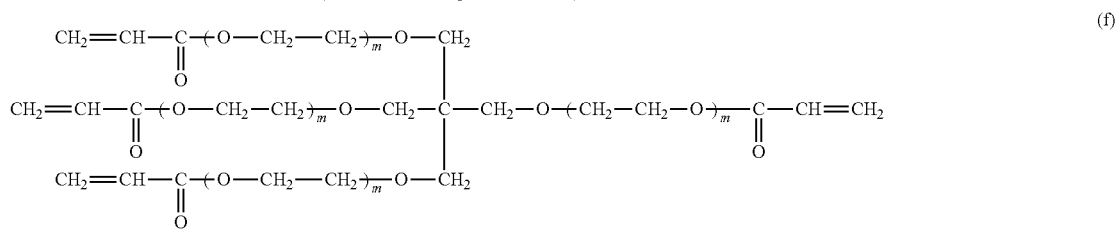

(the sum of the respective m's is 12) (f)

Examples of the commercially available product of the polymerizable compound represented by General Formula (Z-4) or (Z-5) include SR-494 which is a tetrafunctional acrylate having four ethyleneoxy chains, manufactured by Sartomer, and DPCA-60 which is a hexafunctional acrylate having six pentyleneoxy chains, and TPA-330 which is a trifunctional acrylate having three isobutyleneoxy chains, manufactured by Nippon Kayaku Co., Ltd.

As polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also suitable. In addition, by using addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A), as the polymerizable compounds, a coloring composition which is extremely excellent in photosensitization speed can be obtained.

Examples of commercially available products thereof include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-3061, AH-600, T-600, and AI-600 (manufactured by KYOEISHA CHEMICAL CO., LTD.).

The content of the polymerizable compound in the coloring composition of the present invention is preferably 0.1% to 40% by mass with respect to the total solid content of the coloring composition. The lower limit is, for example, more preferably 0.5% by mass or more, and still more preferably 1% by mass or more. The upper limit is, for example, more preferably 30% by mass or less, and still more preferably 20% by mass or less. The polymerizable compound may be used singly or in combination of two or more kinds thereof. In a case where the polymerizable compound is used in combination of two or more kinds thereof, the total amount thereof preferably falls within the range.

<<Polyfunctional Thiol Compound>>

The coloring composition of the present invention may include polyfunctional thiol compounds having two or more mercapto groups in a molecule thereof for the purpose of promoting the reaction of the polymerizable compound. The polyfunctional thiol compounds are preferably secondary alkanethiols, and particularly preferably compounds having structures represented by General Formula (T1).

General Formula (T1)

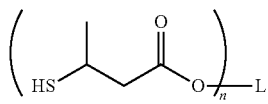

(In Formula (T1), n represents an integer of 2 to 4 and L represents a divalent to tetravalent linking group.)

In General Formula (T1), it is preferable that the linking group L is an aliphatic group having 2 to 12 carbon atoms, and it is particularly preferable that n is 2 and L is an alkylene group having 2 to 12 carbon atoms. Specific examples of the polyfunctional thiol compound are compounds represented by Structural Formulae (T2) to (T4), and a compound represented by Formula (T2) is particularly preferable. These polyfunctional thiols can be used singly or in combination of two or more kinds thereof.

(T2)

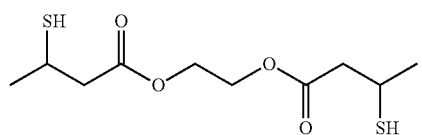

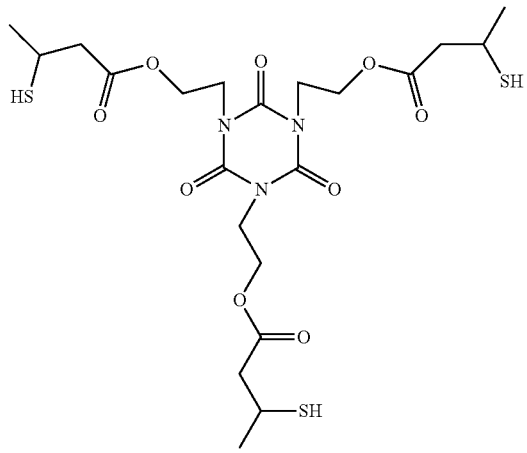

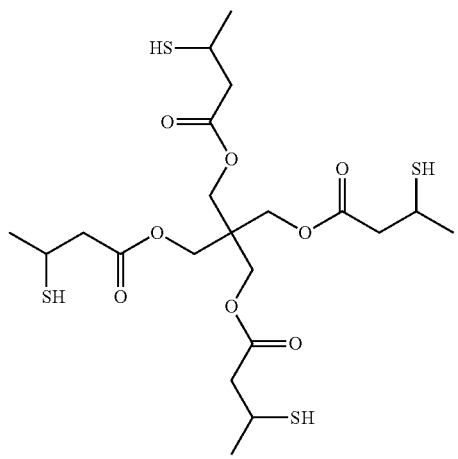

In a case where the coloring composition of the present invention contains the polyfunctional thiol compound, the content of the polyfunctional thiol compound is preferably 0.3% to 8.9% by mass, and more preferably 0.8% to 6.4% by mass, with respect to the total solid content of the coloring composition. In addition, the polyfunctional thiol may be added for the purpose of improving stability, odor, resolution, developability, adhesiveness, and the like.

<<<Compound Having Epoxy Group>>>

It is also preferable that the coloring composition of the present invention contains a compound having an epoxy group.

The compound having an epoxy group is preferably a compound having two or more epoxy groups in one molecule. The number of epoxy groups in one molecule is preferably 2 to 10, more preferably 2 to 5, and particularly preferably 3.

As the compound having an epoxy group, a compound having a structure in which two benzene rings are linked via a hydrocarbon group can also be used. As the hydrocarbon group, an alkylene group having 1 to 6 carbon atoms is preferable.

Furthermore, the epoxy groups are preferably linked via a linking group. Examples of the linking group include groups including at least one selected from an alkylene group, an arylene group, —O—, a structure represented by —NR'— (R' represents a hydrogen atom, an alkyl group which may have a substituent, or an aryl group which may have a substituent, and preferably a hydrogen atom), —SO$_2$—, —CO—, —O—, or —S—.

The epoxy equivalents (=the molecular weight of the compound having an epoxy group/the number of epoxy groups) of the compound having an epoxy group is preferably 500 g/eq or less, more preferably 100 to 400 g/eq, and still more preferably 100 to 300 g/eq.

The compound having an epoxy group may be either a low molecular compound (for example, a molecular weight of less than 2,000, and further a molecular weight of less than 1,000) or a high molecular compound (macromolecule) (for example, a molecular weight of 1.000 or more, and in the case of a polymer, a weight-average molecular weight of 1,000 or more). The weight-average molecular weight of the compound having an epoxy group is preferably 200 to 100,000, and more preferably 500 to 50,000.

As the compound having an epoxy group, the compounds described in paragraph Nos. 0034 to 0036 of JP2013-011869A, paragraph Nos. 0147 to 0156 of JP2014-043556A. or paragraph Nos. 0085 to 0092 of JP2014-089408A, the contents of the publications are incorporated herein by reference, can also be used.

Examples of the commercially available products thereof include "EHPE3150 (manufactured by Daicel Corporation) ", and "EPICLON N660 (manufactured by DIC Corporation)".

In a case where the coloring composition of the present invention contains a compound having an epoxy group. The content of the compound having an epoxy group is preferably 0.1% to 40% by mass with respect to the total solid content of the coloring composition. The lower limit is more preferably, for example, 0.5% by mass or more, and still more preferably 1% by mass or more. The upper limit is more preferably, for example, 30% by mass or less, and still more preferably 20% by mass or less. The compound having an epoxy group may be used singly or in combination of two or more kinds thereof. In a case of using the compound in combination of two or more kinds thereof, the total amount thereof preferably falls within the range.

<<Curable Compound Having Specific Group>>

It is also preferable that the coloring composition of the present invention contains a curable compound (hereinafter also referred to as a curable compound A) having at least one selected from the group consisting of a fluorine atom, a silicon atom, a linear alkyl group having 8 or more carbon atoms, and a branched alkyl group having 3 or more carbon atoms, and a curable functional group.

The curable compound A is preferably a curable compound having a fluorine atom and a curable functional group. According to this aspect, a cured film having small reflectivity is easily formed.

In addition, in the present invention, the curable compound A is a compound which is different from the above-mentioned polymerizable compound and compound having an epoxy group, and the resin which will be described later. In the present invention, a compound having a fluorine atom and an ethylenically unsaturated bond is intended to be included in the curable compound A. Further, a compound having a fluorine atom and an epoxy group is intended to be included in the curable compound A.

The curable compound A may be a monomer or a polymer. In a case where the curable compound A is a polymer, it is preferably a (meth)acrylate polymer, and more preferably a (meth)acrylate polymer having a fluorine atom.

As one of suitable aspects of the curable compound A, a compound which does not have a benzene ring structure may be mentioned, and a compound which has a fluorine atom and does not have a benzene ring structure is preferable.

In addition, the silane coupling agent which will be described later is not included in the curable compound A.

In a case where the curable compound A includes a fluorine atom, it is preferable that the curable compound has at least one selected from the group consisting of an alkylene group substituted with a fluorine atom, an alkyl group substituted with a fluorine atom, and an aryl group substituted with a fluorine atom.

The alkylene group substituted with a fluorine atom is preferably a linear, branched, or cyclic alkylene group in which at least one hydrogen atom is substituted with a fluorine atom.

The alkyl group substituted with a fluorine atom is preferably a linear, branched, or cyclic alkyl group in which at least one hydrogen atom is substituted with a fluorine atom.

The alkylene group substituted with a fluorine atom and an alkyl group substituted with a fluorine atom preferably has 1 to 20 carbon atoms, more preferably has 1 to 10 carbon atoms, and still more preferably has 1 to 5 carbon atoms.

With regard to the aryl group substituted with a fluorine atom, it is preferable that the aryl group is directly substituted with a fluorine atom or substituted with a trifluoromethyl group.

The alkylene group substituted with a fluorine atom, an alkyl group substituted with a fluorine atom, and an aryl group substituted with a fluorine atom may further have another substituent, in addition to the fluorine atom.

With regard to the alkyl group substituted with a fluorine atom and the aryl group substituted with a fluorine atom, reference can be made to paragraphs 0266 to 0272 of JP2011-100089A, the contents of which are incorporated herein by reference.

It is preferable that the curable compound A contains a group X (group (repeating unit) represented by Formula (X)) in which "an alkylene group substituted with a fluorine atom" is linked to "an oxygen atom", and it is more preferable that the curable compound A contains a perfluoroalkylene ether group.

 Formula (X)

$L_A$ represents an alkylene group substituted with a fluorine atom. Further, the number of carbon atoms in the alkylene group is preferably 1 to 20, more preferably 1 to 10, and still more preferably 1 to 5. Further, an oxygen atom may also be contained in the alkylene group substituted with a fluorine atom.

Furthermore, the alkylene group substituted with a fluorine atom may be linear or branched.

The perfluoroalkylene ether group is intended to mean that $L_A$ is a perfluoroalkylene group. The perfluoroalkylene group is intended to mean the group in which all the hydrogen atoms in the alkylene group are substituted with a fluorine atom.

The groups (repeating units) represented by Formula (X) may be linked in repetition, and the number of the repeating units is not particularly limited, but is preferably 1 to 50, and more preferably 1 to 20, from the viewpoint that the effects of the present invention are more excellent.

That is, the group is preferably a group represented by Formula (X-1).

 Formula (X-1)

In Formula (X-1), $L_A$ is as described above, r represents the number of the repeating units, and a suitable range thereof is as described above.

Furthermore, $L_A$'S in a plurality of -($L_A$-O)—'s may be the same as or different from each other.

In a case where the curable compound A contains a silicon atom, the curable compound is preferably an alkylsilyl group, an arylsilyl group, or the following partial structure (S) (* represents a binding site to another atom).

Partial Structure (S)

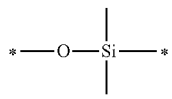

The total number of carbon atoms of the alkyl chain included in the alkylsilyl group is preferably 1 to 20, more preferably 1 to 10, and still more preferably 1 to 6. For example, an alkylsilyl group and a trialkylsilyl group are preferable.

Examples of the aryl group in the arylsilyl group include a phenyl group.

In a case where the curable compound includes the partial structure (S), it may form a cyclic structure including the partial structure (S). As the partial structure (S) which is preferably adopted in the present invention, —Si(R)$_2$—O—Si(R)$_2$— (R is an alkyl group having 1 to 3 carbon atoms), and an alkoxysilyl group are preferable. With regard to the structure including the partial structure (S), reference can be made to, for example, paragraphs 0277 to 0279 of JP2011-100089A, the contents of which are incorporated herein by reference.

In a case where the curable compound A contains a linear alkyl group having 8 or more carbon atoms, the number of carbon atoms of the linear alkyl group is preferably 8 to 30, and more preferably 12 to 20.

In a case where the curable compound A contains a branched alkyl group having 3 or more carbon atoms, the number of carbon atoms of the branched alkyl group is preferably 3 to 20 and more preferably 5 to 15. The branched alkyl group having 3 or more carbon atoms preferably has —CH(CH$_3$)$_2$ or —C(CH$_3$)$_3$ at the terminal.

The curable compound A may have one or more of at least one selected from the group consisting of a fluorine atom, a silicon atom, a linear alkyl group having 8 or more carbon atoms, and a branched alkyl group having 3 or more carbon atoms, or may have two or more atoms or groups. Further, the curable compound A may also have a combination of at least one of selected from the group consisting of a fluorine atom, a silicon atom, a linear alkyl group having 8 or more carbon atoms, and a branched alkyl group having 3 or more carbon atoms.

The curable compound A may have one or more curable functional groups, and may also have two or more curable functional groups. The curable functional groups may be used singly or in combination of two or more kinds thereof. The curable functional group may be a thermosetting functional group or a photocurable functional group.

The curable functional group is preferably at least one selected from the group consisting of a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)acrylamido group, a styryl group, and a maleimido group, and more preferably at least one selected from the group consisting of a (meth)acryloyloxy group, an epoxy group, and an oxetanyl group.

In addition, in a case where an ethylenically unsaturated group is contained as the curable functional group, the amount of the ethylenically unsaturated group in the curable compound A is preferably 0.1 to 10.0 mol/g, and more preferably 1.0 to 5.0 mol/g.

In a case where the curable compound A is a monomer, the number of at least one group selected from the group consisting of a fluorine atom, a silicon atom, a linear alkyl group having 8 or more carbon atoms, and a branched alkyl group having 3 or more carbon atoms in one molecule is preferably 1 to 20, and more preferably 3 to 15.

In addition, the number of the curable functional groups in one molecule is not particularly limited, but is preferably 2 or more, and more preferably 4 or more, from the viewpoint that the effects of the present invention are more excellent. The upper limit thereof is not particularly limited, but is 10 or less in many cases, and 6 or less in more cases.

In a case where the curable compound A is a polymer, it is preferable that the polymer has at least one of a repeating unit represented by Formula (B1), a repeating unit represented by Formula (B2), or a repeating unit represented by Formula (B3).

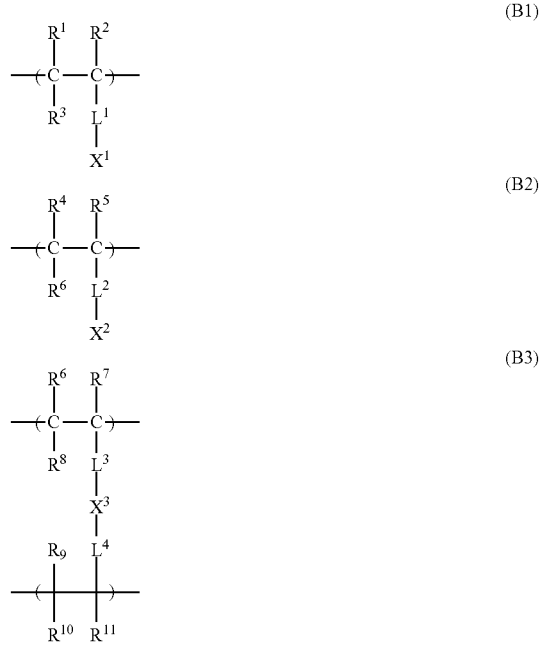

In Formulae (B1) to (B3), $R^1$ to $R^{11}$ each independently represent a hydrogen atom, an alkyl group, or a halogen atom. $L^1$ to $L^4$ each independently represent a single bond or a divalent linking group. $X^1$ represents a (meth)acryloyloxy group, an epoxy group, or an oxetanyl group. $X^2$ represents an alkyl group substituted with a fluorine atom, an aryl group substituted with a fluorine atom, an alkylsilyl group, an arylsilyl group, a group including the partial structure (S), a linear alkyl group having 8 or more carbon atoms, or a branched alkyl group having 3 or more carbon atoms, and $X^3$ represents the repeating unit represented by Formula (X-1).

In Formulae (B1) to (B3), $R^1$ to $R^{11}$ are each independently preferably a hydrogen atom or an alkyl group. In a case where $R^1$ to $R^{11}$ each represent an alkyl group, an alkyl group having 1 to 3 carbon atoms is preferable. In a case where $R^1$ to $R^{11}$ each represent a halogen atom, a fluorine atom is preferable.

In Formulae (B1) to (B3), in a case where $L^1$ to $L^4$ each represent a divalent linking group, examples of the divalent linking group include an alkylene group which may be substituted with a halogen atom, an arylene group which may be substituted with a halogen atom, —$NR^{12}$—, —$CONR^{12}$—, —CO—, —$CO_2$—, $SO_2NR^{12}$—, —O—, —S—, —$SO_2$—, and a group formed by a combination thereof. Among those, at least one selected from the group consisting of an alkylene group having 2 to 10 carbon atoms, which may be substituted with a halogen atom, and an arylene group having 6 to 12 carbon atoms, which may be substituted with a halogen atom or a combination of these groups with at least one group selected from the group consisting of —$NR^{12}$—, —$CONR^{12}$—, —CO—, —$CO_2$—, $SO_2NR^{12}$—, —O—, —S—, and $SO_2$— is preferable, and an alkylene group having 2 to 10 carbon atoms, which may be substituted with a halogen atom, —$CO_2$—, —O—, —CO—, —$CONR^{12}$—, or a group formed by a combination of these groups is more preferable. Here, $R^{12}$ represents a hydrogen atom or a methyl group.

Specific examples of the repeating unit represented by Formula (B1) include the following repeating units, but the present invention is not limited thereto.

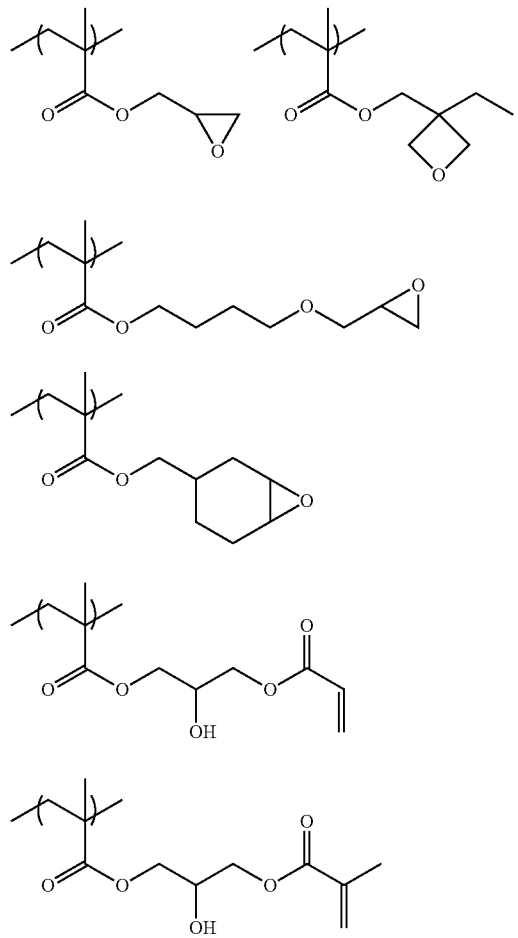

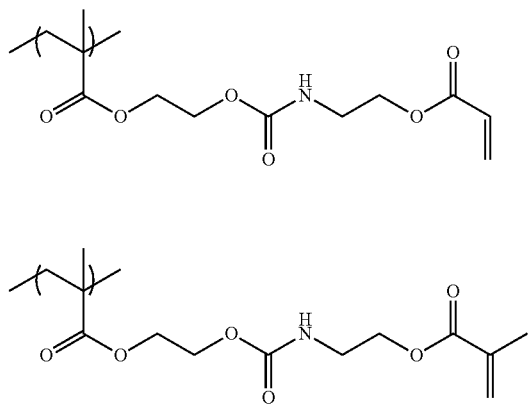

Furthermore, specific examples of the repeating unit represented by Formula (B2) include the following repeating units, but the present invention is not limited thereto. In the specific examples, $X^1$ represents a hydrogen atom, —$CH_3$, —F, or —$CF_3$, and is preferably a hydrogen atom or a methyl group. Me represents a methyl group.

Other examples of the repeating unit include the repeating units described in paragraph No. 0073 of JP2015-017244A, the contents of which are incorporated herein by reference.

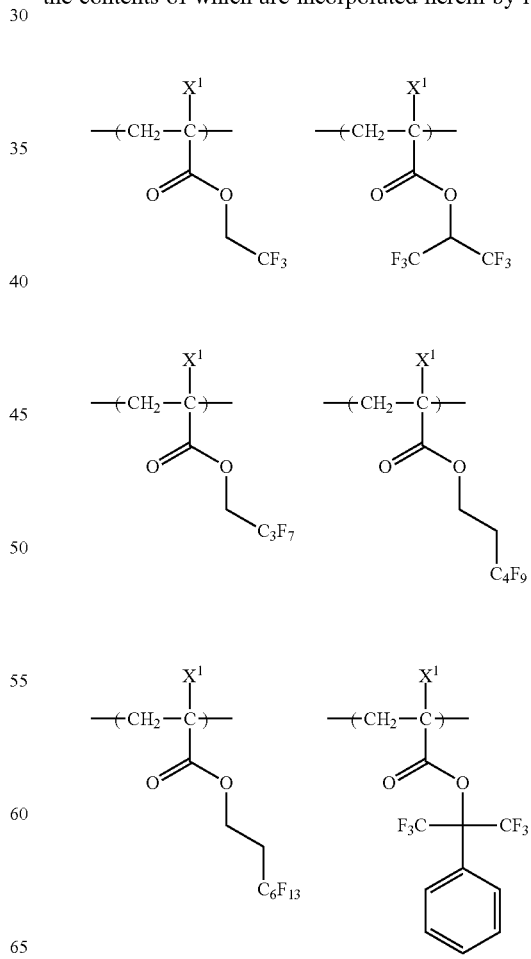

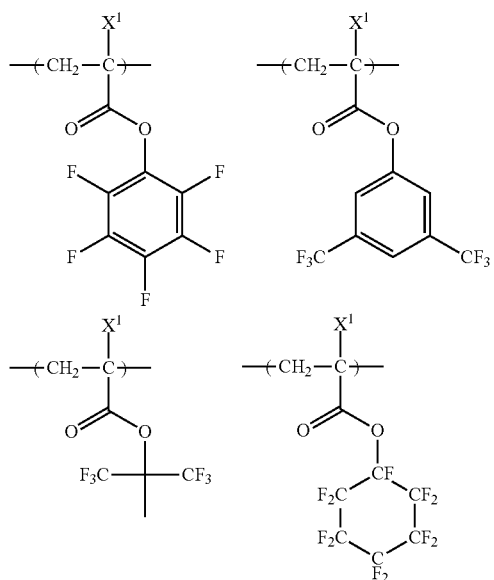
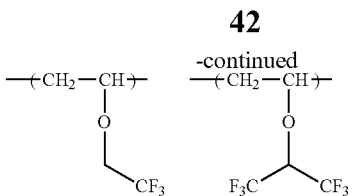
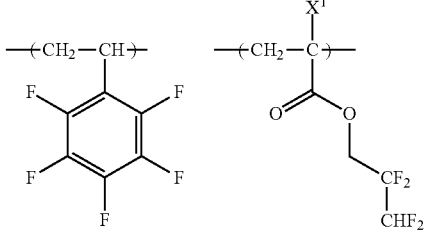
Furthermore, specific examples of the repeating unit represented by Formula (B3) include the following repeating units, but the present invention is not limited thereto.
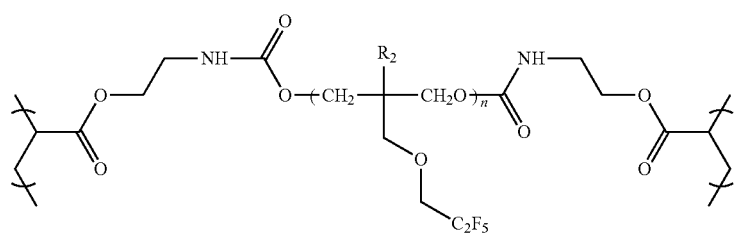
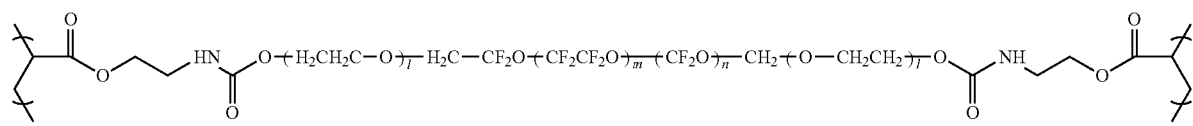
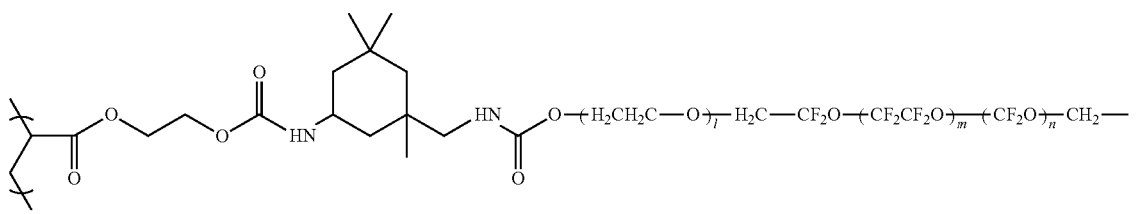
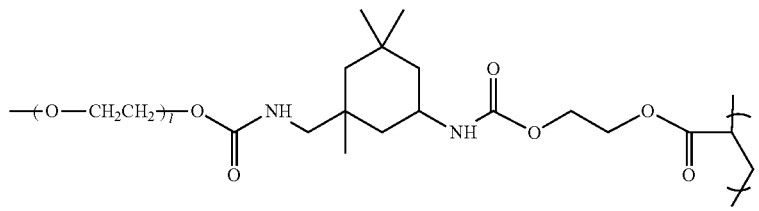

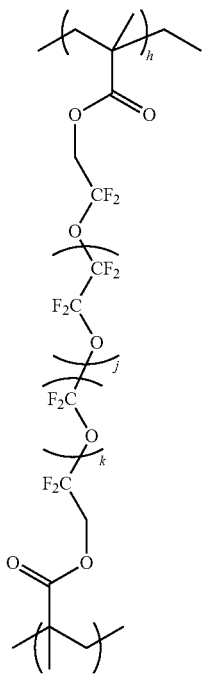

The content of the repeating unit represented by Formula (B1) is preferably 30% to 95% by mole, and more preferably 45% to 90% by mole, with respect to all the repeating units in the curable compound A. That is, the content of the repeating unit represented by Formula (B1) is preferably 30% by mole or more, and more preferably 45% by mole or more, with respect to all the repeating units in the curable compound A.

The total content of the repeating unit represented by Formula (B2) and the repeating unit represented by Formula (B3) is preferably 5% to 70% by mole, and more preferably 10% to 60% by mole, with respect to all the repeating units in the curable compound A. That is, the total content of the repeating unit represented by Formula (B2) and the repeating unit represented by Formula (B3) is preferably 5% by mole or more, and more preferably 10% by mole or more, with respect to all the repeating units in the curable compound A.

In addition, in a case where the repeating unit represented by Formula (B2) is not included and the repeating unit represented by Formula (B3) is included, the content of the repeating unit represented by Formula (B2) is 0% by mole, and the content of the repeating unit represented by Formula (B3) preferably falls within the range.

Moreover, the curable compound A may have repeating units other than the repeating units represented by Formulae (B1) to (B3). The content of the other repeating units is preferably 10% by mole or less, and more preferably 1% by mole or less, with respect to all the repeating units in the curable compound A.

In a case where the curable compound A is a polymer, the weight-average molecular weight (Mw: polystyrene-equivalent) thereof is preferably 5,000 to 100.000, and more preferably 7,000 to 50,000. In a case where the curable compound A is a polymer, the weight-average molecular weight thereof is preferably 5.000 or more, and more preferably 7.000 or more.

In addition, in a case where the curable compound A is a polymer, the dispersity (weight-average molecular weight/number-average molecular weight) thereof is preferably 1.80 to 3.00, and more preferably 2.00 to 2.90.

As the commercially available products of the curable compound A, MEGAFACE RS-72-K, MEGAFACE RS-75, MEGAFACE RS-76-E, MEGAFACE RS-76-NS, and MEGAFACE RS-77, all manufactured by DIC Corporation, as the curable compound having a fluorine atom; BYK-UV 3500, BYK-UV 3530, and BYK-UV 3570, all manufactured by BYK; and TEGO Rad 2010, TEGO Rad 2011, TEGO Rad 2100, TEGO Rad 2200N, TEGO Rad 2250, TEGO Rad 2300, TEGO Rad 2500, TEGO Rad 2600, TEGO Rad 2650, and TEGO Rad 2700, all manufactured by Evonik Industries AG, as the curable compound having a silicon atom; or the like can be used.

The curable compound A is preferably a curable compound which is capable of forming a film with a refractive index of 1.1 to 1.5 at a wavelength of 550 nm with the curable compound alone. That is, the refractive index at a wavelength of 550 nm of a film formed of the curable compound A alone is preferably 1.1 to 1.5.

A suitable range of the refractive index is preferably 1.2 to 1.5, and more preferably 1.3 to 1.5, from the viewpoint of low reflectivity of the light-shielding film.

The content of the curable compound A is preferably 0.1% to 20% by mass, more preferably 0.5% to 15% by mass, and still more preferably 1.0% to 10% by mass, with respect to the total solid content in the coloring composition.

The coloring composition may include one kind or two or more kinds of the curable compound A. In a case where the coloring composition includes two or more kinds of the curable compound A, the total amount thereof preferably falls within the range.

<<Resin>>

The coloring composition of the present invention preferably includes a resin. The resin is blended in applications, such as an application for dispersing a colorant in the composition or an application as a binder. Incidentally, a resin which is usually used for dispersing a colorant is also referred to as a dispersant. However, such uses of the resin are only exemplary, and the resin can also be used for other purposes, in addition to the above uses.

The weight-average molecular weight (Mw) of the resin is preferably 2,000 to 2,000,000. The upper limit is preferably 1,000,000 or less, and more preferably 500,000 or less, and the lower limit is preferably 3,000 or more, and more preferably 5.000 or more.

The content of the resin in the coloring composition of the present invention is preferably 10% to 80% by mass, and more preferably 20% to 60% by mass, with respect to the total solid content of the coloring composition. The composition of the present invention may include one kind or two or more kinds of the resin. In a case where two or more kinds of the resin are included, the total amount thereof preferably falls within the range.

<<<Alkali-Soluble Resin>>>

The coloring composition of the present invention contains an alkali-soluble resin as the resin. By incorporation of the alkali-soluble resin, the developability and the pattern formability are improved. In addition, the alkali-soluble resin can also be used as a dispersant or a binder.

The molecular weight of the alkali-soluble resin is not particularly determined, but the weight-average molecular weight (Mw) is preferably 5,000 to 100,000. Further, the number-average molecular weight (Mn) is preferably 1,000 to 20,000.

The alkali-soluble resin may be a linear organic high molecular polymer, and can be appropriately selected from alkali-soluble resins having at least one group enhancing alkali-solubility in a molecule (preferably a molecule having an acrylic copolymer or a styrene-based copolymer as a main chain).

As the alkali-soluble resin, from the viewpoint of heat resistance, a polyhydroxystyrene-based resin, a polysiloxane-based resin, an acrylic resin, an acrylamide-based resin, and an acryl/acrylamide copolymer resin are preferable, and further, from the viewpoint of controlling developability, an acrylic resin, an acrylamide-based resin, and an acryl/acrylamide copolymer resin are preferable.

Examples of the group enhancing alkali-solubility (hereinafter also referred to as an "acid group") include a carboxyl group, a phosphoric acid group, a sulfonic acid group, and a phenolic hydroxyl group. The group enhancing alkali-solubility is preferably a group which is soluble in an organic solvent and can be developed by an aqueous weak alkaline solution, and particularly preferred examples thereof include (meth)acrylic acid. These acid groups may be used singly or in combination of two or more kinds thereof.

For the production of the alkali-soluble resin, for example, a method using known radical polymerization can be applied. The polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer disclosed in JP1998-300922A (JP-H10-300922A) include N-phenylmaleimide and N-cyclohexylmaleimide. Other monomers copolymerizable with a (meth)acrylic acid may be used singly or in combination of two or more kinds thereof.

Moreover, in order to improve the crosslinking efficiency of the coloring composition in the present invention, an alkali-soluble resin having a polymerizable group may be used. Examples of the polymerizable group include a (meth)allyl group and a (meth)acryloyl group. As the alkali-soluble resin having a polymerizable group, an alkali-soluble resin containing a polymerizable group on a side chain thereof, and the like are useful.

Examples of the alkali-soluble resin containing a polymerizable group include DIANAL NR Series (manufactured by Mitsubishi Rayon Co., Ltd.), Photomer 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), EBECRYL 3800 (manufactured by Daicel-UCB Co., Ltd.), and ACRYCURE RD-F8 (manufactured by Nippon Shokubai Co., Ltd.).

As the alkali-soluble resin, a benzyl (meth)acrylate/(meth)acrylic acid copolymer, benzyl (meth)acrylate/(meth)acrylic acid-2-hydroxyethyl (meth)acrylate copolymer, or a multicomponent copolymer including benzyl (meth)acrylate/(meth)acrylic acid/other monomers can be preferably used. As the alkali-soluble resin, those obtained by copolymerizing 2-hydroxyethyl methacrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl (meth)acrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can be preferably used.

Furthermore, as the commercially available product, for example, FF-426 (manufactured by Fujikura Kasei Co., Ltd.) or the like can also be used.

It is also preferable that the alkali-soluble resin includes a polymer (a) obtained by polymerizing monomer components including a compound represented by General Formula (ED1) and/or a compound represented by General Formula (ED2) (these compounds are hereinafter also referred to as an "ether dimer" in some cases).

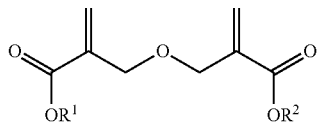
(ED1)

In General Formula (ED1), $R^1$ and $R^2$ each independently represent a hydrogen atom or a hydrocarbon group having 1 to 25 carbon atoms, which may have a substituent.

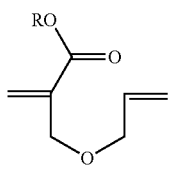
(ED2)

In General Formula (ED2), R represents a hydrogen atom or an organic group having 1 to 30 carbon atoms. With regard to the specific examples of General Formula (ED2), reference can be made to the descriptions in JP2010-168539A.

In General Formula (ED1), the hydrocarbon group having 1 to 25 carbon atoms, represented by $R^1$ and $R^2$, which may have a substituent, is not particularly limited, and examples thereof include linear or branched alkyl groups such as methyl, ethyl, n-propyl, isopropyl, n-butyl, isobutyl, tert-butyl, tert-amyl, stearyl, lauryl, and 2-ethylhexyl; aryl groups such as phenyl; alicyclic groups such as cyclohexyl, tert-butylcyclohexyl, dicyclopentadienyl, tricyclodecanyl, isobornyl, adamantyl, and 2-methyl-2-adamantyl; alkyl groups substituted with alkoxy, such as 1-methoxyethyl and 1-ethoxyethyl; and alkyl groups substituted with an aryl group, such as benzyl. Among these, from the viewpoint of heat resistance, substituents of primary or secondary carbon, which are not easily eliminated by an acid or heat, such as methyl, ethyl, cyclohexyl, and benzyl, are particularly preferable.

Specific examples of the ether dimer include those described in paragraph 0317 of JP2013-29760A, the contents of which are incorporated herein. These ether dimers may be used singly or in combination of two or more kinds thereof. The structure derived from the compound represented by General Formula (ED) may be copolymerized with other monomers.

The alkali-soluble resin may include a structural unit derived from a compound represented by Formula (X).

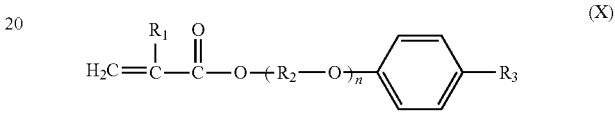
(X)

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may contain a benzene ring, and n represents an integer of 1 to 15.

In Formula (X), the number of carbon atoms of the alkylene group of $R_2$ is preferably 2 or 3. Further, the number of carbon atoms of the alkyl group of $R_3$ is 1 to 20, and more preferably 1 to 10, and the alkyl group of $R_3$ may contain a benzene ring. Examples of the alkyl group containing a benzene ring, represented by $R_3$, include a benzyl group and a 2-phenyl(iso)propyl group.

Specific examples of the alkali-soluble resin included the following resins.

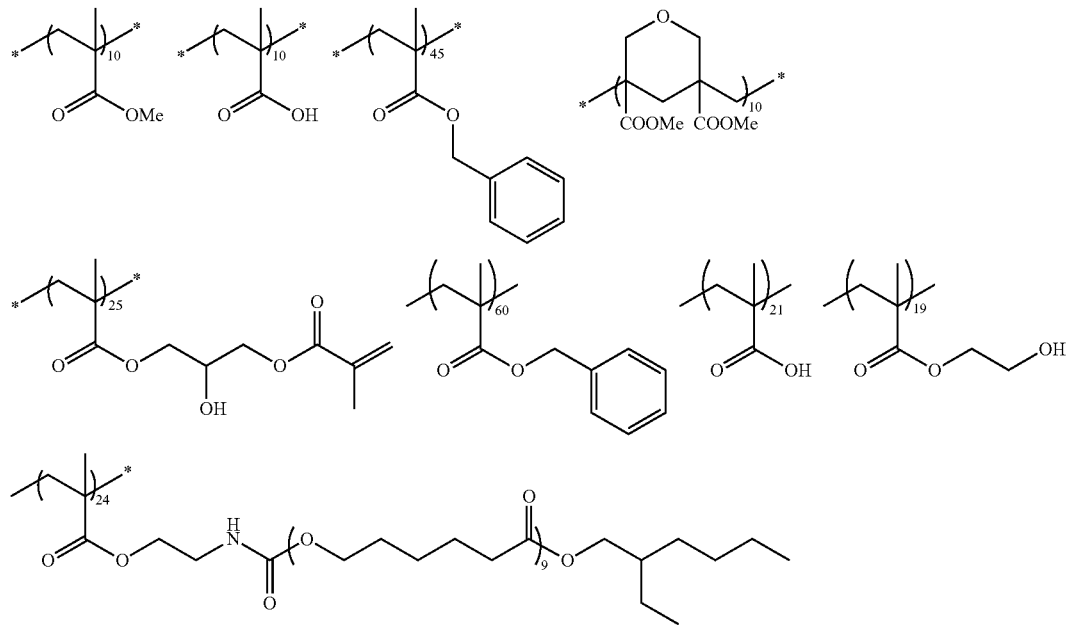

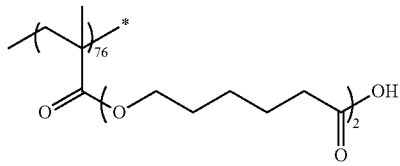

With regard to the alkali-soluble resin, reference can be made to the descriptions in paragraphs 0558 to 0571 of JP2012-208494A (0685 to 0700 of the corresponding US2012/0235099A), the contents of which are incorporated herein.

Moreover, it is possible to use the copolymers (B) described in paragraph Nos. 0029 to 01683 of JP2012-32767A and the alkali-soluble resins used in Examples of the document; the binder resins described in paragraph Nos. 0088 to 0098 of JP2012-208474A and the binder resins used in Examples of the document; the binder resins described in paragraph Nos. 0022 to 0032 of JP2012-1375367A and the binder resins in Examples of the document; the binder resins described in paragraph Nos. 0132 to 0143 of JP2013-024934A and the binder resins used in Examples of the document; the binder resins described in paragraph Nos. 0092 to 0098 of JP2011-242752A and used in Examples; or the binder resins described in paragraph Nos. 0030 to 0072 of JP2012-032770A, the contents of which are incorporated herein.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and most preferably 120 mgKOH/g or less.

The content of the alkali-soluble resin is preferably 0.1% to 20% by mass with respect to the total solid content of the coloring composition. The lower limit is preferably 0.5% by mass or more, more preferably 1% by mass or more, still more preferably 2% by mass or more, and still more preferably 3% by mass or more. The upper limit is more preferably 12% by mass or less, and particularly preferably 10% by mass or less. The coloring composition of the present invention may include one kind or two or more kinds of the alkali-soluble resin. In a case where two or more kinds of the alkali-soluble resin are included, a total amount thereof preferably falls within the range.

<<<Dispersant>>>

The coloring composition of the present invention can contain a dispersant as a resin.

The dispersant preferably includes at least one selected from an acidic resin, a basic resin, and an amphoteric resin.

In the present invention, the acidic resin means a resin having an acid group, which has an acid value of 5 mgKOH/g or more and an amine value of less than 5 mgKOH/g. It is preferable that the acidic resin does not have a basic group.

Examples of the acid group having an acidic resin include a carboxyl group, a phosphoric acid group, a sulfonic acid group, and a phenolic hydroxyl group, with the carboxyl group being preferable.

As the acidic resin, any one of a block copolymer, a random copolymer, and a graft copolymer can also be used.

The acid value of the acidic resin is preferably 5 to 200 mgKOH/g, more preferably 10 to 150 mgKOH/g, and still more preferably 50 to 150 mgKOH/g.

In the present invention, the basic resin means a resin having a basic group, which has an amine value of 5 mgKOH/g or more and an acid value of less than 5 mgKOH/g. It is preferable that the basic resin does not have an acid group.

The basic group having a basic resin is preferably an amino group. As the basic resin, any one of a block copolymer, a random copolymer, and a graft copolymer can also be used.

The amine value of the basic resin is preferably 5 to 200 mgKOH/g, more preferably 5 to 150 mgKOH/g, and still more preferably 5 to 100 mgKOH/g.

In the present invention, the amphoteric resin means a resin having an acid group and a basic group, which has an acid value of 5 mgKOH/g or more and an amine value of 5 mgKOH/g or more. Examples of the acid group include the groups described above, with the carboxyl group being preferable. As the basic group, an amino group is preferable. As the amphoteric resin, any one of a block copolymer, a random copolymer, and a graft copolymer can also be used.

It is preferable that the amphoteric resin has an acid value of 5 mgKOH/g or more and an amine value of 5 mgKOH/g or more. The acid value is preferably 5 to 200 mgKOH/g, more preferably 10 to 200 mgKOH/g, still more preferably 30 to 200 mgKOH/g, and particularly preferably 30 to 180 mgKOH/g. The amine value is preferably 5 to 200 mgKOH/g, more preferably 10 to 150 mgKOH/g, and particularly preferably 10 to 130 mgKOH/g.

The ratio of the acid value to the amine value of the amphoteric resin is as follows: the acid value:amine value is preferably 1:3 to 3:1, and more preferably 1:2 to 2:1. In a case where the ratio of the acid value to the amine value falls within the range, both of the dispersibility of the colorant and the developability can be accomplished more effectively.

In a case of using the acidic resin, the basic resin, and the amphoteric resin in combination, it is preferable that the content of the basic resin is 10 to 150 parts by mass and the content of the amphoteric resin is 30 to 170 parts by mass, with respect to 100 parts by mass of the acidic resin. The content of the basic resin is more preferably 30 to 130 parts by mass, and still more preferably 50 to 110 parts by mass. The content of the amphoteric resin is more preferably 50 to 150 parts by mass, and still more preferably 90 to 150 parts by mass. According to this aspect, the above-mentioned effect is obtained more effectively. Further, the acidic resin is contained in the amount of preferably 1% to 30% by mass, and more preferably 1% to 20% by mass, with respect to the total solid content of the coloring composition. Further, the basic resin is contained in the amount of preferably 1% to 30% by mass, and more preferably 1% to 20% by mass, with respect to the total solid content of the coloring composition. In addition, the amphoteric resin is contained in the amount of preferably 1% to 30% by mass, and more preferably 1% to 20% by mass, with respect to the total solid content of the coloring composition.

The resin is also available as a commercially available product, and specific examples thereof include "DA-7301" manufactured by Kusumoto Chemicals, Ltd., "DISPER-BYK-101 (polyamidamine phosphate), 107 (carboxylic acid ester), 110 (copolymer including an acid group), 111 (phosphoric acid-based dispersant), 130 (polyamide), 161, 162, 163, 164, 165, 166, 170, and 190 (high molecular copolymers)", and "BYK-P104 and P105 (high molecular unsaturated polycarboxylic acid)" manufactured by BYK-Chemie, "EFKA 4047, 4050 to 4010 to 4165 (polyurethane-based), EFKA 4330 to 4340 (block copolymer), 4400 to 4402 (modified polyacrylate), 5010 (polyesteramide), 5765 (high molecular polycarboxylate), 6220 (aliphatic polyester), 6745 (phthalocyanine derivative), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E. No. 300 (acrylic copolymer)" manufactured by KYOEISHA CHEMICAL Co., LTD., "DISPARLON KS-860, 873SN, 874, and #2150 (aliphatic polyvalent carboxylic acid), #7004 (polyether ester), DA-703-50, DA-705, and DA-725" manufactured by Kusumoto Chemicals, Ltd., "DEMOL RN and N (naphthalene sulfonate formaldehyde condensate), MS, C, and SN-B (aromatic sulfonate formaldehyde condensate)", "HOMOGENOL L-18 (high molecular polycarboxylic acid)", "EMULGEN 920, 930, 935, and 985 (polyoxyethylene nonyl phenyl ether)", and "ACETAMINE 86 (stearylamine acetate)" manufactured by Kao Corporation, "SOLSPERSE 5000 (phthalocyanine derivative), 22000 (azo pigment derivative), 13240 (polyesteramine), 3000, 12000, 17000, 20000, and 27000 (polymers having a functional portion in the terminal portion), and 24000, 28000, 32000, and 38500 (graft polymers)" manufactured by The Lubrizol Corporation, "NIKKOL T106 (polyoxyethylene sorbitan monooleate) and MYS-IEX (polyoxyethylene monostearate)" manufactured by NIKKO CHEMICALS Co., Ltd., "HINOACT T-8000E" and the like manufactured by Kawaken Fine Chemicals Co., Ltd., "Organosiloxane Polymer KP-341" manufactured by Shin-Etsu Chemical Co., Ltd., "W001: Cationic Surfactant" manufactured by Yusho Co., Ltd., non-ionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic acid ester, and anionic surfactants such as "W004, W005, and W017", "EFKA-46, EFKA-47, EFKA-47EA, EFKA polymer 100, EFKA POLYMER 400, EFKA POLYMER 401, and EFKA POLYMER 450" manufactured by MORISHITA SANGYO Corporation, high molecular dispersants such as "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA CORPORATION, and "IONET (trade name)S-20" manufactured by Sanyo Chemical Industries, Ltd. Further, In addition, Acryl-Based FFS-6752, Acryl-Based FFS-187, ACRYCURE RD-F8, or CYCLOMER P can also be used.

In addition, examples of the commercially available product of the amphoteric resin include DISPERBYK-130, DISPERBYK-140, DISPERBYK-142, DISPERBYK-145, DISPERBYK-180, DISPERBYK-187, DISPERBYK-191, DISPERBYK-2001, DISPERBYK-2010, DISPERBYK-2012, DISPERBYK-2025, and BYK-9076 manufactured by BYK-Chemie, and AJISPUR PB821, AJISPUR PB822, and AJISPUR PB881 manufactured by Ajinomoto Fine Techno Co., Inc.

The resin used as the dispersant preferably includes a repeating unit having an acid group. By incorporating the repeating unit having an acid group into the resin, residues generated in the underlying substrate of colored pixels in a case where a colored pattern is formed by photolithography can further be reduced.

The repeating unit having an acid group can be configured with a monomer having an acid group. Examples of the monomer derived from an acid group include a vinyl monomer having a carboxyl group, a vinyl monomer having a sulfonic acid group, and a vinyl monomer having a phosphoric acid group.

Examples of the vinyl monomer having a carboxyl group include (meth)acrylic acid, vinyl benzoic acid, maleic acid, monoalkyl maleic ester, fumaric acid, itaconic acid, crotonic acid, cinnamic acid, and an acrylic acid dimer. Further, an addition reaction products of a monomer having a hydroxyl group, such as 2-hydroxyethyl (meth)acrylate, with a cyclic anhydride such as maleic anhydride, phthalic anhydride, succinic anhydride, and cyclohexane dicarboxylic anhydride; ω-carboxy-polycaprolactone mono(meth)acrylate; or the like can also be used. Incidentally, as a precursor of a carboxyl group, an anhydride-containing monomer such as maleic anhydride, itaconic anhydride, and citraconic anhydride may also be used. Among these, from the viewpoint of properties of removing the unexposed area by development, addition reaction products of a monomer having a hydroxyl group, such as 2-hydroxyethyl (meth)acrylate, with a cyclic anhydride such as maleic anhydride, phthalic anhydride, succinic anhydride, and cyclohexane dicarboxylic anhydride are preferable.

Examples of the vinyl monomer having a sulfonic acid group include 2-acrylamide-2-methylpropanesulfonic acid.

Examples of the vinyl monomer having a phosphoric acid group include phosphoric mono(2-acryloyloxyethylester) and phosphoric mono(1-methyl-2-acryloyloxyethylester).

In addition, with regard to the repeating unit having an acid group, reference can be made to the descriptions in paragraph Nos. 0067 to 0069 in JP2008-165059A, the contents of which are incorporated herein.

Moreover, it is also preferable that the resin used as the dispersant is a graft copolymer. Since the graft copolymer has affinity to a solvent by a graft chain, the dispersibility of the colorant and the temporal dispersion stability are excellent. Further, since the composition has affinity to a polymerizable compound or an alkali-soluble resin due the presence of the presence of the graft chain, it can be difficult for residues to be generated by alkali development.

In addition, in the present invention, the graft copolymer means a resin having a graft chain. Further, the graft chain represents from an origin of the main chain of the polymer to the terminal of a group branched from the main chain.

In the present invention, a resin having a graft chain in the number of atoms excluding hydrogen atoms in the range of 40 to 10,000 is preferable as the graft copolymer. Furthermore, the number of atoms excluding hydrogen atoms per graft chain is preferably 40 to 10,000, more preferably 50 to 2,000, and still more preferably 60 to 500.

Examples of the main chain structure of the graft copolymer include a (meth)acryl resin, a polyester resin, a polyurethane resin, a polyurea resin, a polyamide resin, and a polyether resin. Among those, the (meth)acryl resin is preferable.

As the graft chain of the graft copolymer, a graft chain having poly(meth)acryl, polyester, or polyether is preferable, and a graft chain having polyester or polyether is more preferable, for the purpose of improving the interaction between the graft site and the solvent, and thus, increasing the dispersibility.

The graft copolymer includes a repeating unit having a graft chain, preferably in the range of 2% to 90% by mass, and more preferably in the range of 5% to 30% by mass, in terms of mass, with respect to the total mass of the graft copolymer. In a case where the content of the repeating unit having a graft chain falls within the range, the dispersibility of the colorant is good.

As the macromonomer used in the production of a graft copolymer by radical polymerization, known macromonomers can be used, and examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile that has a methacryloyl group as a terminal group), and AB-6 (polybutyl acrylate having a methacryloyl group as a terminal group) manufactured by TOAGOSEI, CO., LTD.; PLACCEL FM5 (a product obtained by adding 5 molar equivalents of ε-caprolactone to 2-hydroxyethyl methacrylate) and FA10L (a product obtained by adding 10 molar equivalents of ε-caprolactone to 2-hydroxyethyl acrylate) manufactured by DAICEL CORPORATION; and a polyester-based macromonomer described in JP1990-272009A (JP-H02-272009A).

In the present invention, an oligoimine-based graft copolymer containing a nitrogen atom in at least one of the main chain or the side chain can also be preferably used as the graft copolymer.

As the oligoimine-based graft copolymer, a resin having a side chain including a repeating unit having a partial structure X having a functional group with a $pK_a$ of 14 or less and an oligomer chain or polymer chain Y having 40 to 10,000 atoms, and having a basic nitrogen atom in at least one of the main chain or the side chain is preferable.

Here, the basic nitrogen atom is not particularly limited as long as it is a nitrogen atom exhibiting basicity. The oligoimine-based graft copolymer preferably contains a structure having a nitrogen atom with a base strength $pK_b$ of 14 or less, and more preferably contains a structure having a nitrogen atom with a $pK_b$ of 10 or less.

In the present invention, the basic strength $pK_b$ refers to a $pK_b$ at a water temperature of 25° C., is one of the indices to quantitatively represent the intensity of a base, and has the same definition as the basicity constant. The basic strength $pK_b$ and the acid strength $pK_a$ which will be described later are in a relationship of $pK_b=14-pK_a$.

It is particularly preferable that the oligoimine-based graft copolymer has a repeating unit (i) which is at least one repeating unit having a basic nitrogen atom, selected from a poly(lower alkylenimine)-based repeating unit, a polyallylamine-based repeating unit, a polydiallylamine-based repeating unit, a methaxylenediamine-epichlorohydrin polycondensate-based repeating unit, and a polyvinylamine-based repeating unit, and has a partial structure X having a functional group with a $pK_a$ of 14 or less while being bonded to the basic nitrogen atom, and a side chain (ii) including an oligomer chain or polymer chain Y having 40 to 10,000 atoms.

Examples of the oligoimine-based graft copolymer include a resin including a repeating unit represented by General Formula (I-1) and a repeating unit represented by General Formula (I-2).

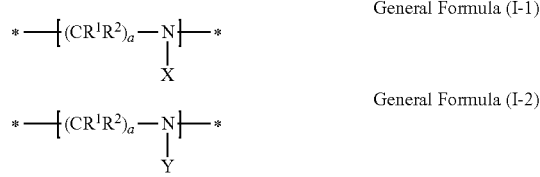

General Formula (I-1)

General Formula (I-2)

In General Formulae (I-1) and (I-2), $R^1$ and $R^2$ each independently represent a hydrogen atom, a halogen atom, or an alkyl group, a's each independently represent an integer of 1 to 5. * represents a linking moiety with between the repeating units, X represents a group having a functional group with a $pK_a$ of 14 or less, and Y represents an oligomer chain or polymer chain having 40 to 10.000 atoms.

The oligoimine-based graft copolymer preferably further includes a repeating unit represented by General Formula (I-3). According to this aspect, the dispersion stability of pigment forms is more improved.

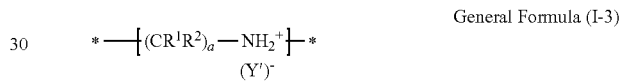

General Formula (I-3)

In General Formula (I-3), $R^1$, $R^2$, and a have the same definitions as $R^1$, $R^2$, and a in General Formula (I-1). Y' represents an oligomer chain or polymer chain having 40 to 10,000 atoms, containing an anion group. The repeating unit represented by General Formula (I-3) can be formed by causing a reaction by adding an oligomer or polymer having a group forming a salt by reacting with an amine to a resin having a primary or secondary amino group in the main chain moiety.

In General Formulae (I-1), (I-2), and (I-3), $R^1$ and $R^2$ are preferably a hydrogen atom, a is preferably 2 from the viewpoint of availability of raw materials.

The oligoimine-based graft copolymer may include a lower alkylenimine which contains a primary or tertiary amino group as a repeating unit, in addition to the repeating units represented by General Formulae (I-1), (I-2), and (I-3). Further, a group represented by X, Y, or Y' may be bonded to a nitrogen atom in the lower alkylenimine repeating unit.

The repeating unit represented by General Formula (I-1) is contained in the proportion of preferably 1% to 80% by mole, and most preferably 3% to 50% by mole, in all the repeating units included in the oligoimine-based graft copolymer.

The repeating unit represented by General Formula (I-2) is contained in the proportion of preferably 10% to 90% by mole, and most preferably 30% to 70% by mole, in all the repeating units included in the oligoimine-based graft copolymer.

From the viewpoints of dispersion stability and a balance between the hydrophobicity and the hydrophilicity, the content ratio [(I-1):(I-2)] of the repeating unit (I-1) and the repeating unit (I-2) is preferably in a range of 10:1 to 1:100, and more preferably in a range of 1:1 to 1:10, in terms of a molar ratio.

Furthermore, the repeating unit represented by General Formula (I-3), which is used in combination as desired, is a repeating unit in which a partial structure including an oligomer chain or polymer chain Y' having 40 to 10,000 atoms is ionically bonded to a nitrogen atom in the main chain, and from the viewpoint of the effects, the repeating unit is preferably contained in the proportion of 0.5% to 20% by mole, and most preferably contained in the proportion of 1% to 10% by mole, in all the repeating units included in the oligoimine-based graft copolymer. Further, it is possible to confirm that the polymer chain Y' is ionically bonded by means of infrared spectroscopy or base titration.

(Partial Structure X Having Functional Group with $pK_a$ of 14 or Less)

The partial structure X has a functional group with a $pK_a$ of 14 or less at a water temperature of 25° C. The definition of "$pK_a$" as mentioned herein is described in the Chemical Manual (11) (Revision 4th edition, 1993, Chemical Society of Japan, Maruzen Co., Ltd.).

The "functional group with a $pK_a$ of 14 or less" is not particularly limited in terms of the structure or the like as long as the physical properties thereof satisfy these conditions, and examples thereof include a known functional group where the $pK_a$ satisfies the range; however, a functional group with a $pK_a$ of 12 or less is particularly preferable, and a functional group with a $pK_a$ of 11 or less is most preferable. Specific examples of the partial structure X include a carboxylic acid group ($pK_a$: approximately 3 to 5), a sulfonic acid ($pK_a$: approximately −3 to −2), —COCH$_2$CO— ($pK_a$: approximately 8 to 10), —COCH$_2$CN ($pK_a$: approximately 8 to 11), —CONHCO—, a phenolic hydroxyl group, —R$_F$CH$_2$OH, or —(R$_F$)$_2$CHOH (R$_F$ represents a perfluoroalkyl group, $pK_a$: approximately 9 to 11), and a sulfonamido group ($pK_a$: approximately 9 to 11), and a carboxylic acid group ($pK_a$: approximately 3 to 5), and a sulfonic acid group ($pK_a$: approximately −3 to −2) and —COCH$_2$CO— ($pK_a$: approximately 8 to 10) are particularly preferable.

The partial structure X is preferably directly bonded to a basic nitrogen atom. The basic nitrogen atom and the partial structure X may be linked to each other in an aspect where a salt is formed by a covalent bond as well an ionic bond.

In particular, the partial structure X preferably has a structure represented by General Formula (V-1), (V-2), or (V-3).

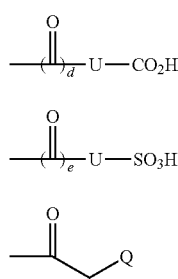

General Formula (V-1)

General Formula (V-2)

General Formula (V-3)

In General Formulae (V-1) and (V-2), U represents a single bond or a divalent linking group. d and e each independently represent 0 or 1. In General Formula (V-3), Q represents an acyl group or an alkoxycarbonyl group.

Examples of a divalent linking group represented by U include an alkylene group, an arylene group, and an alkyleneoxy group, each of which may have an oxygen atom; an alkylene group having 1 to 30 carbon atoms or an arylene group having 6 to 20 carbon atoms is particularly preferable; and an alkylene group having 1 to 20 carbon atoms or an arylene group having 6 to 15 carbon atoms is the most preferable. In addition, from the viewpoint of productivity, d is preferably 1 and e is preferably 0.

Q represents an acyl group or an alkoxycarbonyl group. The acyl group in Q is preferably an acyl group having 1 to 30 carbon atoms, and particularly preferably an acetyl group. As the alkoxycarbonyl group in Q, Q is preferably an acetyl group from the viewpoint of the ease of production and the availability of the raw materials (a precursor X' of X).

(Oligomer Chain or Polymer Chain Y Having Number of Atoms of 40 to 10.000)

Examples of the oligomer chain or polymer chain Y having the number of atoms of 40 to 10,000 include known polymer chains such as a polyester, a polyamide, a polyimide, and poly(meth)acrylic acid ester, which can be linked to the main chain portion of the oligoimine-based graft copolymer. The binding site in Y to the oligoimine-based graft copolymer is preferably the terminal of Y.

Y is preferably bonded to a basic nitrogen atom. The binding mode between the basic nitrogen atom and Y is a covalent bond, an ionic bond, or a mixture of a covalent bond and an ionic bond. The ratio of the binding mode between the basic nitrogen atom and Y, covalent bonds:ionic bonds, is preferably 100:0 to 0:100, more preferably 95:5 to 5:95, and most preferably 90:10 to 10:90. Y is preferably amide-bonded to the basic nitrogen atom, or ionically bonded as a carboxylic acid salt.

From the viewpoints of dispersibility, dispersion stability, and developability, the number of atoms of the oligomer chain or polymer chain Y is preferably 50 to 5,000, and more preferably 60 to 3,000.

The number-average molecular weight of Y can be measured as a value in terms of polystyrene by a GPC method. The number-average molecular weight of Y is particularly preferably 1.000 to 50,000, and from the viewpoints of dispersibility, dispersion stability, and developability, it is most preferably 1,000 to 30,000.

The side chain structure represented by Y is preferably linked to the main chain at 2 or more sites and most preferably at 5 or more sites, in one molecule of the resin.

With regard to the details of Y, reference can be made to the description in paragraph Nos. 0086 to 0098 of JP2013-064979A, the contents of which are incorporated herein.

The above-mentioned oligoimine-based graft copolymer can be synthesized by the method described in paragraph Nos. 0110 to 0117 of JP2013-064979A.

Specific examples of the above-mentioned oligoimine-based graft copolymer include the following copolymers, and also include the resins described in paragraph Nos. 0099 to 0109, and 0119 to 0124 of JP2013-064979A, the contents of which are incorporated herein.

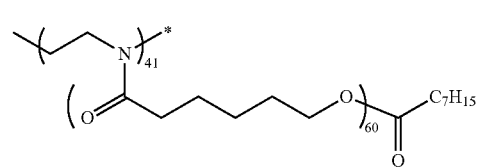

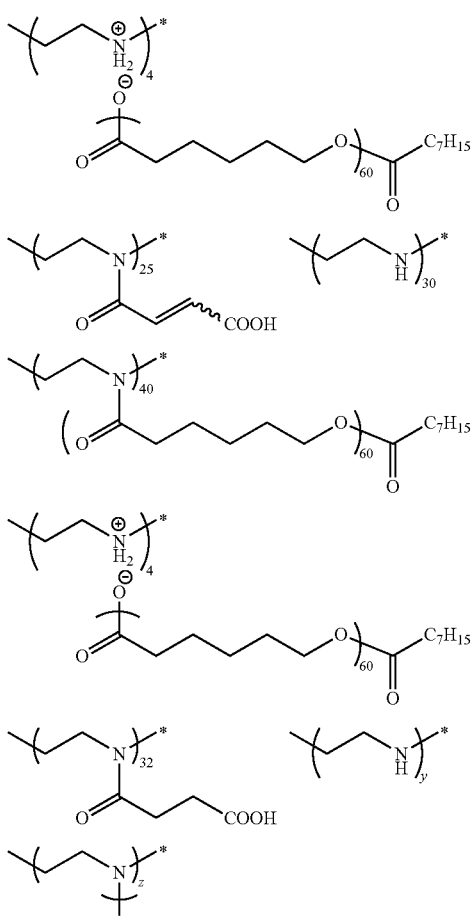

(y + z) = 24

In the present invention, a copolymer including a repeating unit represented by any one of Formulae (1) to (4) can also be used as the graft copolymer. The graft copolymer can be particularly preferably used as a dispersant for a black pigment.

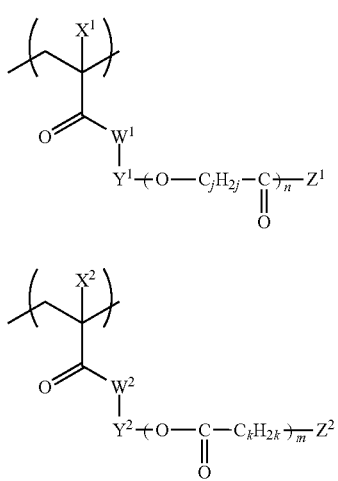

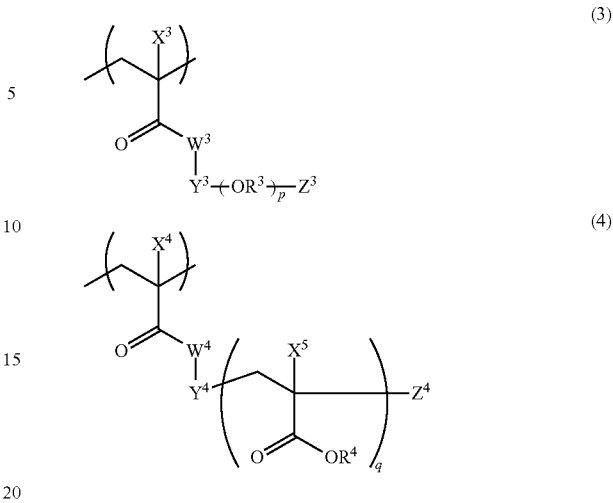

In Formulae (1) to (4), $W^1$, $W^2$, $W^3$, and $W^4$ each independently represent an oxygen atom or NI. $W^1$, $W^2$, $W^3$, and $W^4$ are preferably each an oxygen atom.

In Formulae (1) to (4), $X^1$, $X^2$, $X^3$, $X^4$, and $X^5$ each independently represent a hydrogen atom or a monovalent organic group. From the viewpoint of synthesis, it is preferable that $X^1$, $X^2$, $X^3$, $X^4$, and $X^5$ each independently represent a hydrogen atom or an alkyl group having 1 to 12 carbon atoms. It is more preferable that $X^1$, $X^2$, $X^3$, $X^4$, and $X^5$ each independently represent a hydrogen atom or a methyl group, with the methyl group being particularly preferable.

In Formulae (1) to (4), $Y^1$, $Y^2$, $Y^3$, and $Y^4$ each independently represent a divalent linking group, and the linking group is not particularly limited from the viewpoint of its structure. Specific examples of the divalent linking groups represented by $Y^1$, $Y^2$, $Y^3$, and $Y^4$ include linking groups represented by (Y-1) to (Y-21). In the structures shown below, A and B means binding sites to a left terminal group and a right terminal group, respectively, in Formulae (1) to (4).

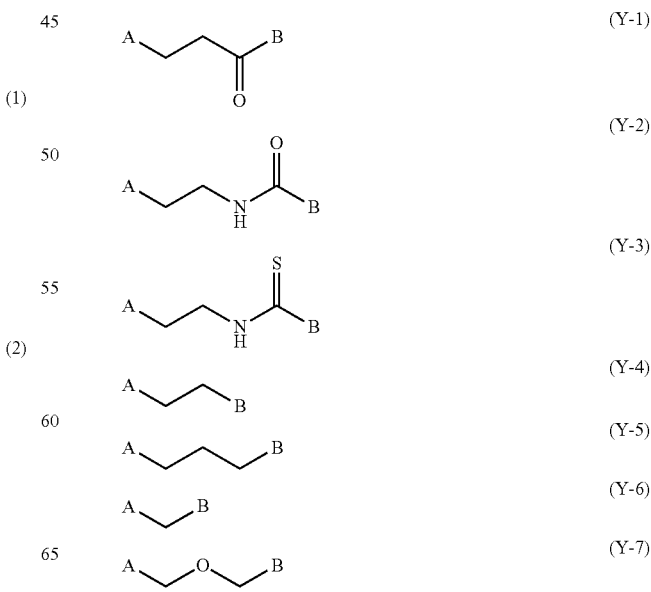

(Y-8) 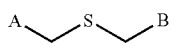

(Y-9) 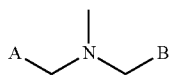

(Y-10) 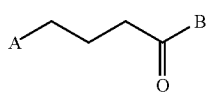

(Y-11) 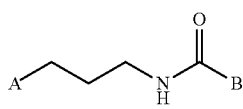

(Y-12) 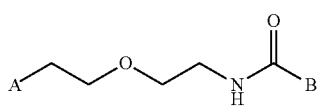

(Y-13) 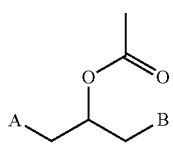

(Y-14) 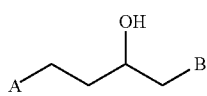

(Y-15) 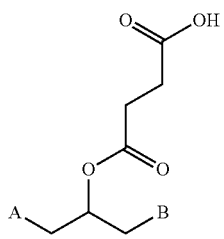

(Y-16) 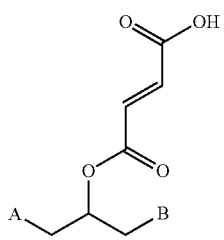

(Y-17) 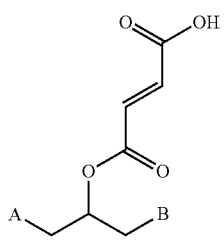

(Y-18) 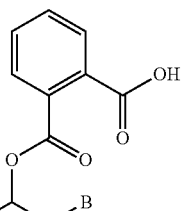

(Y-19)

(Y-20)

(Y-21)

In Formulae (1) to (4), $Z^1$, $Z^2$, $Z^3$, and Z each independently represent a monovalent organic group. The structure of the organic group is not particularly limited. Specific examples of the organic groups include an alkyl group, a hydroxyl group, an alkoxy group, an aryloxy group, heteroaryloxy group, an alkylthioether group, an arylthioether group, a heteroarylthioether group, and an amino group. Among those, ones having the steric repulsion effect are preferable as the organic groups represented by $Z^1$, $Z^2$, $Z^3$, and $Z^4$, in particular from the viewpoint of improving the dispersibility. It is preferable that $Z^1$, $Z^2$, $Z^3$, and $Z^4$ each independently represent a branched alkyl group having 5 to 24 carbon atoms, a cyclic alkyl group having 5 to 24 carbon atoms, and an alkoxy group having 5 to 24 carbon atoms. Among those, it is particularly preferable that $Z^1$, $Z^2$, $Z^3$, and $Z^4$ each independently represent an alkyl group or an alkoxy group having 5 to 24 carbon atoms. In addition, the alkyl group contained in the alkoxy group may be in any one of linear, branched, and cyclic forms.

In Formulae (1) to (4), n, m, p, and q are each independently an integer of 1 to 500. Furthermore, in Formulae (1) and (2), j and k each independently represent an integer of 2 to 8. j and k in Formulae (1) and (2) are preferably an integer of 4 to 6, and most preferably 5, from the viewpoints of dispersion stability and developability.

In Formula (3). $R^3$ represents a branched or linear alkylene group, and is preferably an alkylene group having 1 to 10 carbon atoms, and more preferably an alkylene group having 2 or 3 carbon atoms. In a case where p is 2 to 500. $R^3$ which are present in plural numbers may be the same as or different from each other.

In Formula (4), $R^4$ represents a hydrogen atom or a monovalent organic group, and the monovalent organic group is not particularly limited in terms of its structure. $R^4$ is preferably a hydrogen atom, an alkyl group, an aryl group, or a heteroaryl group, and more preferably a hydrogen atom or an alkyl group. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is particularly preferable. In Formula (4), in a case where q is 2 to 500, $X^5$ and $R^4$ which are present in plural numbers in a graft copolymer may be the same as or different from each other.

As for the repeating unit represented by Formula (1), a repeating unit represented by Formula (1A) is more preferable from the viewpoints of dispersion stability and developability.

In addition, as the repeating unit represented by Formula (2), a repeating unit represented by Formula (2A) is more preferable from the viewpoint of dispersion stability and developability.

As the repeating unit represented by Formula (3), a repeating unit represented by Formula (3A) or (3B) is more preferable from the viewpoint of dispersion stability and developability.

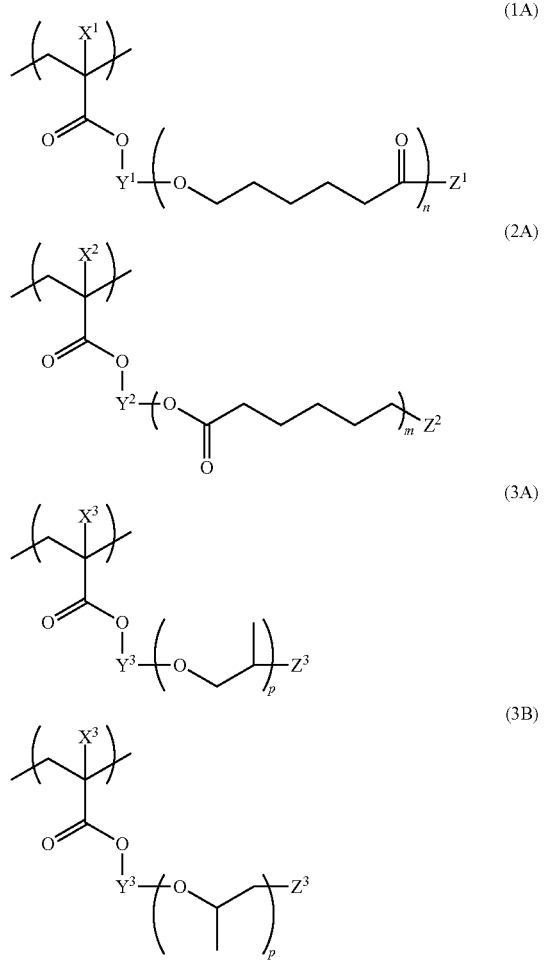

In Formula (1A), $X^1$, $Y^1$, $Z^1$, and n have the same definitions as $X^1$, $Y^1$, $Z^1$, and n in formula (1), and preferred ranges thereof are also the same.

In Formula (2A), $X^2$, $Y^2$, $Z^2$, and m have the same definitions as $X^2$, $Y^2$, $Z^2$, and m in Formula (2), and preferred ranges thereof are also the same.

In Formula (3A) or (3B), $X^3$, $Y^3$, $Z^3$, and p have the same definitions as $X^3$, $Y^3$, $Z^3$, and p in Formula (3), and preferred ranges thereof are also the same.

Furthermore, it is also preferable that the above-mentioned graft copolymer has a hydrophobic repeating unit, in addition to the above-mentioned repeating units represented by Formula (1) to (4). Meanwhile, in the present invention, the hydrophobic repeating unit is a repeating unit having no acid group (for example, a carboxylic acid group, a sulfonic acid group, a phosphoric acid group, and a phenolic hydroxyl group).

The hydrophobic repeating unit is preferably a repeating unit which is derived from (corresponds to) a compound (monomer) having a C log P value of 1.2 or more, and more preferably a repeating unit derived from a compound having a C log P value of 1.2 to 8.

A C log P value is a value calculated by the program "C LOG P", which is available from Daylight Chemical Information System. Inc. This program provides values of "calculated log P" calculated using Hansch and Leo's fragment approach (see documents below). The fragment approach is based on the chemical structure of a compound, and divides the chemical structure into partial structures (fragments) and sums the log P contribution allocated to each fragment. Thus the log P value of the compound is estimated. The details thereof are described in the following documents. In the present invention, the C log P values calculated by the program C LOG P v4.82 are used.

A. J. Leo, Comprehensive Medicinal Chemistry, Vol. 4. C. Hansch, P. G. Sammnens, J. B. Taylor and C. A. Ramsden, Eds., p. 295, Pergamon Press, 1990 C. Hansch & A. J. Leo. Substituent Constants For Correlation Analysis in Chemistry and Biology. John Wiley & Sons. A. J. Leo. Calculating log Poct from structure. Chem. Rev., 93, 1281-1306, 1993.

The log P means the common logarithm of a partition coefficient P. The log P is a value of a physical property, being a quantitative numeral value, representing how an organic compound is distributed in an equilibrium of the two-phase system of oil (typically 1-octanol) and water. The log P is expressed in the following expression.

log $P$=log($C$oil/$C$water)

In the expression. Coil represents the molar concentration of the compound in the oil phase, and Cwater represents the molar concentration of the compound in the water phase.

Oil solubility increases as the value of log P crosses zero and increases in the positive direction and water solubility increases as an absolute value increases in the negative direction. The log P has a negative correlation with the water solubility of the organic compound and is widely used as a parameter for estimating the hydrophilic or hydrophobic properties of an organic compound.

It is preferable that the graft copolymer has at least one repeating unit selected from repeating units derived from monomers represented by General Formulae (i) to (iii) as the hydrophobic repeating unit.

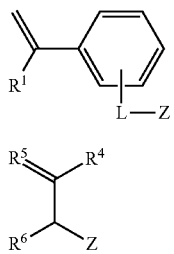

(ii)

(iii)

In Formulae (i) to (iii), $R^1$, $R^2$, and $R^3$ each independently represent a hydrogen atom, a halogen atom (for example, fluorine, chlorine, and bromine), or an alkyl group having 1 to 6 carbon atoms (for example, a methyl group, an ethyl group, and a propyl group).

$R^1$, $R^2$, and $R^3$ are each more preferably a hydrogen atom or an alkyl group having 1 to 3 carbon atoms, and most preferably a hydrogen atom or a methyl group. It is particularly preferable that $R^2$ and $R^3$ are each a hydrogen atom.

X represents an oxygen atom (—O—) or an imino group (—NH—), and is preferably an oxygen atom.

L is a single bond or a divalent linking group. Examples of the divalent linking groups include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group, an oxygen atom (—O—), a sulfur atom (—S—), an imino group (—NH—), a substituted imino group (—$NR^{31}$—, in which $R^{31}$ is an aliphatic group, an aromatic group, or a heterocyclic group), a carbonyl group (—CO—), and a combination thereof.

L is preferably a single bond or a divalent linking group including an alkylene group or an oxyalkylene structure. The oxyalkylene structure is more preferably an oxyethylene structure or an oxypropylene structure. Further, L may include a polyoxyalkylene structure including two or more repeating oxyalkylene structures. The polyoxyalkylene structure is preferably a polyoxyethylene structure or a polyoxypropylene structure. The polyoxyethylene structure is represented by —$(OCH_2CH_2)_n$—, and n is preferably an integer of 2 or more, and more preferably an integer of 2 to 10.

Examples of Z include an aliphatic group (for example, an alkyl group, a substituted alkyl group, an unsaturated alkyl group, and a substituted unsaturated alkyl group), an aromatic group (for example, an arylene group or a substituted arylene group), a heterocyclic group, an oxygen atom (—O—), a sulfur atom (—S—), an imino group (—NH—), a substituted imino group (—$NR^{31}$— in which $R^{31}$ represents an aliphatic group, an aromatic group, or a heterocyclic group), a carbonyl group (—CO—), and a combination thereof.

The aliphatic group may have a cyclic structure or a branched structure. The number of carbon atoms in the aliphatic group is preferably 1 to 20, more preferably 1 to 15, and still more preferably 1 to 10. Further, the aliphatic group includes a ring assembly hydrocarbon group or a crosslinked cyclic hydrocarbon ring. Examples of the ring assembly hydrocarbon groups include a bicyclohexyl group, a perhydronaphthalenyl group, a biphenyl group, and a 4-cyclohexyl phenyl group. Examples of the crosslinked cyclic hydrocarbon rings include a bicyclic hydrocarbon ring such as pinane, bornane, norpinane, norbornane, a bicyclooctane ring (a bicyclo[2.2.2]octane ring, a bicyclo[3.2.1]octane ring, and the like), a tricyclic hydrocarbon ring such as homobredane, adamantane, tricyclo[5.2.1.0$^{2,6}$]decane, a tricyclo[4.3.1.1$^{2,5}$]undecane ring, and a tetracyclic hydrocarbon ring such as tetracyclic[4.4.0.1$^{2,5}$.1$^{7,10}$]dodecane and perhydro-1,4-methano-5,8-methanonaphthalene rings. In addition, the crosslinked cyclic hydrocarbon rings include fused cyclic hydrocarbon rings which are a plurality of fused rings of 5- to 8-membered cycloalkane rings such as perhydronaphthalene (decalin), perhydroanthracene, perhydrophenanthrene, perhydroacenaphthene, perhydrofluorene, perhydroindene, and perhydrophenalene rings. As the aliphatic group, a saturated aliphatic group is more preferable than an unsaturated aliphatic group. Further, the aliphatic group may have a substituent. Examples of the substituents include a halogen atom, an aromatic group, and a heterocyclic group. However, the aliphatic group has no acid group as the substituent.

The number of carbon atoms in the above-mentioned aromatic group is preferably 6 to 20, more preferably 6 to 15, and still more preferably 6 to 10. Further, the aromatic group may have a substituent. Examples of the substituents include a halogen atom, an aliphatic group, an aromatic group, and a heterocyclic group. However, the aromatic group has no acid group as the substituent.

The heterocyclic group preferably has a 5- or 6-membered ring as the heterocyclic ring. Another heterocyclic ring, aliphatic ring, or aromatic ring may be fused with the heterocyclic ring. The heterocyclic group may have a substituent. Examples of the substituents include a halogen atom, a hydroxyl group, an oxo group (=O), a thioxo group (=S), an imino group (=NH), a substituted imino group (=N—$R^{32}$ in which $R^{32}$ is an aliphatic group, an aromatic group, or a heterocyclic group), an aliphatic group, an aromatic group, and a heterocyclic group. However, the heterocyclic group has no acid group as the substituent.

In Formula (iii), $R^4$, $R^5$, and $R^6$ each independently represent a hydrogen atom, a halogen atom (for example, fluorine, chlorine, and bromine), an alkyl group having 1 to 6 carbon atoms (for example, a methyl group, an ethyl group, and a propyl group), Z, or -L-Z. Here, L and Z have the same definitions as those defined above. As each of $R^4$, $R^5$, and $R^6$, a hydrogen atom or an alkyl group having 1 to 3 carbon atoms is preferable, and a hydrogen atom is more preferable.

As the monomer represented by General Formula (i), a compound in which $R^1$, $R^2$, and $R^3$ are each a hydrogen atom or a methyl group, L is a single bond, an alkylene group, or a divalent linking group including an oxyalkylene structure, X is an oxygen atom or an imino group, and Z is an aliphatic group, a heterocyclic group, or an aromatic group is preferable. As the monomer represented by General Formula (ii), a compound in which $R^1$ is a hydrogen atom or a methyl group, L is an alkylene group, Z is an aliphatic group, a heterocyclic group, or an aromatic group, and Y is a methine group is preferable. Further, as the monomer represented by General Formula (iii), a compound in which $R^4$, $R^5$, and $R^6$ are each a hydrogen atom or a methyl group, and Z is an aliphatic group, a heterocyclic group, or an aromatic group is preferable.

Examples of the typical compounds represented by Formulae (i) to (iii) include radically polymerizable compounds selected from acrylic acid esters, methacrylic acid esters, and styrenes. In addition, with regard to the examples of the compounds represented by Formulae (i) to (iii), reference can be made to the compounds described in paragraphs 0089 to 0093 of JP2013-249417A, the contents of which are incorporated herein by reference.

In the graft copolymer, the hydrophobic repeating unit is preferably included in the amount in a range of 10% to 90% by mass, and more preferably included in the amount in a range of 20% to 80% by mass, in terms of mass, with respect to the total mass of the graft copolymer. In a case where the content is within the range, sufficient pattern formation is achieved.

It is preferable that the above-mentioned graft copolymer includes a repeating unit having a functional group capable of interacting with a colorant, in addition to the above-mentioned repeating units represented by Formulae (1) to (4).

Examples of the acid group include a carboxylic acid group, a sulfonic acid group, a phosphoric acid group, and a phenolic hydroxyl group. At least one of the carboxylic acid group, the sulfonic acid group, or the phosphoric acid group is preferable, and the carboxylic acid group is particularly preferable from the viewpoint that it has excellent adsorptivity on the colorant such as a black pigment and high dispersibility.

The graft copolymer may have one kind or two or more kinds of repeating units having an acid group.

The graft copolymer may or may not contain a repeating unit having an acid group. In a case where the graft copolymer contains a repeating unit having an acid group, the content of the repeating unit having an acid group is preferably 5% to 80% by mass, and more preferably 10% to 60 by mass %, with respect to the total mass of the graft copolymer, in terms of mass.

Examples of the basic group include a primary amino group, a secondary amino group, a tertiary amino group, a heterocycle containing an N atom, and an amido group. The tertiary amino group is particularly preferable from the viewpoint that it has excellent adsorptivity on the colorant and high dispersibility. The graft copolymer may have one kind or two or more kinds of the basic groups.

The graft copolymer may or may not contain a repeating unit having a basic group. In a case where the graft copolymer contains the repeating unit having a basic group, the content of the repeating unit having a basic group, in terms of mass, with respect to the total mass of the graft copolymer, is preferably 0.01% to 500/% by mass, and more preferably 0.01% to 30% by mass, from the viewpoint of suppressing the development inhibition.

Examples of the coordinating group and the reactive functional group include an acetylacetoxy group, a trialkoxysilyl group, an isocyanate group, an acid anhydride, and an acid chloride. The acetylacetoxy group is particularly preferable from the viewpoint that it has excellent adsorptivity on the colorant and high dispersibility. The graft copolymer may have one kind or two or more kinds of the groups.

The graft copolymer may or may not contain a repeating unit having a coordinating group or a repeating unit having a reactive functional group. In a case where the graft copolymer contains the repeating unit having a coordinating group or the repeating unit having a reactive functional group, the content of the repeating unit, in terms of mass, with respect to the total mass of the graft copolymer, is preferably 10% to 80% by mass, and more preferably 20% to 60% by mass, from the viewpoint of suppressing the development inhibition.

In a case where the graft copolymer has a functional group capable of interacting with a colorant, in addition to the graft chain, it is not particularly limited how those functional groups are introduced, but the graft copolymer preferably has at least one repeating unit selected from the repeating units derived from monomers represented by General Formulae (iv) to (vi).

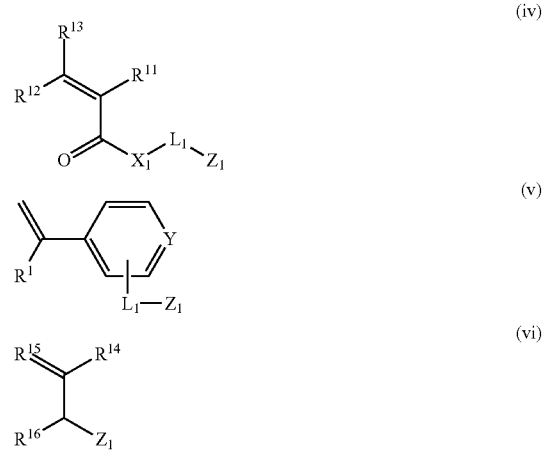

In General Formulae (iv) to (vi), $R^{11}$, $R^{12}$, and $R^{13}$ each independently represent a hydrogen atom, a halogen atom (for example, a fluorine atom, a chlorine atom, and a bromine atom), or an alkyl group (for example, a methyl group, an ethyl group, and a propyl group) having 1 to 6 carbon atoms.

In General Formulae (iv) to (vi), it is more preferable that $R^{11}$, $R^{12}$, and $R^{13}$ are each independently a hydrogen atom or an alkyl group having 1 to 3 carbon atoms, and it is most preferable that $R^{11}$, $R^2$, and $R^{13}$ are each independently a hydrogen atom or a methyl group. In General Formula (iv), it is particularly preferable that $R^{12}$ and $R^{13}$ are each a hydrogen atom.

In General Formula (iv), $X_1$ represents an oxygen atom (—O—) or an imino group (—NH—), and is preferably an oxygen atom.

Y in General Formula (v) represents a methine group or a nitrogen atom.

Moreover, in General Formulae (iv) to (v), $L_1$ represents a single bond or a divalent linking group. Examples of the divalent linking groups include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group, an oxygen atom (—O—), a sulfur atom (—S—), an imino group (—NH—), a substituted imino bond (—NR$^{31'}$— in which R$^{31'}$ is an aliphatic group, an aromatic group, or a heterocyclic group), a carbonyl bond (—CO—), and a combination thereof.

It is preferable that $L_1$ is a single bond, an alkylene group, or a divalent linking group containing an oxyalkylene structure. It is more preferable that the oxyalkylene structure is an oxyethylene structure or an oxypropylene structure. Further, $L_1$ may include a polyoxyalkylene structure including two or more repeating oxyalkylene structures. As the polyoxyalkylene structure, a polyoxyethylene structure or a polyoxypropylene structure is preferable. The polyoxyethylene structure is represented by —(OCH$_2$CH$_2$)n- in which n is preferably an integer of 2 or more, and more preferably an integer of 2 to 10.

In General Formulae (iv) to (vi), $Z_1$ represents a functional group capable of interacting with the colorant, other than the graft chain, and is preferably a carboxylic acid group or a tertiary amino group, and more preferably a carboxylic acid group.

In General Formula (vi), $R^{14}$, $R^{15}$, and $R^{16}$ each independently represents a hydrogen atom, a halogen atom (for example, fluorine, chlorine, and bromine), an alkyl group having 1 to 6 carbon atoms (for example, a methyl group, an ethyl group, and a propyl group), —$Z_1$, or -$L_1$-$Z_1$. Here, $L_1$ and $Z_1$ have the same definitions as $L_1$ and $Z_1$ above, respectively, and the preferred examples thereof are also the same. It is preferable that $R^{14}$, $R^{15}$, and $R^{16}$ each independently represent a hydrogen atom or an alkyl group having 1 to 3 carbon atoms, and more preferably a hydrogen atom.

As the monomer represented by General Formula (iv), a compound in which $R^{11}$, $R^{12}$, and $R^{13}$ are each independently a hydrogen atom or a methyl group, $L_1$ is an alkylene group or a divalent linking group containing an oxyalkylene structure, $X_1$ is an oxygen atom or an imino group, and $Z_1$ is a carboxylic acid group is preferable. As the monomer represented by General Formula (v), a compound in which $R^1$ is a hydrogen atom or a methyl group, $L_1$ is an alkylene group, $Z_1$ is a carboxylic acid group, and Y is a methine group is preferable. As the monomer represented by General Formula (vi), a compound in which $R^{14}$, $R^{15}$, and $R^{16}$ are each independently a hydrogen atom or a methyl group, $L_1$ is a single bond or an alkylene group, and $Z_1$ is a carboxylic acid group is preferable.

Specific examples of the graft copolymer include the following copolymers. In addition, reference can be made to the high molecular compounds described in paragraphs 0127 to 0129 of JP2013-249417A, the contents of which are incorporated herein.

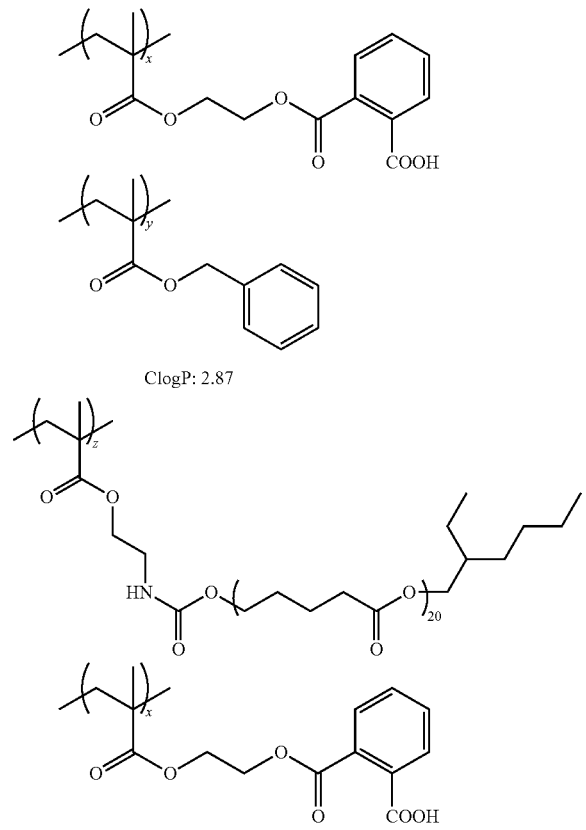

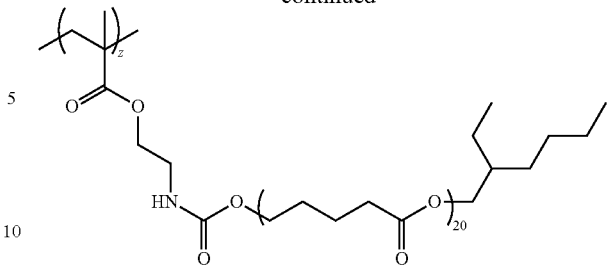

<<Pigment Derivative>>

The coloring composition of the present invention may contain a pigment derivative. The pigment derivative is preferably a compound having a structure in which a portion of an organic pigment is substituted with an acidic group, a basic group, or a phthalimidomethyl group. As the pigment derivative, a pigment derivative having an acidic group or a basic group is preferable from the viewpoint of dispersibility and the dispersion stability of the colorant A, and a pigment derivative having a basic group is particularly preferable. Further, a combination of the above-mentioned resin (dispersant) and the pigment derivative is preferably a combination in which the dispersant is an acidic dispersant and the pigment derivative has a basic group.

Examples of the organic pigment for constituting the pigment derivative include a diketopyrrolopyrrole-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment, and a metal complex-based pigment.

In addition, the acidic group contained in the pigment derivative is preferably a sulfonic acid group, a carboxylic acid group, or a salt thereof, more preferably a carboxylic acid group or a sulfonic acid group, and particularly preferably a sulfonic acid group. The basic group contained in the pigment derivative is preferably an amino group, and particularly preferably a tertiary amino group.

In a case where the coloring composition of the present invention contains the pigment derivative, the content of the pigment derivative is preferably 1% to 30% by mass, and more preferably 3% to 20% by mass, with respect to the mass of the pigment. The pigment derivative may be used singly or in combination of two or more kinds thereof.

<<Organic Solvent>>

The coloring composition of the present invention may include an organic solvent.

Basically, the organic solvent is not particularly limited as long as it satisfies the solubility of the respective components or the coating properties of the coloring composition, but is preferably selected in consideration of the solubility, the coating properties, and the safety of a polymerizable compound, an alkali-soluble resin, or the like.

Suitable examples of the organic solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl oxyacetate esters (e.g.: methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), alkyl 3-oxypropionate esters (e.g.: methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate)), alkyl 2-oxypropionate esters (e.g.: methyl 2-oxypropionate, ethyl 2-oxypropionate, propyl 2-oxypropionate, and the like (for example, methyl 2-methoxypropionate, ethyl 2-methoxypropionate, propyl 2-methoxypropionate, methyl 2-ethoxypropionate, and ethyl 2-ethoxypropionate)), methyl 2-oxy-2-methyl propionate and ethyl 2-oxy-2-methyl propionate (e.g.: methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol methyl ether acetate, propylene glycol ethyl ether acetate, and propylene glycol propyl ether acetate; ketones such as methyl ethyl ketone, cyclohexanone, cyclopentanone, 2-heptanone, and 3-heptanone; and aromatic hydrocarbons such as toluene and xylene.

From the viewpoints of the solubility of a polymerizable compound, an alkali-soluble resin, or the like, the improvement in the shape of coated surfaces, and the like, it is also preferable to mix two or more kinds of these organic solvents. A mixed solution consisting of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate is particularly preferable.

In the present invention, the organic solvent preferably has a content of peroxides of 0.8 mmol/L or less, and the solvent which does not substantially include peroxides is more preferably used.

From the viewpoint of coating properties, the content of the organic solvent in the coloring composition is preferably set such that the concentration of the total solid content of the coloring composition becomes 5% to 80% by mass, more preferably 5% to 60% by mass, and particularly preferably 10% to 50% by mass.

The coloring composition of the present invention may include only one kind or two or more kinds of the organic solvent. In a case where the coloring composition includes two or more kinds of the solvent, the total amount thereof preferably falls within the range.

<<Polymerization Inhibitor>>

A small amount of a polymerization inhibitor is desirably added to the coloring composition of the present invention in order to prevent unnecessary thermal polymerization of the polymerizable compound during the production or preservation of the coloring composition.

Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and a N-nitrosophenylhydroxylamine cerous salt.

In a case where the coloring composition of the present invention includes a polymerization inhibitor, the content of the polymerization inhibitor is preferably 0.01% to 5% by mass with respect to the mass of the coloring composition.

The coloring composition of the present invention may include one kind or two or more kinds of the polymerization inhibitor. In a case where the coloring composition includes two or more kinds of the polymerization inhibitor, the total amount thereof preferably falls within the range.

<<Surfactant>>

From the viewpoint of further improving coating properties, various surfactants may be added to the coloring composition of the present invention. As the surfactants, various surfactants such as a fluorine-based surfactant, a non-ionic surfactant, a cationic surfactant, an anionic surfactant, and a silicone-based surfactant can be used.

For example, by incorporating a fluorine-based surfactant into the coloring composition, liquid characteristics (in particular, fluidity) are further improved in a case where the coloring composition is prepared as a coating liquid. That is, in the case where a film is formed, using the coloring composition containing a fluorine-based surfactant, the interface tension between a surface to be coated and the coating liquid is reduced to improve wettability with respect to the surface to be coated, and enhance coating properties with respect to the surface to be coated. Therefore, even in the case where a thin film of about several μm is formed of a small amount of liquid, the coloring composition containing a fluorine-based surfactant is effective in that a film with a uniform thickness which exhibits a small extent of thickness unevenness can be more suitably formed.

The fluorine content in the fluorine-based surfactant is suitably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film or liquid saving properties, and the solubility of the surfactant in the coloring composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and MEGAFACE F781 (all manufactured by DIC Corporation); FLUORAD FC430, FC431, and FC171 (all manufactured by Sumitomo 3M); SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all manufactured by ASAHI GLASS Co., Ltd.); and PF636, PF656, PF6320, PF6520, and PF7002 (manufactured by OMNOVA). Further, as the fluorine-based surfactant, a block polymer can also be used, and specific examples thereof include the compounds described in JP2011-89090A.

The fluorine-based surfactant can also preferably use a high molecular fluorine-containing compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups), the following compounds are also exemplified as a fluorine-based surfactant for use in the present invention.

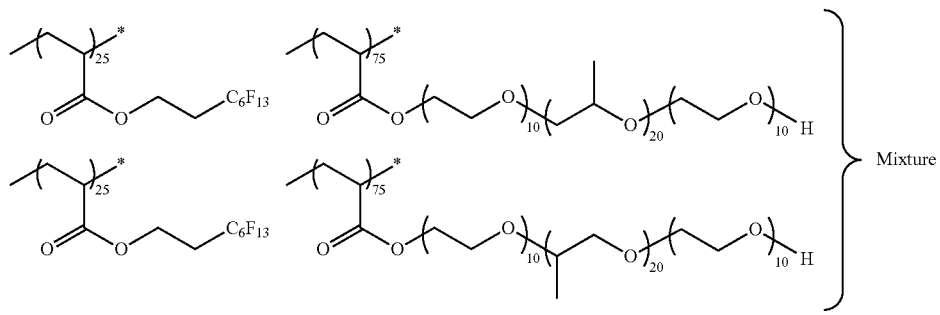 Mixture

The weight-average molecular weight of the compound is preferably 3,000 to 50,000, for example, 14,000.

Specific examples of the non-ionic surfactant include glycerol, trimethylolpropane, trimethylolethane, and ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L0, L31, L61, L62, 10R5, 17R2, and 25R2, and TETRONIC 304, 701, 704, 901, 904, and 150R1 manufactured by BASF), and SOLSEPERSE 20000 (manufactured by Lubrizol Japan Ltd.). Further, PIONIN D-6112-W manufactured by Takemoto Oil & Fat Co., Ltd., NCW-101, NCW-1001, or NCW-1002 (manufactured by Wako Pure Chemical Industries, Ltd.), PIONIN D-6315 manufactured by Takemoto Oil & Fat Co., Ltd., or the like can also be used.

Specific examples of the cationic surfactant include phthalocyanine derivatives (trade name: EFKA-745, manufactured by MORISHITA KAGAKU SANGYO Corporation), organosiloxane polymer KP-341 (manufactured by Shin-Etsu Chemical Co., Ltd.), (meth)acrylic acid-based (co)polymer POLYFLOW No. 75. No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.).

Examples of the silicone-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400", manufactured by Dow Corning Toray CO., LTD., "TSF-4440", "TSF-4300", "TSF-4445", "TSF-4460", and "TSF-4452", manufactured by Momentive Performance Materials Inc., "KP-341", "KF6001", and "KF6002", manufactured by Shin-Etsu Chemical Co., Ltd., and "BYK307", "BYK323", and "BYK330", manufactured by BYK Additives & Instruments.

In a case where the coloring composition of the present invention includes a surfactant, the content of the surfactant is preferably 0.001% to 2.0% by mass, and more preferably 0.005% to 1.0% by mass, with respect to the total mass of the coloring composition.

The coloring composition of the present invention may include one kind or two or more kinds of the surfactant. In a case where the coloring composition includes two or more kinds of the surfactant, the total amount thereof preferably falls within the range.

<<Silane Coupling Agent>>

The coloring composition of the present invention may contain a silane coupling agent for the purpose of improving substrate adhesiveness.

The silane coupling agent is a compound having a hydrolyzable group and other functional groups in a molecule thereof. Further, the hydrolyzable group such as an alkoxy group is bonded to a silicon atom.

The hydrolyzable group refers to a substituent that can be directly linked to a silicon atom to generate a siloxane bond by a hydrolysis reaction and/or a condensation reaction. Examples of the hydrolyzable group include a halogen atom, an alkoxy group, an acyloxy group, and an alkenyloxy group. In a case where the hydrolyzable group has a carbon atom, the number of carbon atoms thereof is preferably 6 or less, and more preferably 4 or less. An alkoxy group having 4 or less carbon atoms or an alkenyloxy group having 4 or less carbon atoms is particularly preferable.

Moreover, in order to improve the adhesiveness of the cured film, it is preferable that the silane coupling agent does not include a fluorine atom and a silicon atom (provided that a silicon atom to which a hydrolyzable group is bonded is excluded), and it is also preferable that the silane coupling agent does not include a fluorine atom, a silicon atom (provided that a silicon atom to which a hydrolyzable group is bonded is excluded), an alkylene group substituted with a silicon atom, a linear alkyl group having 8 or more carbon atoms, and a branched alkyl group having 3 or more carbon atoms.

In addition, in the present invention, the silane coupling agent is a compound which is different from the above-mentioned polymerizable compounds and curable compounds. That is, a compound having a hydrolyzable group and other functional groups in a molecule thereof is defined as a silane coupling agent.

The silane coupling agent preferably has a group represented by Formula (Z). * represents a binding position.

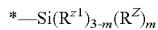 Formula (Z)

$R^{z1}$ represents an alkyl group, $R^{z2}$ represents a hydrolyzable group, and m represents an integer of 1 to 3. The number of carbon atoms of the alkyl group represented by $R^{z1}$ is preferably 1 to 5, and more preferably 1 to 3. The definition of the hydrolyzable group represented by $R^{z2}$ is as described above.

The silane coupling agent preferably has a curable functional group. As the curable functional group, at least one selected from the group consisting of a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)acrylamido group, a styryl group, and a maleimido group is preferable, and at least one selected from the group consisting of a (meth)acryloyloxy group, an epoxy group, and an oxetanyl group is more preferable. The curable functional group may be bonded to a silicon atom directly or via a linking group.

The molecular weight of the silane coupling agent is not particularly limited, and from the viewpoint of handling properties, it is preferably 100 to 1,000 in many cases, and from the viewpoint that the effects of the present invention are more excellent, it is preferably 270 or more, and more preferably 270 to 1,000.

As one of suitable aspects of the silane coupling agent, a silane coupling agent X represented by Formula (W) may be mentioned.

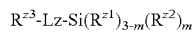

$$R^{z3}\text{-Lz-Si}(R^{z1})_{3-m}(R^{z2})_m \quad \text{Formula (W)}$$

$R^{z1}$ represents an alkyl group, $R^{z2}$ represents a hydrolyzable group, $R^{z3}$ represents a curable functional group, Lz represents a single bond or a divalent linking group, and m represents an integer of 1 to 3.

The definition of the alkyl group represented by $R^{z1}$ is as described above. The definition of the hydrolyzable group represented by $R^{z2}$ is as described above. The definition of the curable functional group represented by $R^{z3}$ is as described above, and suitable ranges thereof are also as described above.

Lz represents a single bond or a divalent linking group. Examples of the divalent linking group include an alkylene group, an arylene group, —$NR^{12}$—, —$CONR^{12}$—, —CO—, —$CO_2$—, —$SO_2NR^{12}$—, —O—, —S—, —$SO_2$—, and a combination thereof.

The number of carbon atoms of the alkylene group is preferably 1 to 20. The alkylene group may be in any one of linear and branched forms. The alkylene group and the arylene group may be unsubstituted or may have a substituent. Examples of the substituent include a halogen atom and a hydroxyl group.

Lz is preferably at least one selected from the group consisting of an alkylene group having 2 to 10 carbon atoms and an arylene group having 6 to 12 carbon atoms, or a group formed by the combination of these groups with at least one selected from the group consisting of —$NR^{12}$—, —$CONR^{12}$—, —CO—, —$CO_2$—, —$SO_2NR^{12}$—, —O—, —S—, and —$SO_2$—, and more preferably an alkylene group having 2 to 10 carbon atoms, —$CO_2$—, —O—, —CO—, —$CONR^{12}$—, or a group formed by the combination of these groups. Here, the $R^{12}$ represents a hydrogen atom or a methyl group.

m represents 1 to 3, and is preferably 2 to 3, and more preferably 3.

Examples of the silane coupling agent X include N-β-aminoethyl-γ-aminopropyl-methyldimethoxysilane (trade name: KBM-602, manufactured by Shin-Etsu Chemical Co., Ltd.), N-β-aminoethyl-γ-aminopropyl-trimethoxysilane (trade name: KBM-603, manufactured by Shin-Etsu Chemical Co., Ltd.), N-β-aminoethyl-γ-aminopropyl-triethoxysilane (trade name: KBE-602, manufactured by Shin-Etsu Chemical Co., Ltd.), γ-aminopropyl-trimethoxysilane (trade name: KBM-903, manufactured by Shin-Etsu Chemical Co., Ltd.), γ-aminopropyl-triethoxysilane (trade name: KBE-903, manufactured by Shin-Etsu Chemical Co., Ltd.), 3-methacryloxypropyltrimethoxysilane (trade name: KBM-503, manufactured by Shin-Etsu Chemical Co., Ltd.), and glycidoxyoctyltrimethoxysilane (trade name: KBM-4803, manufactured by Shin-Etsu Chemical Co., Ltd.).

Suitable aspects of the silane coupling agent include a silane coupling agent Y having at least a silicon atom, a nitrogen atom, and a curable functional group, as well as a hydrolyzable group bonded to the silicon atom, in a molecule thereof.

This silane coupling agent Y may have at least one silicon atom in a molecule thereof, and the silicon atom may be bonded to the following atoms and substituents. They may be the same or different atoms or substituents. Examples of the atoms and substituents to which the silane coupling agent Y may be bonded include a hydrogen atom, a halogen atom, a hydroxyl group, an alkyl group having 1 to 20 carbon atoms, an alkenyl group, an alkynyl group, an aryl group, an amino group which can be substituted with an alkyl group and/or an aryl group, a silyl group, an alkoxy group having 1 to 20 carbon atoms, and an aryloxy group. These substituent may also further be substituted with a silyl group, an alkenyl group, an alkynyl group, an aryl group, an alkoxy group, an aryloxy group, a thioalkoxy group, an amino group which can be substituted with an alkyl group and/or an aryl group, a halogen atom, a sulfonamido group, an alkoxycarbonyl group, an amido group, a urea group, an ammonium group, an alkylammonium group, a carboxyl group or a salt thereof, a sulfo group or a salt thereof, or the like.

In addition, at least one hydrolyzable group is bonded to the silicon atom. The definition of the hydrolyzable group is as described above.

The silane coupling agent Y may contain a group represented by Formula (Z).

It is preferable that the silane coupling agent Y contains at least one nitrogen atom in a molecule thereof and the nitrogen atom is present in the form of a secondary amino group or a tertiary amino group, that is, it is preferable that the nitrogen atom has at least one organic group as a substituent. Further, with regard to the structure of the amino group, the amino group may be present in the form of a partial structure of a nitrogen-containing heterocycle in a molecule thereof, or may be present as a substituted amino group such as aniline. Here, examples of the organic group include an alkyl group, an alkenyl group, an alkynyl group, an aryl group, and a combination thereof. These organic groups may further have a substituent, and examples of the substituent which can be introduced include a silyl group, an alkenyl group, an alkynyl group, an aryl group, an alkoxy group, an aryloxy group, a thioalkoxy group, an amino group, a halogen atom, a sulfonamido group, an alkoxycarbonyl group, a carbonyloxy group, an amido group, a urea group, an alkyleneoxy group, an ammonium group, an alkylammonium group, a carboxyl group or a salt thereof, and a sulfo group.

In addition, it is preferable that the nitrogen atom is bonded to a curable functional group via an arbitrary organic linking group. Preferable examples of the organic linking group include the above-mentioned substituents which can be introduced into the nitrogen atom and the organic group bonded to the nitrogen atom.

The definition of the curable functional group contained in the silane coupling agent Y is as described above and suitable ranges thereof are as described above.

Any silane coupling agent Y is available as long as it has at least one curable functional group in a molecule thereof, but aspects in which the silane coupling agent Y has two or more curable functional groups can also be adopted. From the viewpoints of sensitivity and stability, the silane coupling agent Y more preferably has 2 to 20 curable functional groups, and more preferably has 4 to 15 curable functional groups, and in the most preferred aspect, the silane coupling agent Y has 6 to 10 curable functional groups in a molecule thereof.

Examples of the silane coupling agent Y include a compound represented by Formula (Y).

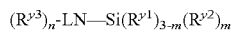  Formula (Y)

$R^{y1}$ represents an alkyl group. $R^{y2}$ represents a hydrolyzable group, and $R^{y3}$ represents a curable functional group.

LN represents a (n+)-valent linking group having a nitrogen atom.

m represents an integer of 1 to 3 and n represents an integer of 1 or more.

$R^{y1}$, $R^{y2}$, $R^{y3}$, and m in Formula (Y) have the same definitions as $R^{z1}$, $R^{z2}$, $R^{z3}$, and m in Formula (W), and preferred ranges thereof are also the same.

n in Formula (Y) represents an integer of 1 or more. The upper limit is, for example, preferably 20 or less, more preferably 15 or less, and still more preferably 10 or less. The lower limit is, for example, preferably 2 or more, more preferably 4 or more, and still more preferably 6 or more. In addition, n may represent 1.

LN in Formula (Y) represents a group having a nitrogen atom.

Examples of the group having a nitrogen atom include at least one group selected from Formulae (LN-1) to (LN-4), and a group of a combination of at least one group selected from Formulae (LN-1) to (LN-4), —CO—, —CO$_2$—, —O—, —S—, and —SO$_2$—. The alkylene group may be in any one of linear and branched forms. The alkylene group and the arylene group may be unsubstituted or may have a substituent. Examples of the substituent include a halogen atom and a hydroxyl group.

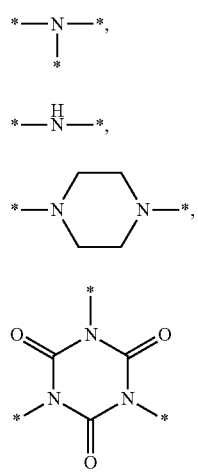

In the formulae, * represents a linking arm.

Specific examples of the silane coupling agent Y include the following compounds. In the formulae, Et represents an ethyl group. Other examples of the silane coupling agent Y include the compounds described in paragraph Nos. 0018 to 0036 of JP2009-288703A, the contents of which are incorporated herein.

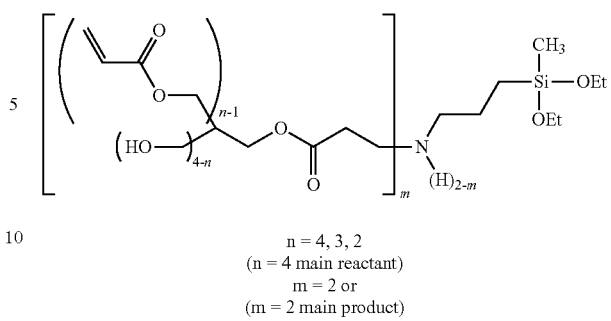

n = 4, 3, 2
(n = 4 main reactant)
m = 2 or
(m = 2 main product)

The molecular weights of the silane coupling agent X and the silane coupling agent Y are not particularly limited, but examples thereof include the above-mentioned ranges (preferably 270 or more).

The content of the silane coupling agent is preferably 0.1% to 10% by mass, more preferably 0.5% to 8% by mass, and still more preferably 1.0% to 6% by mass, with respect to the total solid content of the coloring composition of the present invention. The silane coupling agent may be used singly or in combination of two or more kinds thereof. In a case of using the silane coupling agent in combination of two or more kinds thereof, the total amount thereof falls preferably within the range.

<<Other Additives>>

Various additives, for example, a filler, an adhesion promoter, an antioxidant, an ultraviolet absorbent, an aggregation inhibitor, or the like can be blended into the coloring composition of the present invention, if desired. Examples of these additives include those described in paragraphs 0155 to 0156 of JP2004-295116A, the contents of which are incorporated herein.

The coloring composition of the present invention can contain the sensitizer or the light stabilizer described in paragraph 0078 of JP2004-295116A, or the thermal polymerization inhibitor described in paragraph 0081 of the same publication.

There are some cases where a metal element is included in the coloring composition according to raw materials and the like, but from the viewpoint of suppression of generation of defects, or the like, the content of Group 2 elements (calcium, magnesium, and the like) in the coloring composition is preferably 50 ppm or less, and preferably controlled to 0.01 to 10 ppm. Further, the total amount of the inorganic metal salts in the coloring composition is preferably 100 ppm or less, and more preferably controlled to 0.5 to 50 ppm.

The coloring composition of the present invention has a total amount of monochlorobenzene and methyl tert-butyl ether of preferably 2 ppm or less, and more preferably 1 ppm or less, with respect to the total mass of the coloring composition. It is more preferable that monochlorobenzene and methyl tert-butyl ether are substantially not contained. By adopting such a configuration, it is possible to form a coloring composition having excellent safety.

Furthermore, "monochlorobenzene and methyl tert-butyl ether being substantially not contained" means that the total amount of monochlorobenzene and methyl tert-butyl ether with respect to the total mass of the coloring composition is, for example, preferably 0.5 ppm or less, and more preferably 0.1 ppm or less, and still more preferably, monochlorobenzene and methyl tert-butyl ether are not contained.

<Preferred Aspects of Coloring Composition>
<<First Aspect>>

A preferred aspect (first aspect) of the coloring composition of the present invention is a composition including an oxime ester-based photopolymerization initiator containing a fluorine atom, a polymerizable compound having an ethylenically unsaturated double bond, an alkali-soluble resin, and a colorant, in which the coloring composition contains an organic pigment and the ratio A/B of the minimum value A of the absorbance at a wavelength in a range from 400 nm to less than 580 nm to the minimum value B of the absorbance at a wavelength in a range from 580 nm to 750 nm of the coloring composition is 0.3 to 3, and the ratio C:D of the minimum value C of the absorbance at a wavelength in a range from 400 nm to 750 nm to the maximum value D of the absorbance at a wavelength in a range from 1,000 nm to 1,300 nm of the coloring composition is 5 or more.

By using the coloring composition, a film having spectral characteristics in which the maximum value in the transmittance in a wavelength range of 400 to 700 nm is 20% or less and the minimum value in the transmittance in a wavelength range of 850 to 1,300 nm is 80% or more can be suitably formed.

The absorbance $A\lambda$ in a certain wavelength, is defined by Expression (1).

$$A\lambda = -\log(T\lambda) \quad (1)$$

$A\lambda$ is an absorbance at the wavelength $\lambda$ and $T\lambda$ is the transmittance at the wavelength $\lambda$.

In the present invention, a value of the absorbance may be a value measured in the state of a solution or a value of a film which is formed, using the coloring composition. In a case where the absorbance is measured in the state of the film, it is preferable that the film is formed by applying the coloring composition to a glass substrate using a method such as spin coating such that the thickness of the dried film is a predetermined value, and drying the applied coloring composition on a hot plate at 100° C. for 120 seconds. The thickness of the film can be obtained by measuring the thickness of the substrate having the film using a stylus surface profilometer (DEKTAK 150, manufactured by ULVAC Inc.).

In addition, the absorbance can be measured using a spectrophotometer known in the related art. The measurement conditions for the absorbance are not particularly limited, but it is preferable that the minimum value B of the absorbance at a wavelength in a range from 580 nm to 750 nm, the minimum value C of the absorbance at a wavelength in a range from 400) nm to 750 nm, the maximum value D of the absorbance at a wavelength in a range from 1,000 nm to 1,300 nm are measured under conditions which are adjusted such that the minimum value A of the absorbance at a wavelength in a range from 400 nm to less than 580 nm is 0.1 to 3.0. By measuring the absorbance under such the conditions, a measurement error can be further reduced. A method of adjusting the minimum value A of the absorbance in a wavelength range from 400 nm to less than 580 nm to be 0.1 to 3.0 is not particularly limited. For example, in a case where the absorbance is measured in the state of the coloring composition, for example, a method of adjusting the optical path length of a sample cell can be used. In addition, in a case where the absorbance is measured in the state of the film, for example, a method of adjusting the thickness of the film can be used.

Methods of measuring the spectral characteristics, the film thickness, and the like of the film formed, using the coloring composition of the present invention, are as follows.

The coloring composition of the present invention is applied to a glass substrate using a method such as spin coating such that the thickness of the dried film is a predetermined film thickness, and then dried on a hot plate at 100° C. for 120 seconds.

The thickness of the film is obtained by measuring the thickness of the dried substrate including the film using a stylus surface profilometer (DEKTAK 150, manufactured by ULVAC Inc.).

The transmittance of the dried substrate having the film is measured in a wavelength range of 300 to 1,300 nm, using a spectrophotometer of an ultraviolet-visible-near-infrared spectrophotometer (U-4100, manufactured by Hitachi High-Technologies Corporation).

In a case where the coloring composition in the first aspect is formed of a red pigment, a yellow pigment, a blue pigment, and a violet pigment, it is preferable that the mass ratio of the red pigment with respect to all the pigments is from 0.2 to 0.5, the mass ratio of the yellow pigment with respect to all the pigments is from 0.1 to 0.2, the mass ratio of the blue pigment with respect to all the pigments is from 0.25 to 0.55, and it is more preferable that the mass ratio of the violet pigment with respect to all the pigments is from 0.05 to 0.15, the mass ratio of the red pigment with respect to all the pigments is from 0.3 to 0.4, the mass ratio of the yellow pigment with respect to all the pigments is from 0.1 to 0.2, the mass ratio of the blue pigment with respect to all the pigments is from 0.3 to 0.4, and the mass ratio of the violet pigment with respect to all the pigments is from 0.05 to 0.15.

By combining the red pigment, the yellow pigment, the blue pigment, and the violet pigment as described above, a film having spectral characteristics in which the maximum value in the transmittance in a wavelength range of 400 to 700 nm is 20% or less and the minimum value in the transmittance in a wavelength range of 900 to 1,300 nm is 80% or more can be suitably formed.

Furthermore, by incorporating one or more kinds of the first colorant having maximum absorption in a wavelength range of 800 to 900 nm and two or more kinds of the second colorant having maximum absorption in a wavelength range of 400 to 700 nm into the coloring composition in the first aspect, a film having spectral characteristics in which the maximum value in the transmittance in a wavelength range of 400 to 830 nm is 20% or less and the minimum value in the transmittance in a wavelength range of 1,000 to 1,300 nm is 80% or more can be suitably formed.

As the first colorant, the above-mentioned pyrrolopyrrole compound is preferable.

It is preferable that the second colorant includes two or more kinds of pigments selected from a red pigment, a yellow pigment, a blue pigment, and a violet pigment, and it is more preferable that the second colorant includes a red pigment, a yellow pigment, a blue pigment, and a violet pigment. In the specific preferred examples, it is preferable that the second colorant includes C. I. Pigment Red 254 as a red pigment, C. I. Pigment Yellow 139 as a yellow pigment, C. I. Pigment Blue 15:6 as a blue pigment, and C. I. Pigment Violet 23 as a violet pigment.

In a case where the second colorant is obtained by combining a red pigment, a yellow pigment, a blue pigment, and a violet pigment, it is preferable that the mass ratio of the red pigment is 0.1 to 0.4 with respect to the total amount of the second colorant, a mass ratio of the yellow pigment is 0.1 to 0.4 with respect to the total amount of the second colorant, the mass ratio of the blue pigment is 0.20 to 0.60 with respect to the total amount of the second colorant, and the mass ratio of the violet pigment is 0.01 to 0.30 with respect to the total amount of the second colorant. It is more preferable that the mass ratio of the red pigment is 0.1 to 0.3 with respect to the total amount of the second colorant, the mass ratio of the yellow pigment is 0.1 to 0.3 with respect to the total amount of the second colorant, the mass ratio of the blue pigment is 0.3 to 0.5 with respect to the total amount of the second colorant, and the mass ratio of the violet pigment is 0.05 to 0.25 with respect to the total amount of the second colorant.

The first colorant is preferably contained in the amount of 10 to 200 parts by mass with respect to 100 parts by mass of the second colorant. Thus, the conditions for the absorbance of above-mentioned coloring composition can be suitably attained.

In the coloring composition of the present invention, the content of the first colorant is preferably 0% to 60% by mass, and more preferably 10% to 40% by mass, with respect to the total solid content of the coloring composition. The content of the second colorant is preferably 10% to 60% by mass, and more preferably 30% to 50% by mass, with respect to the total solid content of the coloring composition. The total amount of the first colorant and the second colorant is preferably 1% to 80% by mass, more preferably 20% to 70% by mass, and still more preferably 30% to 70% by mass, with respect to the total solid content of the coloring composition.

<<Second Aspect>>

A preferred aspect (second aspect) of the coloring composition of the present invention is a composition including an oxime ester-based photopolymerization initiator containing a fluorine atom, a polymerizable compound having an ethylenically unsaturated double bond, an alkali-soluble resin, and a colorant, in which the composition further includes a curable compound having a fluorine atom and a curable functional group.

By using such a coloring composition, a cured film having excellent adhesiveness to a support as well as low reflectivity can be formed.

In addition, in this aspect, it is preferable that a black pigment is included as the colorant. By incorporating the black pigment into the coloring composition in the second aspect, a cured film having excellent performance as a light-shielding film is easily formed.

In the second aspect, the content of the black pigment is preferably 20% to 80% by mass, more preferably 30% to 70% by mass, and still more preferably 35% to 60% by mass, with respect to the total solid content of the coloring composition.

<<Third Aspect>>

A preferred aspect (third aspect) of the coloring composition of the present invention is a composition including an oxime ester-based photopolymerization initiator containing a fluorine atom, a polymerizable compound having an ethylenically unsaturated double bond, an alkali-soluble resin, and a colorant, in which the composition further includes an α-aminoketone-based photopolymerization initiator, and the mass ratio of the oxime ester-based photopolymerization initiator containing a fluorine atom to the α-aminoketone-based photopolymerization initiator is 1:1.5 to 1:10.

By using such a coloring composition, a cured film having excellent adhesiveness to a support as well as excellent rectangularity can be formed.

<<Fourth Aspect>>

A preferred aspect (fourth aspect) of the coloring composition of the present invention is a composition including an oxime ester-based photopolymerization initiator containing a fluorine atom, a polymerizable compound having an ethylenically unsaturated double bond, an alkali-soluble resin, and a colorant, in which the composition further includes an oxime-based photopolymerization initiator (another oxime-based photopolymerization initiator) other than a fluorine-containing oxime ester-based photopolymerization initiator. By using such a coloring composition, a cured film having excellent sensitivity and adhesiveness as well as suppressed decoloration is easily produced.

<Method for Preparing Coloring Composition>

The coloring composition of the present invention can be prepared by mixing the above-mentioned components.

During the preparation of the coloring composition, the respective components constituting the coloring composition may be blended together at the same time or may be blended together sequentially after being dissolved and dispersed in a solvent. Further, the order of the components to be introduced or the operational conditions during the blending is not particularly limited. For example, the composition may be prepared by dissolving or dispersing all the components in a solvent at the same time, or by appropriately leaving the respective components in two or more solutions/dispersion liquids, and mixing them into a solution during the use (during the coating), as desired.

It is preferable that the coloring composition of the present invention is filtered using a filter for the purpose of removing foreign matters, reducing defects, or the like. As the filter, any filters that have been used in the related art for filtration use and the like may be used without particular limitation. Examples of the filter include filters formed of a fluorine resin such as polytetrafluoroethylene (PTFE), a polyamide-based resin such as Nylon-6 and Nylon-6,6, and a polyolefin resin (including a high density and a ultrahigh molecular weight) such as polyethylene and polypropylene (PP). Among these materials, polypropylene (including high-density polypropylene) is preferable.

The pore diameter of the filter is suitably approximately 0.01 to 7.0 μm, preferably approximately 0.01 to 3.0 μm, and more preferably approximately 0.05 to 0.5 μm. By setting the pore diameter of the filter to the range, it is possible to reliably remove fine foreign matters, which interfere with the preparation of a uniform and smooth coloring composition in the later steps.

In a case of using the filter, different filters may be combined. Here, the filtration through the first filter may be run once, or may be repeated twice or more times.

Incidentally, the first filters having different pore diameters within the range may be combined. With regard to the pore diameter of the filter herein, reference can be made to nominal values of filter manufacturers. A commercially available filter may be selected from various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, or the like, for example.

As the second filter, those formed of the same material as that of the above-described first filter may be used.

For example, the filtration through the first filter may be carried out with only a dispersion liquid, the other components may be mixed, and then the filtration through the second filter may be carried out.

<Cured Film and Pattern Forming Method>

Next, the cured film and the pattern forming method of the present invention will be described.

The cured film of the present invention is formed, using the coloring composition of the present invention. The cured film of the present invention can be preferably used as a color filter or a light-shielding film.

The color filter can be suitably used for a solid-state imaging device such as a charge coupled device (CCD) and a complementary metal-oxide semiconductor (CMOS), and is particularly suitable for a CCD, a CMOS, and the like with a high resolution, having more than 1,000,000 pixels. The color filter can be used as, for example, a color filter disposed between a light receiving portion of each pixel constituting a CCD or a CMOS and a microlens for collecting light.

Furthermore, the color filter can be preferably used for an organic electroluminescence (organic EL) element. As the organic EL element, a white organic EL element is preferable. The organic EL element preferably has a tandem structure. The tandem structure of the organic EL element is described in JP2003-45676A, "Forefront of Organic EL Technology Development—Know-How Collection of High Brightness/High Precision/Long Life-", reviewed by Mikami Akiyoshi, Technical Information Institute, pp. 326 to 328, 2008, and the like. Examples of the tandem structure of the organic EL element include a structure in which an organic EL layer is provided between a lower electrode with light reflectivity and an upper electrode with light-transmitting properties on one side of a substrate. The lower electrode is preferably configured with a material having a sufficient reflectivity in a visible light wavelength range. The organic EL layer preferably has a lamination structure (tandem structure) including a plurality of light emitting layers, with the plurality of the light emitting layers laminated. The plurality of light emitting layers of the organic EL layer can include, for example, a red light emitting layer, a green light emitting layer, and a blue light emitting layer. Further, the organic EL layer preferably has a plurality of light emitting auxiliary layers for light emission of the light emitting layers, in addition to the plurality of light emitting layers. The organic EL layer can have, for example, a lamination structure in which a light emitting layer and a light emitting auxiliary layer are alternately laminated. An organic EL element having an organic EL layer such a structure can emit white light. In this case, it is preferable that a spectrum of white light which the organic EL element emits has strong maximum light emitting peaks at a blue region (430 nm to 485 nm), a green region (530 nm to 580 nm), and a yellow region (580 nm to 620 nm). It is more preferable that the spectrum additionally has a strong maximum light emitting peak at a red region (650 nm to 700 nm), in addition to the light emitting peaks. By combining an organic EL element (white organic EL element) that emits white light with the color filter of the present invention, an excellent spectrum in terms of color reproducibility is obtained, and thus, a clearer image or image can be displayed.

The film thickness of the colored pattern (colored pixel) in the color filter is preferably 2.0 µm or less, more preferably 1.0 µm or less, and still more preferably 0.7 µm or less. The lower limit can be set to, for example, 0.1 µm or more, or also to 0.2 µm or more. Incidentally, the size (pattern width) of the colored pattern (colored pixel) is preferably 2.5 µm or less, more preferably 2.0 µm or less, and particularly preferably 1.7 µm or less. The lower limit can be set to, for example, 0.1 µm or more, or also to 0.2 µm or more.

The light-shielding film can be used after being formed in various members (for example, an infrared cut filter, a peripheral portion of a solid-state imaging device, a peripheral portion of a wafer level lens, and a backside of a solid-state imaging device), or the like in an image display device or a sensor module.

In addition, a light-shielding film may be formed in at least a portion on the surface of an infrared cut filter to provide an infrared cut filter with a light-shielding film.

The thickness of the light-shielding film is not particularly limited, but is preferably 0.2 to 25 µm, and more preferably 1.0 to 10 µm. The thickness is an average thickness, which is a value obtained by measuring the thickness at arbitrary 5 or more points of the light-shielding film, and arithmetically averaging the values.

The reflectivity of the light-shielding film is preferably 10% or less, more preferably 8% or less, still more preferably 6% or less, and particularly preferably 4% or less. Further, reflectivity of the light-shielding film is a value by making light at 400 to 700 nm be incident onto the light-shielding film at an angle of incidence of 50, and measuring the reflectivity using a spectrometer UV4100 (trade name) manufactured by HITACHI High-Technologies Corporation.

<Pattern Forming Method>

Next, the pattern forming method of the present invention will be described.

In the pattern forming method of the present invention, production can be carried out by performing forming a coloring composition layer on a support, using the coloring composition of the present invention, exposing the coloring composition layer patternwise, and removing the unexposed area of the coloring composition layer by development to form a colored pattern. In addition, baking the coloring composition layer (pre-baking step), and baking the formed colored pattern (post-baking step) may be provided, as desired. The details of the respective steps will be described below.

<<Forming Coloring Composition Layer>>

In the forming a coloring composition layer, the coloring composition of the present invention is used to form a coloring composition layer on a support.

Examples of the support include transparent substrates such as glass, silicon, polycarbonate, polyester, aromatic polyamide, polyamideimide, and polyimide. A thin-film transistor for driving an organic EL element may be formed on these transparent substrates.

Furthermore, it is possible to use a substrate for a solid-state imaging device in which a solid-state imaging device (light-receiving element) such as a charge coupled device (CCD) and a complementary metal-oxide semiconductor (CMOS) is provided onto a substrate.

As the method for applying the coloring composition of the present invention onto the support, various coating methods such as slit coating, an ink jet method, spin coating, cast coating, roll coating, and a screen printing method can be applied.

The coloring composition layer formed on the support is preferably heated (pre-baked). Heating is carried out at preferably 120° C. or lower, more preferably 50° C. to 120° C., still more preferably 80° C. to 110° C., and particularly preferably 90° C. to 105° C. By carrying out heating at 120° C. or lower, characteristics can be more effectively maintained in the case of using an organic EL element as a light-emitting light source of an image display device or in the case of a configuration in which a photo-electric conversion film of an image sensor is formed of organic materials.

The heating time in this case is preferably 10 seconds to 300 seconds, more preferably 40 seconds to 250 seconds, and still more preferably 80 seconds to 220 seconds. Heating can be carried out using a hot plate, an oven, or the like.

<<<Exposing Step>>>

Next, the coloring composition layer formed on the support is patternwise exposed (exposing step). For example, the coloring composition layer formed on the support can be subjected to patternwise exposure using, for example, an exposure device such as a stepper through a mask having a predetermined mask pattern. Thus, the exposed portion can be cured.

As the radiation (light) which can be used during the exposure, ultraviolet rays such as a g-ray and an i-ray (particularly preferably an i-ray) are preferably used. The irradiation dose (exposure dose) is, for example, preferably 30 to 1,500 mJ/cm$^2$, more preferably 50 to 1,000 mJ/cm$^2$, and most preferably 50 to 500 mJ/cm$^2$. From the viewpoint of satisfying both production with low energy and stable productivity, the range is preferable.

The oxygen concentration during the exposure can be appropriately selected, and may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume). Further, the exposure illuminance can be appropriately set, and can be usually selected from a range of 1,000 W/m$^2$ to 100,000 W/m$^2$ (for example, 5,000 W/m$^2$, 15.000 W/m$^2$, or 35,000 W/m). Appropriate conditions of each of the oxygen concentration and the illuminance of exposure energy may be combined, and for example, a combination of the oxygen concentration of 10% by volume and the illuminance of 10,000 W/m$^2$, a combination of the oxygen concentration of 25% by volume and the illuminance of 25,000 W/m$^2$, or the like is available.

The film thickness of the cured film is preferably 1.0 µm or less, more preferably 0.1 to 0.9 µm, and still more preferably 0.2 to 0.8 µm. By setting the film thickness to 1.0 µm or less, high resolution and high adhesiveness are easily obtained.

<<<Developing Step>>>

Next, the unexposed area is removed by development to form a colored pattern. The removal of the unexposed area by development can be carried out using a developer. Thus, coloring composition layer of the unexposed area in the exposing step is eluted into the developer, and as a result, only a photocured portion remains.

As the developer, an organic alkaline developer causing no damage on the underlying solid-state imaging device or a circuit is desirable.

The temperature of the developer is preferably for example, 20° C. to 30° C., and the development time is preferably 20 to 180 seconds.

Examples of the alkali agent used for the developer include organic alkaline compounds such as aqueous ammonia, ethylamine, diethylamine, dimethylethanolamine, tetramethylammonium hydroxide, tetraethylammonium hydroxide, tetrapropylammoniumhydroxide, tetrabutylammoniumhydroxide, benzyltrimethylammonium hydroxide, choline, pyrrole, piperidine, and 1,8-diazabicyclo-[5,4,0]-7-undecene. An aqueous alkaline solution obtained by diluting the alkali agent with pure water to have a concentration of 0.001% to 10% by mass, and preferably 0.01% to 1% by mass is preferably used as the developer.

In addition, an inorganic alkali may be used in a developer. Preferred examples of the inorganic alkali include sodium hydroxide, potassium hydroxide, sodium carbonate, sodium hydrogen carbonate, sodium silicate, and sodium metasilicate.

Moreover, a surfactant may also be used in the developer. Examples of the surfactant include the surfactants described as the above-mentioned coloring composition, with a nonionic surfactant being preferable.

Incidentally, in a case where a developer formed of such an aqueous alkaline solution is used, it is preferable that cleaning (rinsing) with pure water is generally performed after development.

After development, it is preferable to carry out a heating treatment (post-baking) after carrying out drying. In a case of forming a multicolor colored pattern, a cured film can be produced by repeating the respective steps sequentially per color, thereby obtaining a color filter.

The post-baking is a heating treatment after development so as to accelerate curing, and the heat temperature is, for example, preferably 100° C. to 240° C. Further, in a case of using an organic electroluminescence (organic EL) element as a light-emitting light source of an image display device or a case of constituting a photo-electric conversion film of an image sensor with organic materials, the heating treatment (post-baking) is preferably carried out at 50° C. to 120° C. (more preferably 80° C. to 100° C., and still more preferably 80° C. to 90° C.).

The post-baking treatment can be carried out continuously or batchwise by using a heating unit such as a hot plate, a convection oven (hot-air circulating dryer), and a high-frequency heater so that the film after development satisfies the conditions.

Moreover, in a case of using the above-mentioned coloring composition including a fluorine-containing oxime ester-based photopolymerization initiator and an α-aminoketone-based photopolymerization initiator, it is also preferable that in the exposing step, exposure is carried out with light at a wavelength of more than 350 nm and 380 nm or less (preferably light at a wavelength of 355 to 370 nm, and particularly preferably an i-ray), and the coloring composition layer after the developing step is subjected to exposure with light at a wavelength of 254 to 350 nm (preferably light at a wavelength of 254 nm).

In addition, the difference between the wavelength of the light used in the exposure before the developing step and the wavelength of the light used in the exposure after the developing step as described above is preferably 200 nm or less, and more preferably 100 to 150 nm or less.

By exposing the coloring composition layer in two stages before the developing step and after the developing step, the coloring composition can be suitably cured by the initial exposure, and the entire coloring composition can be approximately cured by the next exposure. As a result, the curability of the coloring composition can be improved even under a low-temperature condition not involving post-baking at approximately 210° C., and the solvent resistance of the color filter can also be enhanced. In addition, a mixture of colors with other colors can also be suppressed.

The irradiation dose (exposure dose) of light at a wavelength of more than 350 nm and 380 nm or less in the exposure before the developing step and the oxygen concentration during the exposure can be used under the conditions described for above-mentioned exposing step.

Furthermore, the reaction rate of the polymerizable compound in the exposure before the developing step is preferably 30% to 60. By using such the reaction rate, the polymerizable compound can be in the state of being suitably cured. Here, the reaction rate of the compound having the polymerizable compound refers to the rate of the reacted unsaturated double bonds in all the unsaturated double bonds included in the polymerizable compound.

The irradiation dose (exposure dose) of the light at a wavelength of 254 to 300 nm in the exposure after the developing step is preferably 30 mJ/cm$^2$ to 4,000 mJ/cm$^2$, and more preferably 50 mJ/cm$^2$ to 3,500 mJ/cm$^2$.

In addition, the reaction rate of the polymerizable compound in the exposure after the developing step is preferably 60% to 90%. By using such the reaction rate, the cured state of the coloring composition layer after the exposure can further be enhanced.

Also in this aspect, the exposure after the developing step can be carried out and then post-baking can further be carried out. However, in a case where an organic EL element is used as a light-emitting light source of an image display device or in the case of a configuration in which a photoelectric conversion film of an image sensor is formed of organic materials, a heating treatment (post-baking) is preferably carried out at 50° C. to 120° C. (more preferably 80° C. to 100° C. and still more preferably 80° C. to 90° C.).

<Solid-State Imaging Device>

The solid-state imaging device of the present invention includes the cured film (the color filter, the light-shielding film, or the like) of the present invention as described above. The configuration of the solid-state imaging device of the present invention is not particularly limited as long as the solid-state imaging device is configured to include the cured film in the present invention and function as a solid-state imaging device. However, examples thereof include the following configuration.

The solid-state imaging device has "a plurality of photodiodes" constituting a light receiving area of a solid-state imaging device (a CCD image sensor, a CMOS image sensor, or the like) and "a transfer electrode formed of polysilicon or the like", on a support. A light-shielding film having openings only over the light receiving portion of the photodiode is provided on the photodiodes and the transfer electrodes. A device protecting film formed of silicon nitride or the like, which is formed to cover the entire surface of the light-shielding film and the light receiving portion of the photodiodes, is provided on the light-shielding film. Further, a color filter is provided on the device protecting film. In addition, the solid-state imaging device may have a light collecting means (for example, a microlens, the same applies hereinafter) disposed under the color filter (a side closer to the support) or on the color filter, on the device protecting film.

<Image Display Device>

The cured film (the color filter, the light-shielding film, or the like) of the present invention can be used for an image display device such as a liquid crystal display device and an organic electroluminescence display device.

The definition of display devices or the details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color Thin Film Transistor (TFT) system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching mode such as In Plane Switching (IPS), a pixel division system such as Multi-domain Vertical Alignment (MVA), or the like, or to Super-Twist Nematic (STN), Twisted Nematic (TN). Vertical Alignment (VA), on-chip spacer (OCS), fringe field switching (FFS), Reflective Optically Compensated Bend (R-OCB), and the like.

In addition, the color filter in the present invention can be provided to a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a peeling solution in some cases, in addition to the generally required characteristics as described above. Since the color filter of the present invention has excellent light resistance or the like, a liquid crystal display device in a COA system which has high resolution and excellent long-term durability can be provided. In addition, in order to satisfy the characteristics required for a low dielectric constant, a resin-coated film may be provided on the color filter layer.

These image display systems are described in, for example, p. 43 of "EL, PDP and LCD Display—Technologies and Recent Trend in Market—(TORAY RESEARCH CENTER, Research Department, published in 2001)", and the like.

The image display device of the present invention is constituted with various members such as an electrode substrate, a polarizing film, a retardation film, a backlight, a spacer, and a view angle compensation film, in addition to the color filter of the present invention. The color filter of the present invention can be applied to a liquid crystal display device constituted with these known members. These members are described in, for example, "'94 Market of Peripheral Materials And Chemicals of Liquid Crystal Display (Kentaro Shima, CMC Publishing Co., Ltd., published in 1994)" and "2003 Current Situation of Market Relating to Liquid Crystal and Prospects (Vol. 2) (Ryokichi Omote, Fuji Chimera Research Institute, Inc., published in 2003)".

The backlight is described in SID Meeting Digest 1380 (2005) (A. Konno. et al.), December Issue of Monthly "Display", 2005, pp. 18 to 24 (Yasuhiro Shima) and pp. 25 to 30 (Takaaki Yagi) of the document, and the like.

<Infrared Sensor>

The infrared sensor of the present invention includes the cured film of the present invention. The configuration of the infrared sensor of the present invention is a configuration including the cured film of the present invention, and is not particularly limited as long as it is a configuration for functioning as a solid-state imaging device. However, examples thereof include the following configuration.

The infrared sensor has "a plurality of photodiodes" constituting a light receiving area of a solid-state imaging device (a CCD sensor, a CMOS sensor, an organic CMOS sensor, or the like) and "a transfer electrode formed of polysilicon or the like", on a substrate. The infrared sensor has a light-shielding film formed of tungsten or the like onto the photodiodes and the transfer electrodes, which has openings only over the light receiving portion of the photodiode. The infrared sensor also has a device protecting layer formed of silicon nitride or the like, which is formed to cover the entire surface of the light-shielding film and the light receiving portion of the photodiodes, on the light-shielding film. The infrared sensor has the cured film of the present invention on the device protecting film.

In addition, the infrared sensor may have a light collecting means (for example, a microlens, the same applies hereinafter) disposed on the device protecting film and under the cured film of the present invention (a side closer to the substrate), or may have a light collecting means on the cured film of the present invention.

Hereinafter, one embodiment of the infrared sensor of the present invention will be described with reference to FIG. 2.

An infrared sensor 100 has a solid-state imaging device 110.

An imaging area provided on the solid-state imaging device 110 has a near-infrared absorption filter 111 and a color filter 112.

The near-infrared absorption filter 111 is configured by transmitting light in the visible light region (for example, light at a wavelength of 400 to 700 nm) and shielding light in the infrared light region (for example, light at a wavelength of 800 to 1,300 nm, preferably light at a wavelength of 900 to 1,200 nm, and still more preferably light at a wavelength of 900 to 1,000 nm).

The color filter 112 is used as a color filter in which pixels transmitting and absorbing light at a specific wavelength in the visible light region and absorbing are formed, and for example, color filters in which red, green, and blue pixels are formed are used. The color filter can be formed using the cured film of the present invention.

A region 114 in which the near-infrared absorption filter 111 is not formed is provided between a near-infrared transmitting filter 113 and the solid-state imaging device 110. Resin layers (for example, a transparent resin layer) through which light at a wavelength that transmits the near-infrared transmitting filter 113 can be transmitted are provided on the region 114.

The near-infrared transmitting filter 113 is a filter which has a visible light shielding property and transmits infrared light at a specific wavelength. The near-infrared transmitting filter 113 is constituted with a cured film of the present invention having the above-mentioned spectrum.

Microlenses 115 are provided on an incidence-ray hυ side of the color filter 112 and the near-infrared transmitting filter 113. A planarizing layer 116 is formed so as to cover the microlenses 115.

Figure 2:
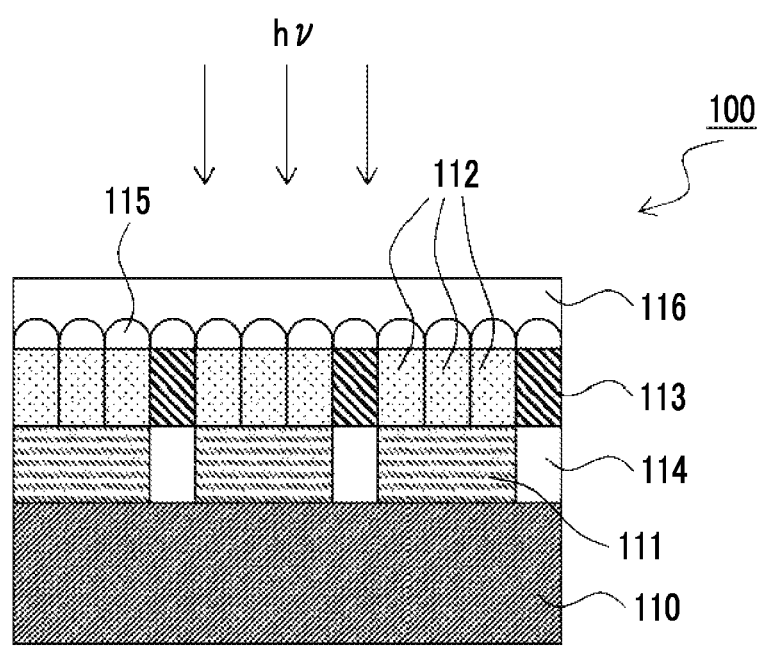
FIG. 2 is a schematic cross-sectional view showing the configuration of an infrared sensor.

According to the embodiment illustrated in FIG. 2, the resin layer is provided in the region 114, but the infrared light-transmitting filter 113 may also be formed in the region 114. That is, the infrared light-transmitting filter 113 may also be formed on the solid-state imaging device 110.

According to the embodiment illustrated in FIG. 2, the film thicknesses of the color filter 112 and the film thicknesses of the infrared transmitting filter 113 are the same, but film thicknesses of the both may be different from each other.

In addition, according to the embodiment illustrated in FIG. 2, the color filter 112 is provided to be closer to the incidence-ray hυ side than the near-infrared absorption filter 111, but the near-infrared absorption filter 111 side may be provided to be closer to the incidence-ray hυ side than the color filter 112 by changing the order of the near-infrared absorption filter 111 and the color filter 112.

Furthermore, according to the embodiment illustrated in FIG. 2, the near-infrared absorption filter 111 and the color filter 112 are laminated to be adjacent to each other, but both of the filters are not necessary to be adjacent to each other and another layer may be interposed therebetween.

According to this infrared sensor, since the image information can be read at the same time, it is possible to perform motion sensing that recognizes a subject detecting a motion, and the like. In addition, since the distance information can be acquired, it is also possible to take images including three-dimensional information, and the like.

EXAMPLES

Hereinbelow, the present invention will be described in more detail with reference to Examples. However, the present invention is not intended to be limited to Examples shown below while not departing from the spirit of the present invention. Further, "part(s)" and "%" are given on the basis of mass unless otherwise specifically stated.

(Measurement of Optical Density (OD Value))

The optical density of a film is determined by making light at a wavelength of 365 nm be incident, and measuring the transmittance thereof using a spectrometer UV4100 (trade name) manufactured by HITACHI High-Technologies Corporation.

(Measurement of Weight-Average Molecular Weight)

The weight-average molecular weight (Mw) is measured under the following conditions.

Types of columns: TSKgel Super AWM-H (manufactured by Tosoh Corporation, 6.0 mm ID (inner diameter)×15.0 cm)

Developing solvent: 10 mmol/L Lithium bromide N-methylpyrrolidinone (NMP) solution Column temperature: 25° C. Flow amount (amount of a sample to be injected): 0.6 mL/min Name of a device: HLC-8220 (manufactured by Tosoh Corporation) Calibration curve base resin: Polystyrene resin Test Example 1

A mixed solution having the following composition was mixed for 2 hours, using a beads mill (a high-pressure dispersing machine with pressure reducing mechanism, NANO-3000-10 (manufactured by Nippon BEE Chemical Co., Ltd.)) with zirconia beads having a diameter of 0.3 mm, to prepare pigment dispersion liquids 1 to 4.

[Composition of Pigment Dispersion Liquid 1]
C. I. Pigment Green 58 . . . 3.5 parts
Basic resin 1 . . . 2.1 parts
Organic solvent 1 . . . 22.75 parts
[Composition of Pigment Dispersion Liquid 2]
C. I. Pigment Green 36 . . . 3.9 parts
C. I. Pigment Yellow 150 . . . 0.6 parts
C. I. Pigment Yellow 185 . . . 0.2 parts
C. I. Pigment Yellow 138, sulfonated product . . . 0.5 parts
Amphoteric resin 1 . . . 1.6 parts
Resin A1 . . . 1.6 parts
Organic solvent 1 . . . 25.0 parts
[Composition of Pigment Dispersion Liquid 3]
C. I. Pigment Yellow 150 . . . 1.6 parts
Acidic resin 1 . . . 1.2 parts
Organic solvent 1 . . . 9.2 parts
Organic solvent 2 . . . 1.6 parts

[Composition of Pigment Dispersion Liquid 4]
C. I. Pigment Yellow 139 . . . 2.1 parts
Resin A1 . . . 0.4 parts
Amphoteric resin 2 . . . 0.4 parts
Organic solvent 1 . . . 13.5 parts
Resin A1: The following structure (The numeral value shown in each repeating unit represents the content [mass ratio] of each repeating unit. Mw=11,000)
This resin was synthesized by the method described in paragraphs 0304 to 0307 of JP2012-173356A. The resin A1 is also an alkali-soluble resin.

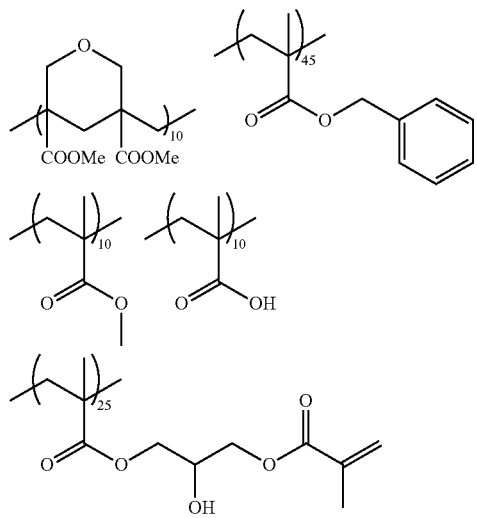

Basic resin 1: (product name: Diperbyk162, manufactured by BYK Chemie, amine value: 13 mgKOH/g)
Acidic resin 1: (product name: Diperbyk111, manufactured by BYK Chemie, acid value: 129 mgKOH/g)
Amphoteric resin 1: The following structure (The numeral value shown in each repeating unit represents the content [mass ratio] of each repeating unit. The numeral value shown in the repeating site of the side chain represents the repetition number of repeating sites. Acid value: 32.3 mgKOH/g, amine value: 45.0 mgKOH/g, and Mw=9,000)

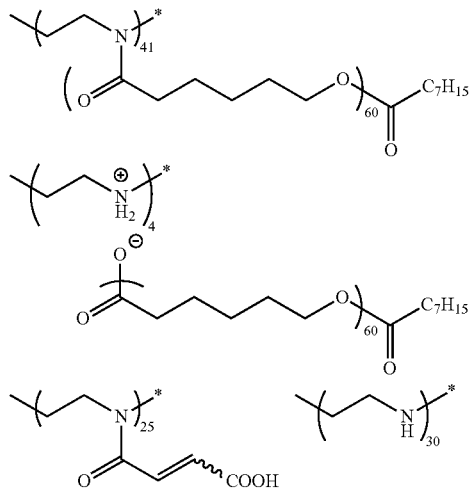

Amphoteric resin 2: The following structure (The numeral value shown in each repeating unit represents the content [mass ratio] of each repeating unit. The numeral value shown in the repeating site of the side chain represents the repetition number of repeating sites. Acid value: 44.3 mgKOH/g, amine value: 40.0 mgKOH/g, and Mw=10,400)

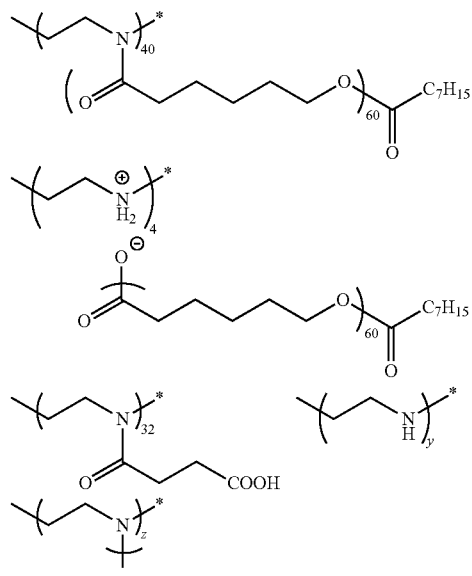

$(y+z) = 24$

Organic solvent 1: Propylene glycol methyl ether acetate
Organic solvent 2: Cyclohexanone

[Preparation of Coloring Composition]

The raw materials shown in Table 1 below were mixed and stirred at the ratio (parts by mass) shown in Table 1 below, and then filtered using a nylon-made filter having a pore diameter of 0.45 μm (DFA420 INXEY, manufactured by Nihon Pall Ltd.) to prepare a coloring composition.

(Manufacture of Color Filter)

The obtained coloring composition was applied onto a 200-mm (8-inch) silicon wafer (substrate) onto which hexamethyldisilazane had been sprayed in advance, thereby forming a coating film. Further, a heating treatment (prebaking) has been carried out such that the film thickness after drying of this coating film became 2.0 μm, for 150 seconds, using a hot plate at 90° C.

Then, the coating film was exposed through an island pattern mask with a square pattern having a side length of 3.0 μm at a wavelength of 365 nm, using an i-ray stepper exposure device FPA-3000i5+ (manufactured by Canon Inc.). The exposure conditions were as follows: various exposure doses of 50 to 1,200 mJ/cm$^2$, an illuminance of 10,000 W. and an atmospheric condition (oxygen concentration of 21% by volume).

Thereafter, the silicon wafer having the exposed coating film formed thereon was placed on a horizontal rotary table of a spin-shower developing machine (DW-30 Type, manufactured by Chemitronics Co., Ltd.), and subjected to puddle development at 23° C. for 60 seconds, using CD-2000 (manufactured by Fujifilm Electronic Materials Co., Ltd.), thereby forming a colored pattern (square pixel pattern having a side length of 3.0 μm) on the silicon wafer with an undercoat layer.

The silicon wafer having the colored pattern formed thereon was fixed on the horizontal rotary table in a vacuum chuck system, and while the silicon wafer was rotated at a rotation speed of 50 rpm using a rotation device, pure water was supplied onto the wafer from a spray nozzle in the form of a shower from the position above the rotation center, so as to carry out a rinsing treatment. Thereafter, the silicon wafer was spray-dried.

The obtained silicon wafer was irradiated with ultraviolet rays at an exposure dose of 10 J, using a UV Curing Device UMA-802-HC552FFAL (manufactured by Ushio Inc).

By the above procedure, a color filter (silicon wafer with a colored pattern) was obtained.

(Evaluation of Sensitivity)

An optimum exposure dose (mJ) that resolved the colored pattern (square pixel patterns having a side length of 3.0 μm) was determined and defined as sensitivity.

(Evaluation of Adhesion Sensitivity)

The silicon wafer, whose sensitivity had been evaluated above, was observed with an optical microscope, and a lowest exposure dose (mJ) at which the square pixel pattern having a side length of 3.0 μm was not peeled at all was determined and defined as adhesion sensitivity.

(Evaluation of Rectangularity)

The cross-section of the silicon wafer, whose sensitivity had been evaluated above, was observed with a scanning electron microscope, and the angle of the square pixel pattern having a side length of 3.0 μm, formed at an optimum exposure dose, with respect to the surface of the silicon wafer was measured and evaluated in accordance with the following evaluation standard.

"3": The angle of the sidewall is 80° or more and less than 100°.

"2": The angle of the sidewall is 70° or more and less than 80°, or 100° or more and less than 110°.

"1": The angle of the sidewall is less than 70°, or 110° or more.

(Evaluation of Temporal Stability)

The obtained coloring composition was stored at room temperature (25° C.) for one month. Using the coloring compositions before and after storage at room temperature for one month, the color filters were manufactured. As the exposure dose, an optimum exposure dose before the storage at room temperature for one month was used. The difference in the pixel line width of the manufactured color filter was measured and the temporal stability was evaluated in accordance with the following evaluation standard.

"3": The variation in the pixel line width before and after storage at room temperature for one month is less than 0.10 μm.

"2": The variation in the pixel line width before and after storage at room temperature for one month is 0.10 μm or more and less than 0.15 μm.

"1": The variation in the pixel line width before and after storage at room temperature for one month is 0.15 μm or more.

TABLE 1

| | Example 1-1 | Example 1-2 | Example 1-3 | Example 1-4 | Example 1-5 | Example 1-6 | Example 1-7 | Example 1-8 |
|---|---|---|---|---|---|---|---|---|
| Pigment dispersion liquid 1 | 28.3 | 28.3 | 28.3 | 28.3 | 28.3 | 28.3 | 28.3 | 28.3 |
| Pigment dispersion liquid 2 | 32.2 | 32.2 | 32.2 | 32.2 | 32.2 | 32.2 | 32.2 | 32.2 |
| Pigment dispersion liquid 3 | 13.6 | 13.6 | 13.6 | 13.6 | 13.6 | 13.6 | 13.6 | 13.6 |
| Pigment dispersion liquid 4 | 16.4 | 16.4 | 16.4 | 16.4 | 16.4 | 16.4 | 16.4 | 16.4 |
| Alkali-soluble resin 1 | 0.2 | 0.2 | 0.2 | 0.2 | 0.2 | 0.2 | 0.2 | 0.2 |
| Alkali-soluble resin 2 | | | | | | | | |
| Polymerizable compound 1 | | | | | | | 4 | |
| Polymerizable compound 3 | | | | | | | | 2 |
| Polymerizable compound 4 | | | | | | | | 2 |
| Polymerizable compound 5 | 4 | 4 | 4 | 4 | 4 | 4 | | 4 |
| Epoxy compound | 0.8 | 0.8 | 0.8 | 0.8 | 0.8 | 0.8 | 0.8 | 0.8 |
| Photopolymerization initiator A1 | 0.3 | | | 1.2 | 0.1 | 0.3 | 0.3 | 0.3 |
| Photopolymerization initiator A2 | | 0.3 | | | | | | |
| Photopolymerization initiator A3 | | | 0.3 | | | | | |
| Photopolymerization initiator 2 | | | | | | | | |
| Photopolymerization initiator 2B | | | | | | | | |
| Photopolymerization initiator 3 | 1.2 | 1.2 | 1.2 | 0.3 | 1.4 | | 1.2 | 1.2 |
| Photopolymerization initiator 3B | | | | | | 1.2 | | |
| Photopolymerization initiator 4 | | | | | | | | |
| Polymerization inhibitor | 0.002 | 0.002 | 0.002 | 0.002 | 0.002 | 0.002 | 0.002 | 0.002 |
| Silane coupling agent | 0.8 | 0.8 | 0.8 | 0.8 | 0.8 | 0.8 | 0.8 | 0.8 |
| Surfactant | 0.008 | 0.008 | 0.008 | 0.008 | 0.008 | 0.008 | 0.008 | 0.008 |
| Organic solvent 2 | 3.5 | 3.5 | 3.5 | 3.5 | 3.5 | 3.5 | 3.5 | 3.5 |
| Evaluation OD value | 2.3 | 2.3 | 2.3 | 2.3 | 2.3 | 2.3 | 2.3 | 2.3 |
| Sensitivity | 200 | 200 | 200 | 200 | 300 | 250 | 250 | 300 |
| Adhesion sensitivity | 150 | 175 | 175 | 150 | 300 | 200 | 200 | 200 |
| Rectangularity | 3 | 3 | 3 | 2 | 3 | 3 | 3 | 3 |
| Temporal stability | 3 | 3 | 3 | 3 | 3 | 3 | 3 | 3 |

| | Example 1-9 | Example 1-10 | Comparative Example 1-1 | Comparative Example 1-2 | Comparative Example 1-3 | Comparative Example 1-4 |
|---|---|---|---|---|---|---|
| Pigment dispersion liquid 1 | 28.3 | 28.3 | 28.3 | 28.3 | 28.3 | 28.3 |
| Pigment dispersion liquid 2 | 32.2 | 32.2 | 32.2 | 32.2 | 32.2 | 32.2 |
| Pigment dispersion liquid 3 | 13.6 | 13.6 | 13.6 | 13.6 | 13.6 | 13.6 |
| Pigment dispersion liquid 4 | 16.4 | 16.4 | 16.4 | 16.4 | 16.4 | 16.4 |
| Alkali-soluble resin 1 | | 0.2 | 0.2 | 0.2 | 0.2 | 0.2 |
| Alkali-soluble resin 2 | 0.2 | | | | | |
| Polymerizable compound 1 | | | | | | |
| Polymerizable compound 3 | | | | | | |

TABLE 1-continued

| | | | | | | |
|---|---|---|---|---|---|---|
| Polymerizable compound 4 | | | | | | |
| Polymerizable compound 5 | 4 | 4 | 4 | 4 | 4 | 4 |
| Epoxy compound | 0.8 | 0.8 | 0.8 | 0.8 | 0.8 | 0.8 |
| Photopolymerization initiator A1 | 0.3 | 0.3 | | | | |
| Photopolymerization initiator A2 | | | | | | |
| Photopolymerization initiator A3 | | | | | | |
| Photopolymerization initiator 2 | | 1.2 | 1.5 | | | |
| Photopolymerization initiator 2B | | | | 1.5 | | |
| Photopolymerization initiator 3 | 1.2 | | | | 1.5 | |
| Photopolymerization initiator 3B | | | | | | |
| Photopolymerization initiator 4 | | | | | | 1.5 |
| Polymerization inhibitor | 0.002 | 0.002 | 0.002 | 0.002 | 0.002 | 0.002 |
| Silane coupling agent | 0.8 | 0.8 | 0.8 | 0.8 | 0.8 | 0.8 |
| Surfactant | 0.008 | 0.008 | 0.008 | 0.008 | 0.008 | 0.008 |
| Organic solvent 2 | 3.5 | 3.5 | 3.5 | 3.5 | 3.5 | 3.5 |
| Evaluation OD value | 2.3 | 2.3 | 2.3 | 2.3 | 2.3 | 2.3 |
| Sensitivity | 200 | 150 | 400 | 400 | 600 | 300 |
| Adhesion sensitivity | 150 | 125 | 600 | 500 | 700 | 400 |
| Rectangularity | 3 | 2 | 2 | 2 | 3 | 2 |
| Temporal stability | 3 | 3 | 2 | 2 | 3 | 2 |

From the results, in Examples, a cured film having low adhesion sensitivity and excellent adhesiveness could be formed with low sensitivity. In addition, in Examples, the sensitivity, the rectangularity, and the temporal stability were excellent.

On the other hand, in Comparative Examples, it was difficult to form a cured film having high adhesion sensitivity and good adhesiveness, as compared with Examples.

The raw materials shown in Table 1 above were as follows.

Alkali-soluble resin 1: The following structure (The numeral value shown in each repeating unit represents the content [mass ratio] of each repeating unit. Mw=11,000)

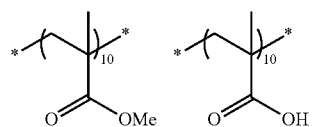

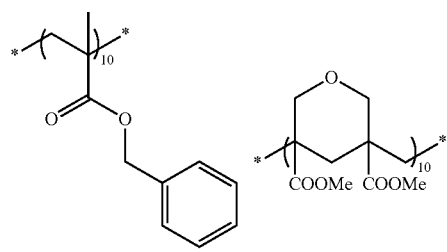

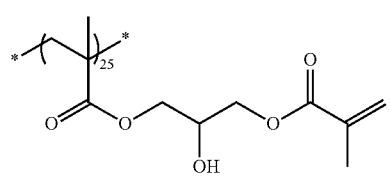

Alkali-soluble resin 2: The following structure (The numeral value shown in each repeating unit represents the content [mass ratio] of each repeating unit. Mw=14,000)

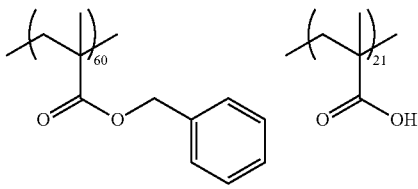

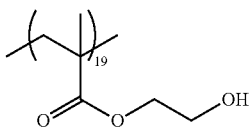

Polymerizable compound 1: The following structure (a mixture in which the molar ratio of the left-side compound to the right-side compound is 7:3)

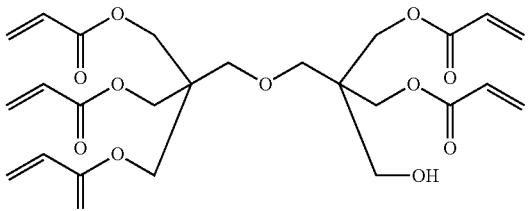

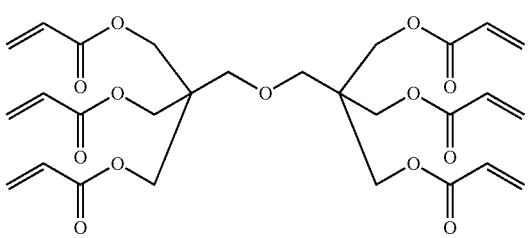

Polymerizable compound 3: The following structure

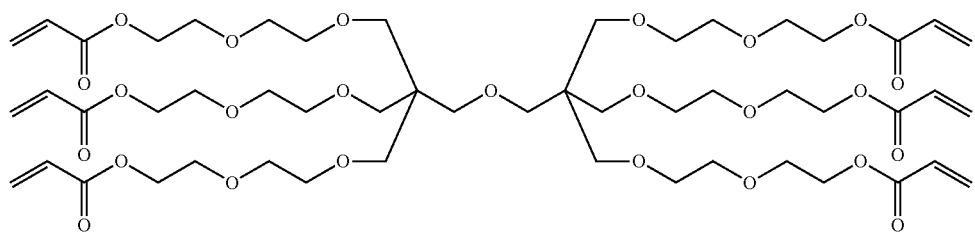 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable compound 4: Carboxylic acid-containing polyfunctional acrylate (ARONICS M-520) manufactured by Toagosei Co., Ltd.

Polymerizable compound 5: The following structure

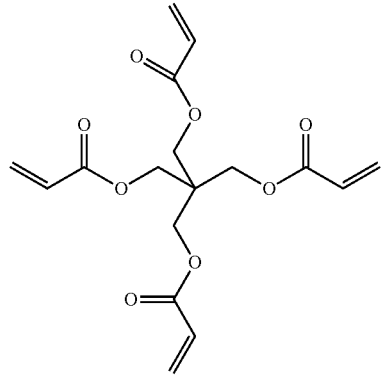 [SMILES: C=CC(=O)OCC(COC(=O)C=C)(COC(=O)C=C)COC(=O)C=C]

Compound having an epoxy group (epoxy compound): EHPE3150, manufactured by Daicel Chemical Industries, Ltd.

Photopolymerization initiators A1 to A3, 2, 2B, 3, 3B, and 4: The following structures

A1

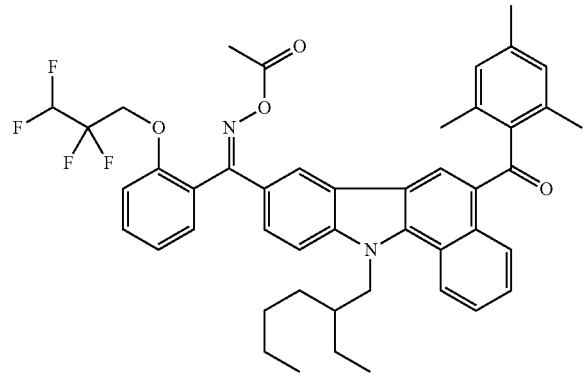

-continued

A2

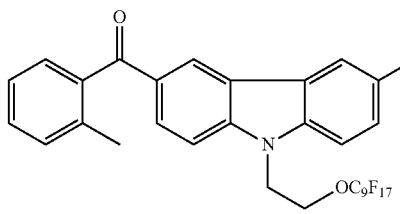

A3

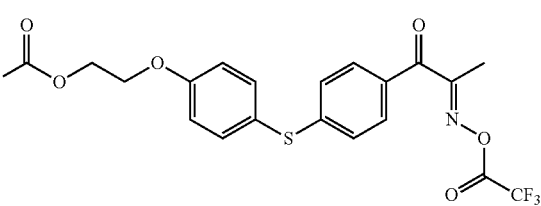

2

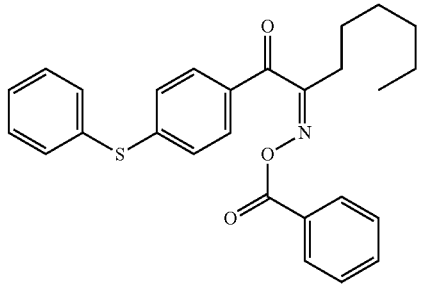

2B

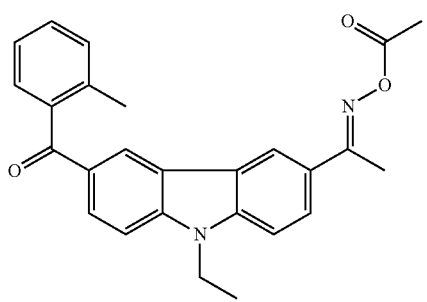

-continued

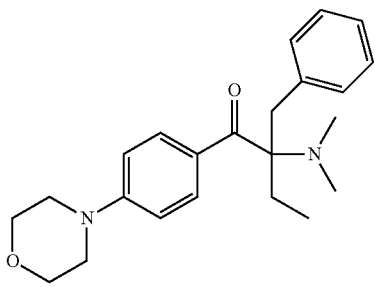

3

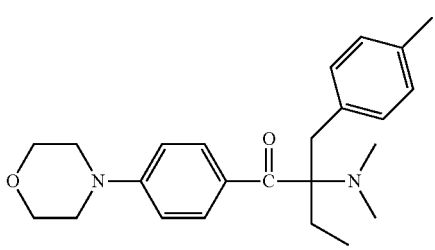

3B

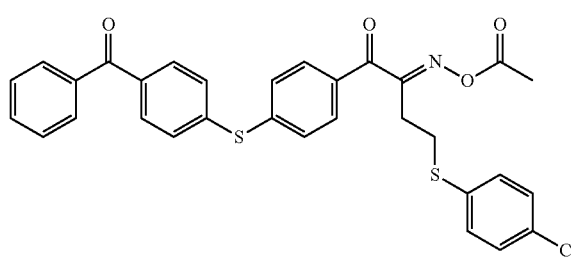

4

Polymerization inhibitor: p-Methoxyphenol
Silane coupling agent: The following structure

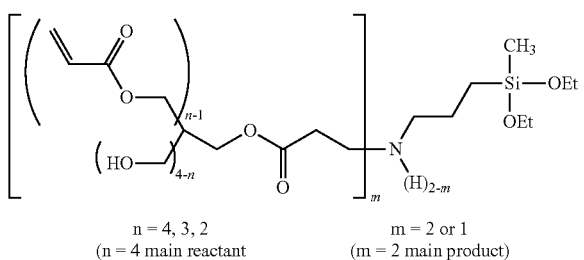

n = 4, 3, 2
(n = 4 main reactant)

m = 2 or 1
(m = 2 main product)

Surfactant: The following mixture (Mw=14,000)

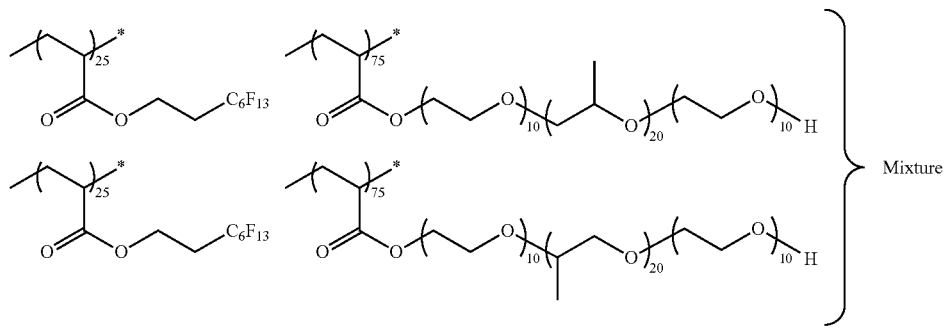

Organic solvent 2: Cyclohexanone

Good results were obtained even in a case where a pigment dispersion liquid B-1 or B-2 of Test Example 3 below was used instead of the pigment dispersion liquid 1, 2, 3, or 4 in Example 1-1.

Test Example 2

[Manufacture of Titanium Black A-1]

120 g of titanium oxide ("TTO-51N" trade name: manufactured by Ishihara Sangyo Kaisha Ltd.) having a BET specific surface area of 110 $m^2/g$, 25 g of silica particles ("AEROSIL (registered trademark) 300", manufactured by Evonik Corporation) having a BET specific surface area of 300 $m^2/g$, 100 g of a dispersant ("DISPERBYK 190" trade name: manufactured by BYK-Chemie), and 71 g of ion-exchanged water were weighed. The mixture was treated for 30 minutes at a revolution rotation speed of 1,360 rpm and a spinning rotation speed of 1,047 rpm, using MAZERSTAR KK-400W manufactured by KURABO, thereby obtaining a uniform aqueous mixed solution. The aqueous mixed solution was filled into a quartz vessel and heated at 920° C. in an oxygen atmosphere, using a compact size rotary kiln (manufactured by K. K. MOTOYAMA). Then, the mixture was subjected to a nitridization reduction treatment by replacing the atmosphere with nitrogen and then flowing ammonia gas thereinto at the same temperature at the rate of 100 mL/min for 5 hours. After the completion of the treatment, recovered powder was pulverized in a mortar, thereby obtaining a titanium black (A-1) [dispersoid including titanium black particles and Si atoms] containing Si atoms and having a BET specific surface area of 85 $m^2/g$ in the powder shape.

[Preparation of Titanium Black Dispersion (TB Dispersion Liquid 1)]

The components shown in the following composition 1 were mixed for 15 minutes, using a stirrer (EUROSTAR manufactured by IKA), to obtain a dispersion a.

The obtained dispersion a was subjected to a dispersion treatment under the following dispersion conditions, using ULTRA APEX MILL UAM 015 manufactured by Kotobuki Industries Co., Ltd. Then, this was filtered using a nylon-made filter having a pore diameter of 0.45 μm (DFA4201NXEY, manufactured by Nihon Pall Ltd.) to obtain a titanium black dispersion (hereinafter denoted as TB dispersion liquid 1).

(Composition 1)

Titanium black (A-1) obtained as described above . . . 25 parts by mass

30%-by-mass propylene glycol monomethyl ether acetate (PGMEA) solution of the resin 1 . . . 25 parts by mass PGMEA . . . 50 parts by mass Resin 1: The following structure. This was synthesized with reference to the description of JP2013-249417A. Further, in the formula of the resin 1, x was 43% by mass, y was 49% by mass, and z was 8% by mass. Further, the resin 1 had a weight-average molecular weight of 30,000, an acid value of 60 mgKOH/g, and the number of atoms (excluding hydrogen atoms) in the graft chain of 117.

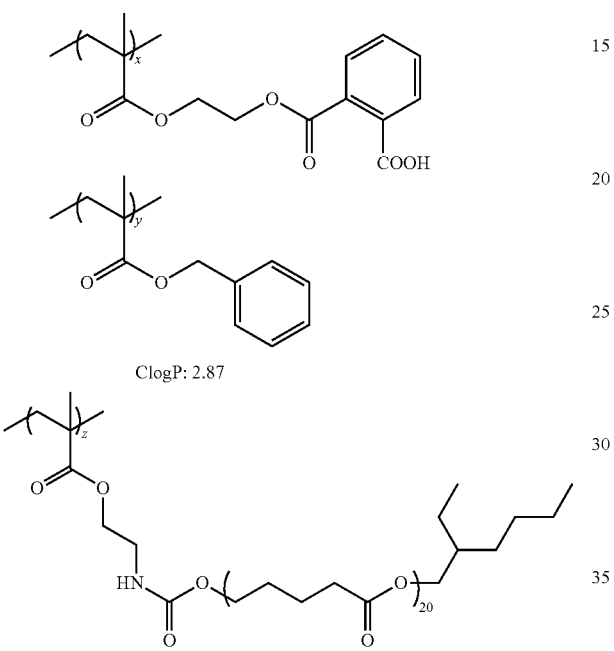

ClogP: 2.87

(Dispersion Conditions)

Bead diameter: Diameter 0.05 mm

Beads filling rate: 75% by volume

Circumferential speed of mill: 8 m/sec

Amount of mixed solution to be subjected to a dispersion treatment: 500 g

Circulation flow rate (pump supply amount): 13 kg/hour

Temperature of treatment liquid: 25° C. to 30° C.

Cooling water: Tap water

Inner volume of circular path of beads mill: 0.15 L

Number of passes: 90 passes

[Preparation of Coloring Composition]

The raw materials shown in Table 2 below were mixed at the ratio shown in the following composition, and then filtered using a nylon-made filter having a pore diameter of 0.45 μm (DFA4201NXEY, manufactured by Nihon Pall Ltd.) to prepare a coloring composition.

MEGAFACE RS-72-K below contains an alkylene group having a fluorine atom, and an acryloyloxy group. More specifically, MEGAFACE RS-72-K includes a repeating unit represented by Formula (B1-1) and a repeating unit represented by Formula (B3-1), as described below, and had a weight-average molecular weight of 7,400. Further, in Formula (B3-1), X represents a perfluoromethylene group or a perfluoroethylene group, and r represents the number of repeating units.

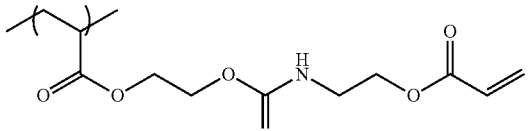

B1-1

B3-1

(Composition)

TB dispersion liquid 1 . . . 63.9 parts by mass

Alkali-soluble resin (the following specific resin 2 or 3) . . . 10.24 parts by mass Photopolymerization initiator . . . 1.81 parts by mass Polymerizable compound . . . 6.29 parts by mass Surfactant . . . 0.02 parts by mass Solvent (cyclohexanone) . . . 4.66 parts by mass Curable compound (MEGAFACE RS-72-K (manufactured by DIC Corporation, solid content: 30%, solvent: PGMEA)): 10.65 parts by mass Silane coupling agent (KBM-4803 (manufactured by Shin-Etsu Chemical Co., Ltd.)): 0.36 parts by mass The raw materials shown in Table 2 below are as follows.

The polymerizable compounds 1 and 4, the photopolymerization initiator, and the surfactant, which were the same materials as for the coloring composition of Test Example 1, respectively, were used.

Polymerizable compound 6: The following structure

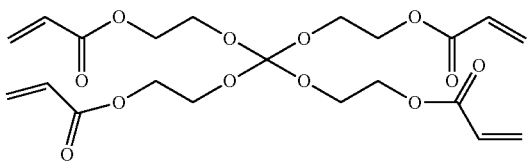 [SMILES: C=CC(=O)OCCOC(OCCOC(=O)C=C)(OCCOC(=O)C=C)OCCOC(=O)C=C]

Specific resin 2: The following structure. This was synthesized by the production method in paragraphs 0338 to 0340 of JP2010-106268A. Further, in the following formula, x was 90% by mass and z was 10% by mass. Further, the specific resin 2 had a weight-average molecular weight of 40,000, an acid value of 100 mgKOH/g, and the number of atoms (excluding hydrogen atoms) in the graft chain of 117.

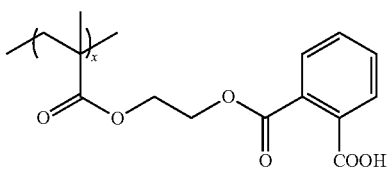

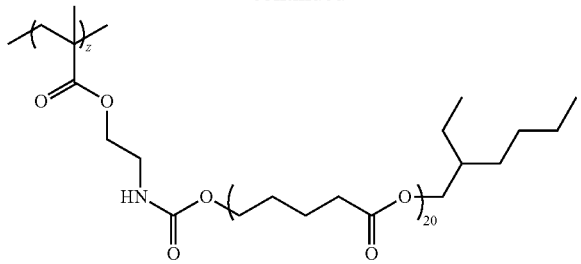

Specific resin 3: The following structure (Mw=24,000)

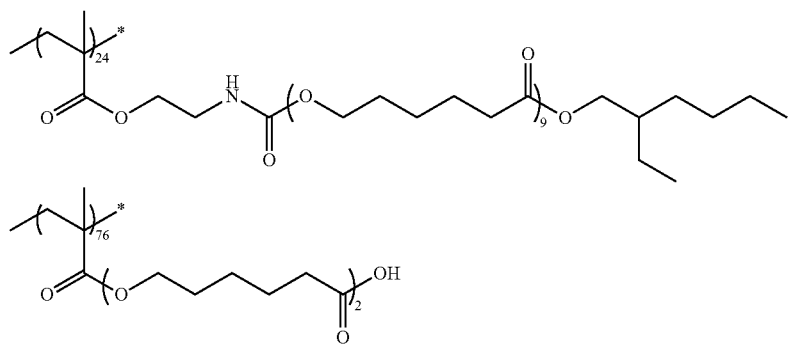

(Manufacture of Cured Film (Light-Shielding Film))

The coloring composition manufactured above was applied onto on a 200-mm (8-inch) glass substrate EagleXG (manufactured by Corning Inc.) by a spin coating method, and then subjected to a heating treatment (pre-baked) using a hot plate at 80° C. for 120 seconds. Then, exposure was carried out through a linear 300-μm (width of 300 μm, length of 4 mm) mask at an exposure dose of 200 mJ/cm$^2$, using an i-ray stepper exposure device FPA-3000i5+(manufactured by Canon Inc.). Then, puddle development was carried out for 40 seconds with an aqueous solution including 0.3% by mass of a surfactant NCW-101 (non-ionic surfactant) manufactured by Wako Pure Chemical Industries. Ltd. and 0.01% by mass of tetramethylammonium hydroxide (TMAH), using AD-1200 (manufactured by Mikasa Co., Ltd.). Then, a heating treatment (post-baking) was carried out at 150° C. for 1 hour, using Clean Oven CLH-21CDH (manufactured by Koyo Thermo Systems Co., Ltd.), thereby forming a light-shielding film (width of 300 μm, length of 4 mm) having a film thickness of 2 μm.

(Evaluation of Reflectivity)

Light at 400 to 700 nm was incident onto the formed light-shielding film at an angle of incidence of 5°, and the reflectivity was measured using a spectrometer UV4100 (trade name) manufactured by HITACHI High-Technologies Corporation.

(Evaluation of Chipping)

CT-18 (manufactured by Nichiban Co., Ltd.) was strongly pressed on the formed linear 300-μm (width of 300 mm, length of 4 mm) light-shielding film, and peeled by drawing the edge of the tape at a 45-degree edge at once. Using an optical microscope MT-3600LW (manufactured by FLOVEL Corporation), the state of the light-shielding film after tape peeling (tape pull) was compared with the state of the light-shielding film before the tape pull, and evaluated in accordance with the following evaluation standard. "2" or more is evaluated as a permissible level.

"3": The destruction of the pattern edge of the 300-μm linear light-shielding film was not observed on the glass substrate.

"2": The destruction of the pattern edge of the 300-μm linear light-shielding film was observed on 5 or less positions on the glass substrate.

"1": ": The destruction of the pattern edge of the 300-μm linear light-shielding film was observed on 6 or more positions on the glass substrate.

(Evaluation of Linearity)

Using an optical microscope MT-3600LW (manufactured by FLOVEL Corporation), the line width was measured at 255 points on the formed linear 300-μm light-shielding film, and the 3σ of the measured line width was calculated and evaluated in accordance with the following evaluation standard. Further, "2" or more is evaluated as a permissible level.

"3": The 3σ of the linear 300-μm line width was less than 1 μm.

"2": The 3σ of the linear 300-μm line width was 1 μm or more and less than 5 μm.

"1": The 3σ of the linear 300-μm line width was 5 μm or more.

(Evaluation of Adhesiveness)

The obtained coloring composition was applied onto a glass wafer such that the film thickness after drying became 2.0 μm using a spin coater, and a heating treatment (pre-baking) was carried out, using a hot plate at 100° C. for 120 seconds.

Then, exposure was carried out through a photo mask for forming a square pixel pattern having a side length of 100 μm, at an exposure dose increasing from 50 to 750 mJ/cm$^2$ with an interval of 50 mJ/cm, using an i-ray stepper exposure device FPA-3000i5+(manufactured by Canon Inc.). The glass wafer on which the square pixel pattern was resolved was observed with an optical microscope and evaluated in accordance with the following evaluation standard.

"3": There is no pattern peeling at an of exposure dose of 50 mJ/cm$^2$.

"2": There is pattern peeling at an of exposure dose of 50 mJ/cm$^2$, and there is no pattern peeling at an of exposure dose of 100 mJ/cm$^2$.

"1": There is pattern peeling at an of exposure dose of 100 mJ/cm$^2$.

(Evaluation of Rectangularity)

The cross-section of the glass wafer whose adhesiveness was evaluated was observed with a scanning electron microscope. The angle of the sidewall of the square pixel pattern with respect to the surface of the glass wafer at an exposure dose of 200 mJ/cm² was measured and evaluated in accordance with the following evaluation standard.

"3": The angle of the sidewall is 80° or more and less than 100°.

"2": The angle of the sidewall is 70° or more and less than 80°, or 100° or more and less than 110°.

"1": The angle of the sidewall is less than 70°, or 110° or more.

[Preparation of Pigment Dispersion Liquid B-2]

A mixed solution having the following composition was mixed and dispersed for 3 hours, using a beads mill (a high-pressure dispersing machine with pressure reducing mechanism, NANO-3000-10 (manufactured by Nippon BEE Chemical Co., Ltd.)) with zirconia beads having a diameter of 0.3 mm, to prepare a pigment dispersion liquid B-2.

TABLE 2

|  |  | Example 2-1 | Example 2-2 | Example 2-3 | Example 2-4 | Example 2-5 |
|---|---|---|---|---|---|---|
| Photopolymeriztaion initiator | | Photopolymerization initiator A1 | Photopolymerization initiator A2 | Photopolymerization initiator A3 | Photopolymerization initiator A1 | Photopolymerization initiator A1 |
| Polymerizable compound | | Polymerizable compound 1 | Polymerizable compound 1 | Polymerizable compound 1 | Polymerizable compound 4/ Polymerizable compound 1 = ¼ | Polymerizable compound 6 |
| Alkali-soluble resin | | Specific resin 2 | Specific resin 2 | Specific resin 2 | Specific resin 2 | Specific resin 2 |
| Thickness (μm) of Light-shielding film | | 2 | 2 | 2 | 2 | 2 |
| Evaluation | OD value | 3.0 | 3.0 | 3.0 | 3.2 | 3.1 |
| | Adhesiveness | 3 | 3 | 3 | 3 | 3 |
| | Reflectivity (%) | 2.0 | 2.1 | 2.1 | 2.5 | 2.3 |
| | Linearity | 3 | 3 | 3 | 3 | 3 |
| | Chipping | 3 | 3 | 2 | 3 | 3 |
| | Rectangularity | 3 | 3 | 3 | 3 | 3 |

|  |  | Example 2-6 | Comparative Example 2-1 | Comparative Example 2-2 | Comparative Example 2-3 |
|---|---|---|---|---|---|
| Photopolymeriztaion initiator | | Photopolymerization initiator A1 | Photopolymerization initiator 2 | Photopolymerization initiator 3 | Photopolymerization initiator 4 |
| Polymerizable compound | | Polymerizable compound 1 | Polymerizable compound 1 | Polymerizable compound 1 | Polymerizable compound 1 |
| Alkali-soluble resin | | Specific resin 3 | Specific resin 2 | Specific resin 2 | Specific resin 2 |
| Thickness (μm) of Light-shielding film | | 2 | 2 | 2 | 2 |
| Evaluation | OD value | 3.0 | 3.4 | 3.0 | 3.3 |
| | Adhesiveness | 3 | 1 | 1 | 2 |
| | Reflectivity (%) | 2.1 | 3.1 | 2.9 | 3.0 |
| | Linearity | 3 | 2 | 1 | 2 |
| | Chipping | 3 | 1 | 1 | 1 |
| | Rectangularity | 3 | 2 | 3 | 2 |

As shown in the table above, in Examples, the adhesiveness was excellent. Further, the cured film had low reflectivity. In addition, the linearity and the chipping were also evaluated to be good.

On the other hand, in Comparative Examples, the adhesiveness was deteriorated.

Test Example 3

[Preparation of Pigment Dispersion Liquid B-1]

A mixed solution having the following composition was mixed and dispersed for 3 hours, using a beads mill (a high-pressure dispersing machine with pressure reducing mechanism, NANO-3000-10 (manufactured by Nippon BEE Chemical Co., Ltd.)) with using zirconia beads having a diameter of 0.3 mm, to prepare a pigment dispersion liquid B-1.

(Composition)

Mixed pigment (C. I. Pigment Red 254:C. I. Pigment Yellow 139=4:1 (mass ratio)) formed of a red pigment (C. I. Pigment Red 254) and a yellow pigment (C. I. Pigment Yellow 139) . . . 11.8 parts by mass Resin 1 (dispersant) (BYK-111 manufactured by BYK) . . . 9.1 parts by mass Propylene glycol methyl ether acetate . . . 79.1 parts by mass (Composition)

Mixed pigment (C. I. Pigment Blue 15:6:C. I. Pigment Violet 23=9:4 (mass ratio)) formed of a blue pigment (C. I. Pigment Blue 15:6) and a violet pigment (C. I. Pigment Violet 23) . . . 12.6 parts by mass Resin 1 (dispersant) (BYK-111 manufactured by BYK) . . . 2.0 parts by mass Resin 2 (dispersant) . . . 3.3 parts by mass Cyclohexanone . . . 31.2 parts by mass Propylene glycol methyl ether acetate . . . 50 parts by mass Resin 2: The following structure (The numeral value shown in each repeating unit represents the content [mass ratio] of each repeating unit. Mw=14,000). Further, the resin 2 is also an alkali-soluble resin.

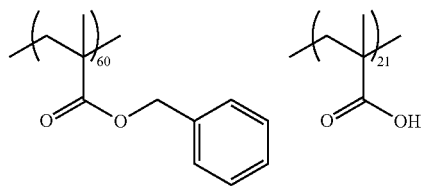

-continued

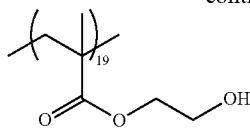

[Preparation of Coloring Composition]

The raw materials shown in Table 3 below were mixed and stirred at the ratio (parts by mass) shown in Table 3 below, and then filtered using a nylon-made filter having a pore diameter of 0.45 μm (DFA420 INXEY, manufactured by Nihon Pall Ltd.) to prepare a coloring composition.

[Absorbance]

The obtained coloring composition was applied onto a glass substrate such that the film thickness after the post-baking became 1.0 μm by spin coating. Then, drying was carried out with a hot plate at 100° C. for 120 seconds, and thereafter, a heating treatment (post-baking) was further carried out using a hot plate at 200° C. for 300 seconds, thereby forming a colored layer on the glass substrate.

The absorbance of the glass substrate having the colored layer formed thereon was measured using an ultraviolet-visible-near-infrared spectrophotometer (U-4100, manufactured by Hitachi High-Technologies Corporation). Specifically, the minimum value A of the absorbance at a wavelength in a range from 400 nm to less than 580 nm, the minimum value B of the absorbance at a wavelength in a range from 580 nm to 750 nm, the minimum value C of the absorbance at a wavelength in a range from 400 nm to 750 nm, and the maximum value D of the absorbance at a wavelength in a range from 1,000 nm to 1,300 nm were each measured.

[Manufacture of Color Filter]

The obtained coloring composition was applied onto a silicon wafer such that the film thickness after drying became 2.0 μm, using a spin coater, and a heating treatment (pre-baking) was carried out using a hot plate at 100° C. for 120 seconds, thereby forming a coating film on the silicon wafer.

Then, exposure was carried out at an optimum exposure dose through a photo mask for forming a square pixel pattern having a side length of 3.0 μm, using an i-ray stepper exposure device FPA-3000i5+(manufactured by Canon Inc.). The coating film was exposed at an exposure dose increasing from 50 to 750 mJ/cm$^2$ with an interval of 50 mJ/cm$^2$, and an optimum exposure dose was determined, based on the exposure dose that resolved the square pixel pattern.

Thereafter, the silicon wafer having the exposed coating film formed thereon was placed on a horizontal rotary table of a spin-shower developing machine (DW-30 Type, manufactured by Chemitronics Co., Ltd.), and subjected to puddle development at 23° C. for 60 seconds, using CD-2060 (manufactured by Fujifilm Electronic Materials Co., Ltd.), thereby forming a colored pattern on the silicon wafer.

The silicon wafer having the colored pattern formed thereon was subjected to a rinsing treatment with pure water and then spin-dried.

In addition, a heating treatment (post-baking) was carried out, using a hot plate at 200° C. for 300 seconds, thereby obtaining a color filter (silicon wafer with a colored pattern).

(Evaluation of Sensitivity)

The obtained coloring composition was applied onto a silicon wafer such that the film thickness after drying became 2.0 μm, using a spin coater, and a heating treatment (pre-baking) was carried out using a hot plate at 100° C. for 120 seconds.

Then, exposure was carried out through a photo mask for forming a square pixel pattern having a side length of 3.0 μm, using an i-ray stepper exposure device FPA-3000i5+ (manufactured by Canon Inc.), at an exposure dose increasing from 50 to 750 mJ/cm$^2$ with an interval of 50 mJ/cm$^2$. An optimum exposure dose (mJ) that resolved the square pixel pattern was determined and defined as sensitivity.

(Evaluation of Adhesion Sensitivity)

The silicon wafer, whose sensitivity had been evaluated above, was observed with an optical microscope, and a lowest exposure dose (mJ) at which the square pixel pattern having a side length of 3.0 μm was not peeled at all, formed at the optimum exposure dose, was determined and defined as adhesion sensitivity.

(Evaluation of Rectangularity)

The cross-section of the silicon wafer, whose sensitivity had been evaluated above, was observed with a scanning electron microscope, and the angle of the side wall of the square pixel pattern having a side length of 3.0 μm, formed at an optimum exposure dose, with respect to the surface of the silicon wafer was measured and evaluated in accordance with the following evaluation standard.

"3": The angle of the sidewall is 80° or more and less than 100°.

"2": The angle of the sidewall is 70° or more and less than 80°, or 100° or more and less than 1100.

"1": The angle of the sidewall is less than 70° or 110° or more.

TABLE 3

|  | Example 3-1 | Example 3-2 | Example 3-3 | Example 3-4 | Example 3-5 | Example 3-6 |
|---|---|---|---|---|---|---|
| Pigment dispersion liquid B-1 | 47.1 | 45.6 | 47.1 | 47.1 | 45.6 | 45.6 |
| Pigment dispersion liquid B-2 | 37.8 | 36.9 | 37.8 | 37.8 | 36.9 | 36.9 |
| Alkali-soluble resin 1 | 0.6 | 1.4 | 0.6 | 0.6 | 1.4 | 1.4 |
| Alkali-soluble resin 2 |  |  |  |  |  |  |
| Polymerizable compound 1 | 0.6 | 1.8 | 0.6 | 0.6 |  |  |
| Polymerizable compound 3 | 1.4 |  | 1.4 | 1.4 | 0.9 | 0.9 |
| Polymerizable compound 4 |  |  |  |  | 0.9 |  |
| Polymerizable compound 5 |  |  |  |  |  | 0.9 |
| Photopolymerization initiator A1 | 1 | 1 |  |  | 1 | 1 |
| Photopolymerization initiator A2 |  |  |  | 1 |  |  |

TABLE 3-continued

|  |  |  |  |  |  |  |  |
|---|---|---|---|---|---|---|---|
| Photopolymerization initiator A3 |  |  |  | 1 |  |  |  |
| Photopolymerization initiator 2 |  |  |  |  |  |  |  |
| Photopolymerization initiator 3 |  |  |  |  |  |  |  |
| Photopolymerization initiator 4 |  |  |  |  |  |  |  |
|  | Silane coupling agent | 0.5 | 0.6 | 0.5 | 0.5 | 0.6 | 0.6 |
|  | Surfactant | 4.2 | 4.2 | 4.2 | 4.2 | 4.2 | 4.2 |
|  | Organic solvent 1 | 6.8 | 8.5 | 6.8 | 6.8 | 8.5 | 8.5 |
| Evaluation | OD value | 3.2 | 3.1 | 3.2 | 3.2 | 3.1 | 3.1 |
|  | Sensitivity | 400 | 350 | 450 | 450 | 300 | 400 |
|  | Adhesion sensitivity | 200 | 200 | 400 | 400 | 150 | 250 |
|  | Rectangularity | 3 | 3 | 3 | 3 | 3 | 3 |
| Absorbance | Minimum value A | 1.32 | 1.44 | 1.32 | 1.32 | 1.44 | 1.44 |
|  | Minimum value B | 1.04 | 1.01 | 1.04 | 1.04 | 1.01 | 1.01 |
|  | Minimum value C | 1.04 | 1.01 | 1.04 | 1.04 | 1.01 | 1.01 |
|  | Maximum value D | 0.05 | 0.05 | 0.05 | 0.05 | 0.05 | 0.05 |

|  |  | Example 3-7 | Comparative Example 3-1 | Comparative Example 3-2 | Comparative Example 3-3 |
|---|---|---|---|---|---|
|  | Pigment dispersion liquid B-1 | 45.6 | 47.1 | 47.1 | 47.1 |
|  | Pigment dispersion liquid B-2 | 36.9 | 37.8 | 37.8 | 37.8 |
|  | Alkali-soluble resin 1 |  | 0.6 | 0.6 | 0.6 |
|  | Alkali-soluble resin 2 | 1.4 |  |  |  |
|  | Polymerizable compound 1 | 1.8 | 0.6 | 0.6 | 0.6 |
|  | Polymerizable compound 3 |  | 1.4 | 1.4 | 1.4 |
|  | Polymerizable compound 4 |  |  |  |  |
|  | Polymerizable compound 5 |  |  |  |  |
|  | Photopolymerization initiator A1 | 1 |  |  |  |
|  | Photopolymerization initiator A2 |  |  |  |  |
|  | Photopolymerization initiator A3 |  |  |  |  |
|  | Photopolymerization initiator 2 |  | 1 |  |  |
|  | Photopolymerization initiator 3 |  |  | 1 |  |
|  | Photopolymerization initiator 4 |  |  |  | 1 |
|  | Silane coupling agent | 0.6 | 0.5 | 0.5 | 0.5 |
|  | Surfactant | 4.2 | 4.2 | 4.2 | 4.2 |
|  | Organic solvent 1 | 8.5 | 6.8 | 0.9 | 0.9 |
| Evaluation | OD value | 3.1 | 3.2 | 3.2 | 3.2 |
|  | Sensitivity | 350 | 600 | 700 | 500 |
|  | Adhesion sensitivity | 200 | 600 | 700 | 500 |
|  | Rectangularity | 3 | 2 | 3 | 2 |
| Absorbance | Minimum value A | 1.44 | 1.32 | 1.32 | 1.32 |
|  | Minimum value B | 1.01 | 1.04 | 1.04 | 1.04 |
|  | Minimum value C | 1.01 | 1.04 | 1.04 | 1.04 |
|  | Maximum value D | 0.05 | 0.05 | 0.05 | 0.05 |

As shown in Table 3 above, in Examples, a cured film having low adhesion sensitivity and excellent adhesiveness even at a low exposure dose could be formed. In Examples, the sensitivity and the rectangularity were also evaluated to be good. In addition, the color filter of Examples could transmit infrared light (particularly near-infrared light) in the state where there were little noise derived from the visible light components.

On the other hand, in Comparative Examples, it was difficult to form a cured film having high adhesion sensitivity and good adhesiveness, as compared with Examples.

In Table 3, as the alkali-soluble resins 1 and 2, the polymerizable compounds 1, and 3 to 5, the photopolymerization initiators A1 to A3, 2, 3, and 4, the silane coupling agent, and the surfactant, the same materials as those for the coloring composition in Test Example 1 were used, respectively. Further, propylene glycol methyl ether acetate (PGMEA) was used as the organic solvent 1. In addition, the value of the blend amount of the surfactant in the table is a value of a 1%-by-mass PGMEA solution.

Test Example 4

(Preparation of Green Pigment Dispersion Liquid)

A mixed solution formed of 7.55 parts by mass of C. I. Pigment Green 58, 1.89 parts by mass of C. I. Pigment Yellow 185, 0.94 parts by mass of the pigment derivative A, 3.7 parts by mass of the resin (dispersant A), and 65.7 parts by mass of PGMEA were mixed and dispersed for 15 hours, using a beads mill, to prepare a green pigment dispersion liquid.

Pigment derivative A: The structure shown below

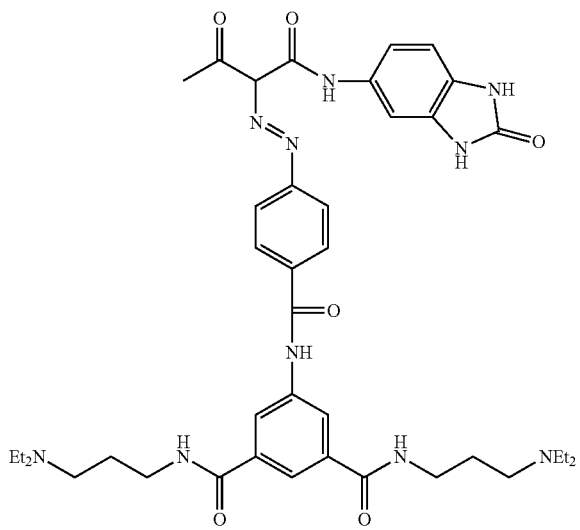

Dispersant A: The following structure (The numeral value shown in each repeating unit represents the content [mass ratio] of each repeating unit. The numeral value shown in the repeating site of the side chain represents the repetition number of repeating sites. Acid value=50 mgKOH/g and Mw=24,000)

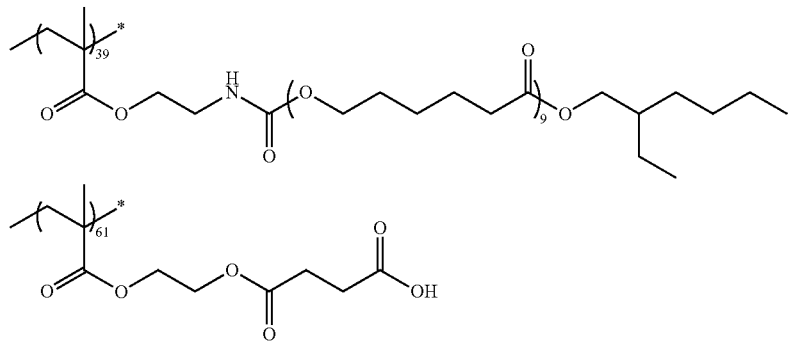

(Preparation of Green Pigment-Containing Coloring Composition (Coating Liquid))

Using the green pigment dispersion liquid, the respective raw materials were mixed and stirred to the compositional ratio (parts by mass) described in Table 4 to prepare a green pigment-containing coloring composition.

(Pattern Formation 1)

A 200-mm (8-inch) silicon wafer was subjected to a heating treatment in an oven at 200° C. for 30 minutes. Then, CT-4000L (manufactured by Fujifilm Electronic Materials Co., Ltd.) was applied onto the silicon wafer such that the film thickness after post-baking became 0.1 μm, and heated and dried on a hot plate at 220° C. for 5 minutes to form an undercoat layer. Thus, a silicon wafer with an undercoat layer was obtained.

The obtained coloring composition was applied onto the undercoat layer of the silicon wafer with an undercoat layer to form a coloring composition layer (coating film). Further, the coating film was subjected to a heating treatment (pre-baking) using a hot plate at 100° C. for 120 seconds such that the film thickness after drying became 0.5 μm.

Then, exposure was carried out through a Bayer pattern mask with a pattern having a side length of 1.1 μm, at a wavelength of 365 nm, using an i-ray stepper exposure device FPA-3000i5+ (manufactured by Canon Inc.).

Thereafter, the silicon wafer having the exposed coating film formed thereon was placed on a horizontal rotary table of a spin-shower developing machine (DW-30 Type, manufactured by Chemitronics Co., Ltd.), and subjected to puddle development at 23° C. for 60 seconds, using CD-2060 (manufactured by Fujifilm Electronic Materials Co., Ltd.), thereby forming a green colored pattern (1.1-μm pattern) in 1.1 μm×1.1 μm on the silicon wafer.

The silicon wafer having the colored pattern formed thereon was fixed on the horizontal rotary table in a vacuum chuck system, and while the silicon wafer was rotated at a rotation speed of 50 rpm using a rotation device, pure water was supplied onto the wafer from a spray nozzle in the form of a shower from the position above the rotation center, so as to carry out a rinsing treatment. Thereafter, the silicon wafer was spin-dried. Then, a heating treatment (post-baking) was carried out using a hot plate at 230° C. for 300 seconds. Thus, a silicon wafer having colored pixels was obtained.

<Evaluation of Sensitivity>

The silicon wafer having colored pixels were observed at a magnification of 20.000, using a line width measuring electron microscope S9260A (manufactured by HITACHI High-Technologies Corporation), and the pattern dimension was measured. The sensitivity was evaluated in accordance with the following evaluation standard.

A: The difference between the pattern dimension and the mask dimension at an exposure dose of 100 mJ/cm$^2$ is more than −0.020 μm and less than 0.020 μm.

B: The difference between the pattern dimension and the mask dimension at an exposure dose of 100 mJ/cm$^2$ is more than −0.040 μm and −0.020 μm or less, or 0.020 μm or more and less than 0.040 μm C: The difference between the pattern dimension and the mask dimension at an exposure dose of 100 mJ/cm$^2$ is more than −0.060 μm and −0.040 μm or less, or 0.040 μm or more and less than 0.060 μm.

D: The difference between the pattern dimension and the mask dimension at an exposure dose of 100 mJ/cm$^2$ is more than −0.100 μm and −0.060 μm or less, or 0.060 μm or more and less than 0.100 μm.

E: The difference between the pattern dimension and the mask dimension at an exposure dose of 100 mJ/cm$^2$ is −0.100 μm or less, or 0.100 μm or more.

<Evaluation of Adhesiveness>

The silicon wafer having colored pixels was observed at a magnification of 50, using an optical microscope. The number of positions having the peeling of the 1.1-μm pattern was metered and evaluated in accordance with the following standard.

A: The number of positions having the peeling of the 1.1-μm pattern was 0.

B: The number of positions having the peeling of the 1.1-μm pattern was 1 to 5.

C: The number of positions having the peeling of the 1.1-μm pattern was 6 to 10.

D: The number of positions having the peeling of the 1.1-μm pattern was 10 or more.

E: The 1.1-μm pattern was all peeled.

(Pattern Formation 2)

A 200-mm (8-inch) glass wafer was subjected to a heating treatment in an oven at 200° C. for 30 minutes. Then, CT-4000L (manufactured by Fujifilm Electronic Materials Co., Ltd.) was applied onto the glass wafer such that the film thickness after post-baking became 0.1 μm, and heated and dried on a hot plate at 220° C. for 5 minutes to form an undercoat layer. Thus, a glass wafer with an undercoat layer was obtained.

The obtained coloring composition was applied onto the undercoat layer of the glass wafer with an undercoat layer to form a coloring composition layer (coating film). Further, the coating film was subjected to a heating treatment (prebaking) using a hot plate at 100° C. for 120 seconds such that the film thickness of the coating film after drying became 0.5 μm. Then, the spectral transmittance (spectrum 1) of the glass wafer was measured using MCPD-3000 (manufactured by Otsuka Electronics Co., Ltd.).

Then, exposure was carried out at a wavelength of 365 nm, at an exposure dose of 500 mJ/cm² in a maskless (open-frame) state, using an i-ray stepper exposure device FPA-3000i5+(manufactured by Canon Inc.).

Thereafter, the glass wafer having the exposed coating film formed thereon was placed on a horizontal rotary table of a spin-shower developing machine (DW-30 Type, manufactured by Chemitronics Co., Ltd.), and subjected to puddle development at 23° C. for 60 seconds, using CD-2060 (manufactured by Fujifilm Electronic Materials Co., Ltd.), thereby forming a green colored pattern in 2.0 cm×2.0 cm on the glass wafer.

The glass wafer having the colored pattern formed thereon was fixed on the horizontal rotary table in a vacuum chuck system, and while the glass wafer was rotated at a rotation speed of 50 rpm using a rotation device, pure water was supplied onto the wafer from a spray nozzle in the form of a shower from the position above the rotation center, so as to carry out a rinsing treatment. Thereafter, the glass wafer was spin-dried. Then, the spectral transmittance (spectrum 2) of the pattern after development was measured using MCPD-3000, as for the spectrum 1.

<Evaluation of Development Decoloration>

Decoloration was evaluated in accordance with the following evaluation standard.

A: The difference (ΔT %) in the transmittance between the spectrum 1 and the spectrum 2 at a wavelength of 450 nm is less than 1.0%.

B: The difference (ΔT %) in the transmittance between the spectrum 1 and the spectrum 2 at a wavelength of 450 nm is 1.0% or more and less than 2.5%.

C: The difference (ΔT %) in the transmittance between the spectrum 1 and the spectrum 2 at a wavelength of 450 nm is 2.5% or more and less than 4.0%.

D: The difference (ΔT %) in the transmittance between the spectrum 1 and the spectrum 2 at a wavelength of 450 nm is 4.0% or more and less than 5.5%.

E: The difference (ΔT %) in the transmittance between the spectrum 1 and the spectrum 2 at a wavelength of 450 nm is 5.5% or more.

TABLE 4

| | | Example 4-1 | Example 4-2 | Example 4-3 | Example 4-4 | Comparative Example 4-1 | Comparative Example 4-2 |
|---|---|---|---|---|---|---|---|
| Green pigment-containing coloring composition | Green pigment dispersion liquid | 79.78 | 79.78 | 79.78 | 79.78 | 79.78 | 79.78 |
| | Photopolymerization initiator A1 | 0.49 | 0.49 | 0.49 | 0.79 | — | — |
| | Photopolymerization initiator 2 | 0.79 | — | — | — | 1.28 | — |
| | Photopolymerization initiator 2B | — | 0.53 | — | — | — | 1.02 |
| | Polymerizable compound | 2.05 | 2.05 | 2.05 | 2.05 | 2.05 | 2.05 |
| | Alkali-soluble binder | 0.6 | 0.6 | 0.6 | 0.6 | 0.6 | 0.6 |
| | polymerization inhibitor | 0.001 | 0.001 | 0.001 | 0.001 | 0.001 | 0.001 |
| | Epoxy compound | 0.38 | 0.38 | 0.38 | 0.38 | 0.38 | 0.38 |
| | Surfactant 1 | 0.95 | 0.95 | 0.95 | 0.95 | 0.95 | 0.95 |
| | Surfactant 2 | 4.17 | 4.17 | 4.17 | 4.17 | 4.17 | 4.17 |
| | Solvent | 7.12 | 7.12 | 7.12 | 7.12 | 7.12 | 7.12 |
| OD Value at film thickness of 2.0 μm | | >5 | >5 | >5 | >5 | >5 | >5 |
| Performance | Sensitivity | A | A | B | C | C | B |
| | Adhesiveness | A | A | B | A | D | C |
| | Developing decoloration | A | A | C | B | D | D |

From the results, in Examples, the adhesiveness was good. Further, in Examples 4-1 and 4-2 in which a fluorine-based oxime ester-based photopolymerization initiator, and an oxime-based photopolymerization initiator other than the fluorine-based oxime ester-based photopolymerization initiator were included, the sensitivity was excellent. In addition, the development decoloration was suppressed.

On the other hand, in Comparative Examples, the adhesiveness was deteriorated, as compared with Examples.

The raw materials shown in Table 4 above are as follows.

Green pigment dispersion liquid: Green pigment dispersion liquid prepared by the method.

Photopolymerization initiators A1, 2, and 2B: The compounds having the following structures

A1

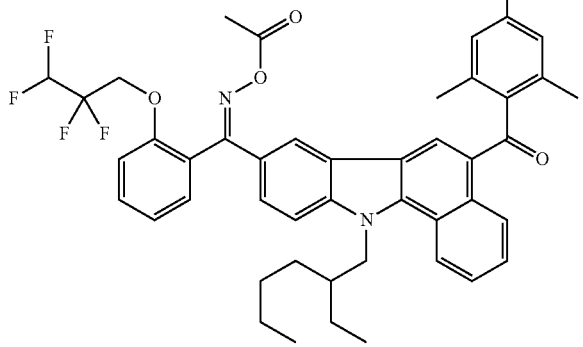

Polymerizable compound: NK Ester A-TMMT (pentaerythritol tetraacrylate, manufactured by Shin-Nakamura Chemical Co., Ltd.)

Alkali-soluble binder: ACA230AA (manufactured by Daicel Corporation), Mw=14,000 and acid value=37 mgKOH/g)

Polymerization inhibitor: p-Methoxyphenol

Epoxy compound: EHPE3150, manufactured by Daicel Corporation

Surfactant 1: PIONIN D-6315 (manufactured by Takemoto Oil & Fat Co., Ltd. non-ionic surfactant)

Surfactant 2: A 0.2-mass PGMEA solution of the following mixture (Mw=14,000)

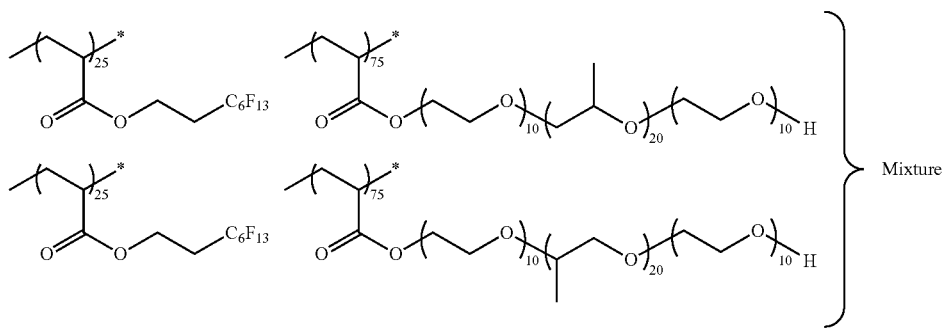

Solvent: PGMEA

-continued

2

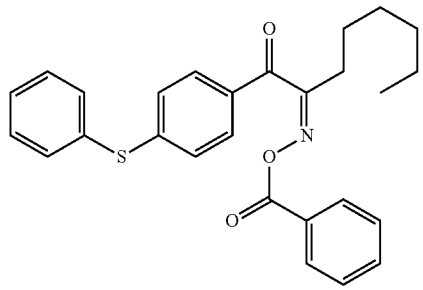

2B

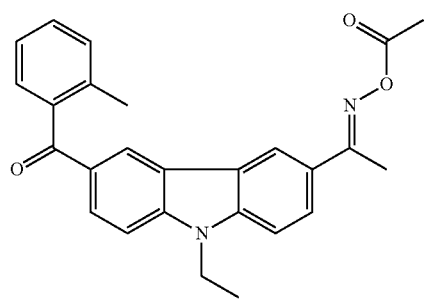

Test Example 5

[Manufacture of Color Filter]

A transparent organic film layer (CT-4000L: manufactured by Fujifilm Electronic Materials Co., Ltd.) was formed on a 8-inch (200-mm) silicon wafer (substrate) such that the film thickness after post-baking became 0.1 µm.

[Conditions for Forming CT-4000L]

Spin coating

No pre-baking

Post-baking (hot plate) 220° C.×300 seconds

The coloring composition prepared in Example 1-4 was applied onto the transparent organic film layer of the silicon wafer having the transparent organic film layer formed thereon such that the film thickness after post-baking became 0.5 µm, using a spin coater, and subjected to a heating treatment (pre-baking) using a hot plate at 100° C. for 120 seconds, thereby forming a colored layer.

Then, exposure was carried out through an Island pattern mask with a pattern having a side length of 3.0 µm, using an i-ray (a wavelength of 365 nm) stepper exposure device FPA-5510iZ (manufactured by Canon Inc.) under the following pattern exposure conditions.

Thereafter, the silicon wafer having the exposed colored layer formed thereon was placed on a horizontal rotary table of a spin-shower developing machine (DW-30 Type, manufactured by Chemitronics Co., Ltd.), and subjected to puddle development at 23° C. for 60 seconds, using CD-2060 (manufactured by Fujifilm Electronic Materials Co., Ltd.), thereby forming a colored pattern on the silicon wafer.

The silicon wafer having the colored pattern formed thereon was fixed on the horizontal rotary table in a vacuum chuck system, and while the silicon wafer was rotated at a rotation speed of 200 rpm using a rotation device, pure water was supplied onto the wafer from a spray nozzle in the form of a shower from the position above the rotation center, so as to carry out a rinsing treatment. Thereafter, the silicon wafer was spin-dried. Then, a heating treatment (post-baking) for 30 seconds was carried out using a hot plate at 220° C. for 300 seconds. Thus a Bayer pattern having a width of a pixel portion in the color filter of 1.0 µm was formed and a color filter was obtained.

(Conditions for Pattern Exposure)

The conditions for pattern exposure are as follows.

Conditions for illumination: $NA_3/\sigma=0.57/0.40$

Exposure illuminance ($W/m^2$): Refer to Table 5 below

Exposure energy: An exposure test was carried out at steps from 30 mJ to 10 mJ, and an optimum exposure energy (Eopt) was investigated. Further, the optimum exposure energy is the condition of exposure energy under which mask design values can be reproduced on a substrate.

Oxygen concentration (% by volume): Refer to Table 5 below (21% by volume for the atmospheric condition)

The manufacture of the color filter was carried out using Clean Track ACT8 manufactured by Tokyo Electron Ltd. Moreover, this device was set to control the oxygen concentration in the device chamber. Specifically, a measuring device capable of monitoring the oxygen concentration is set in the chamber, provided with a line for introducing oxygen gas and the dilution gas. The oxygen concentration in the room during the exposure was confirmed using the measuring device.

With regard to the film thickness of the colored layer (a cured product of the coloring composition), an average value of five points in a 8-inch (200-mm) plane was defined as a set value of the film thickness, using an optical film thickness-measuring device (Filmetrix F50 (manufactured by Filmetrix Co.)).

The line width measurement after patterning was carried out by observation using a line width measuring electron microscope S9260A (manufactured by Hitachi High-Technologies Corporation). The average value of the pixel-measuring dimensions at five points was defined as a set value of the line width.

<Evaluation of Sensitivity>

The silicon wafer having the Bayer pattern formed thereon was observed at a magnification of 20,000, using a line width measuring electron microscope S9260A (manufactured by HITACHI High-Technologies Corporation), and the pattern dimension was measured. The sensitivity was evaluated in accordance with the following evaluation standard.

A: Eopt is 50 $mJ/cm^2$ or more and less than 500 $mJ/cm^2$. This is optimum from the viewpoints of the energy amount and the stable productivity.

B: Eopt is 500 $mJ/cm^2$ or more and less than 1,000 $mJ/cm^2$. More energy is required than for the evaluation "A", but there is no problem in practical use.

C: Eopt is 1,000 $mJ/cm^2$ or more. Eopt is large and the practical usability is slightly deteriorated.

L: Eopt is less than 50 $mJ/cm^2$. The likelihood is low, and the stable productivity is slightly deteriorated.

TABLE 5

| Illuminance | Oxygen concentration (volume ratio) | | | | | | |
|---|---|---|---|---|---|---|---|
| | 21% | 25% | 30% | 35% | 40% | 50% | 55% |
| 10,000 $W/m^2$ | A | A | B | B | C | C | C |
| 15,000 $W/m^2$ | A | A | B | B | B | C | C |
| 20,000 $W/m^2$ | L | A | A | B | B | B | C |
| 25,000 $W/m^2$ | L | L | A | A | A | B | B |
| 30,000 $W/m^2$ | L | L | L | A | A | A | A |

From the results, both the production at low energy and the stable productivity could be satisfied by adjusting the oxygen concentration during the exposure. Specifically, as the illuminance during the exposure was increased, the oxygen concentration could be increased, and thus, both the production at low energy and the stable productivity could be satisfied.

EXPLANATION OF REFERENCES

100: infrared sensor
110: solid-state imaging device
111: near-infrared absorption filter
112: color filter
113: near-infrared transmitting filter
114: region
115: microlens
116: planarizing layer
200: cured film
201: substrate
202: colored layer
203: coating layer

What is claimed is:

1. A coloring photosensitive composition comprising:
an oxime ester-based photopolymerization initiator containing a fluorine atom;
a polymerizable compound having an ethylenically unsaturated double bond;
an alkali-soluble resin; and
a colorant,
wherein the colorant includes C. I. Pigment Green 58, and
in a case where a film having a film thickness after drying of 2.0 µm is formed using the coloring photosensitive composition, the optical density of the film at a wavelength of 365 nm is 1.5 or more.

2. The coloring photosensitive composition according to claim 1, further comprising:
an oxime-based photopolymerization initiator other than the oxime ester-based photopolymerization initiator containing a fluorine atom.

3. The coloring photosensitive composition according to claim 1,
wherein the colorant further includes at least one selected from the group consisting of C. I. Pigment Yellow 138, C. I. Pigment Yellow 150, and C. I. Pigment Yellow 185.

4. The coloring photosensitive composition according to claim 1,
wherein the colorant further includes at least one selected from the group consisting of C. I. Pigment Yellow 150 and C. I. Pigment Yellow 185.

5. The coloring photosensitive composition according to claim 1, further comprising:
an α-aminoketone-based photopolymerization initiator, wherein the mass ratio of the oxime ester-based photopolymerization initiator containing a fluorine atom to the α-aminoketone-based photopolymerization initiator is 1:1.5 to 1:10.

* * * * *